(12) United States Patent
Kobayashi et al.

(10) Patent No.: US 9,461,179 B2
(45) Date of Patent: Oct. 4, 2016

(54) THIN FILM TRANSISTOR DEVICE (TFT) COMPRISING STACKED OXIDE SEMICONDUCTOR LAYERS AND HAVING A SURROUNDED CHANNEL STRUCTURE

(71) Applicant: Semiconductor Energy Laboratory Co., Ltd., Atsugi-shi, Kanagawa-ken (JP)

(72) Inventors: Yoshiyuki Kobayashi, Tokyo (JP); Shinpei Matsuda, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/788,940

(22) Filed: Jul. 1, 2015

(65) Prior Publication Data

US 2016/0013321 A1 Jan. 14, 2016

(30) Foreign Application Priority Data

Jul. 11, 2014 (JP) .................................. 2014-143110

(51) Int. Cl.
*H01L 29/786* (2006.01)
*H01L 29/36* (2006.01)
(Continued)

(52) U.S. Cl.
CPC ......... *H01L 29/7869* (2013.01); *H01L 29/045* (2013.01); *H01L 29/78696* (2013.01); *H01L 27/0629* (2013.01)

(58) Field of Classification Search
CPC ........... H01L 2924/0002; H01L 22/14; H01L 29/42384; H01L 29/42356; H01L 29/1054; H01L 29/247; H01L 29/7869; H01L 29/78696; H01L 29/78693
USPC ......................................................... 257/43
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Mativenga.M et al., "Corbino TFTs for Large-Area AMOLED Displays", SID Digest '14 : SID International Symposium Digest of Technical Papers, Jun. 3, 2014, pp. 705-708.
(Continued)

*Primary Examiner* — Thomas L Dickey
*Assistant Examiner* — Changhyun Yi
(74) *Attorney, Agent, or Firm* — Fish & Richardson P.C.

(57) ABSTRACT

A semiconductor device having stable electric characteristics is provided. The transistor includes first to third oxide semiconductor layers, a gate electrode, and a gate insulating layer. The second oxide semiconductor layer has a portion positioned between the first and third oxide semiconductor layers. The gate insulating layer has a region in contact with a top surface of the third oxide semiconductor layer. The gate electrode overlaps with a top surface of the portion with the gate insulating layer positioned therebetween. The gate electrode faces a side surface of the portion in a channel width direction with the gate insulating layer positioned therebetween. The second oxide semiconductor layer includes a region having a thickness greater than or equal to 2 nm and less than 8 nm. The length in the channel width direction of the second oxide semiconductor layer is less than 60 nm.

16 Claims, 40 Drawing Sheets

(51) Int. Cl.
*H01L 27/06* (2006.01)
*H01L 29/04* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 9,166,060 B2 | 10/2015 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0194059 A1* | 8/2011 | Yamazaki ........... G02F 1/13439 349/138 |
| 2012/0217499 A1 | 8/2012 | Endo et al. |
| 2012/0319102 A1* | 12/2012 | Yamazaki ........... H01L 29/7869 257/43 |
| 2013/0161606 A1* | 6/2013 | Isobe .................... H01L 29/786 257/43 |
| 2014/0077205 A1 | 3/2014 | Yamazaki et al. |
| 2014/0103346 A1 | 4/2014 | Yamazaki |
| 2014/0203276 A1 | 7/2014 | Yamazaki et al. |
| 2014/0306217 A1 | 10/2014 | Yamazaki et al. |
| 2014/0339544 A1 | 11/2014 | Hanaoka et al. |
| 2014/0340608 A1 | 11/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Lee.H et al., "Asymmetric Electrical Properties of Corbino a-Si:H TFT and Concepts of Its Application to Flat Panel Displays", IEEE Transactions on Electron Devices, Apr. 1, 2007, vol. 54, No. 4, pp. 654-662.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(56) References Cited

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layers", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composited for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO Systens", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide—Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 Inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

FIG. 6A
140
FIG. 6B
140
FIG. 6C
140
FIG. 6D
662
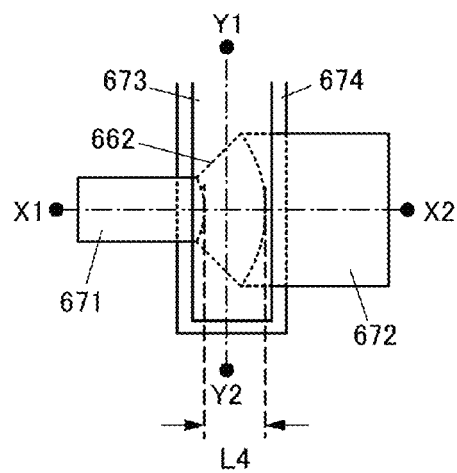
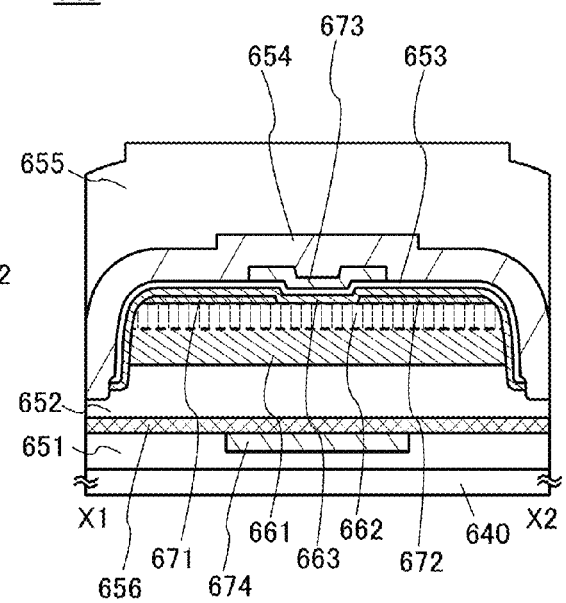
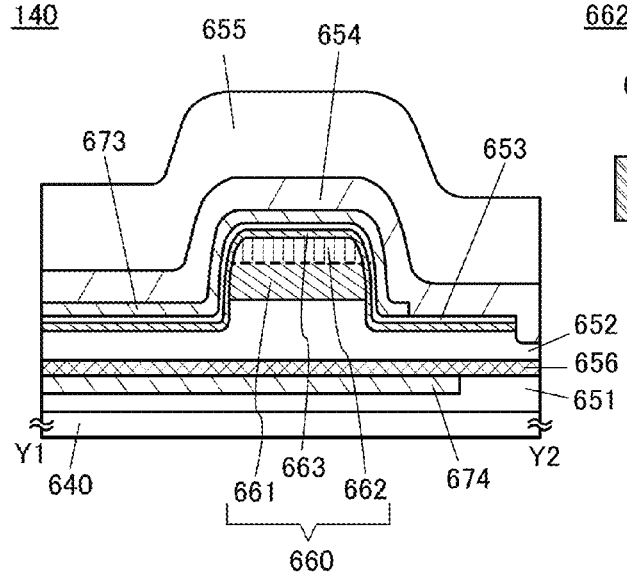
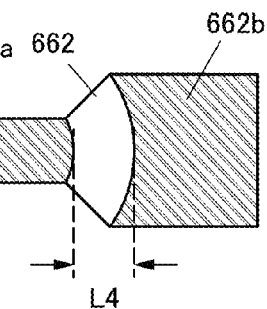

150

150

150

662

FIG. 23A
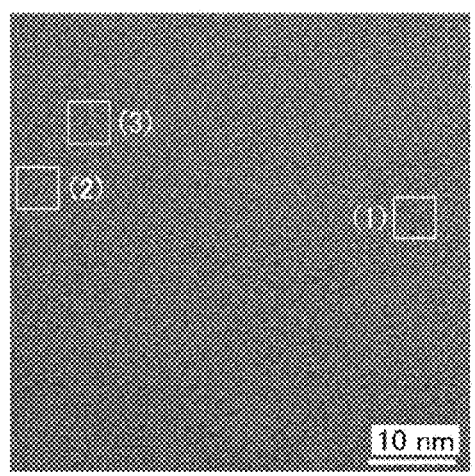
FIG. 23B    FIG. 23C    FIG. 23D
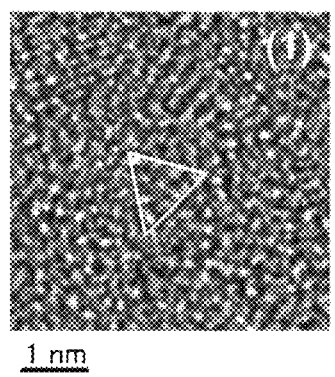 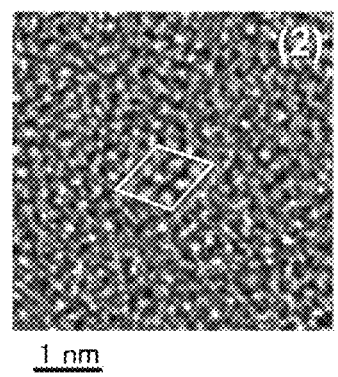 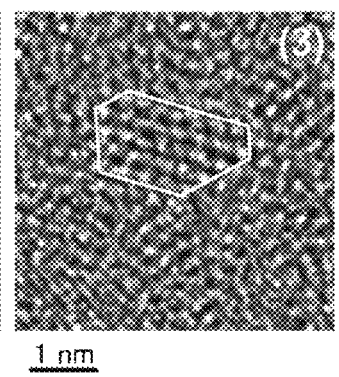

$T_{S2}$ = 3nm $T_{S2}$ = 10nm

THIN FILM TRANSISTOR DEVICE (TFT) COMPRISING STACKED OXIDE SEMICONDUCTOR LAYERS AND HAVING A SURROUNDED CHANNEL STRUCTURE

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a display device, a light-emitting device, a power storage device, a memory device, a driving method thereof, or a manufacturing method thereof. In particular, one embodiment of the present invention relates to a semiconductor device, a memory device, a power supply circuit, a display device, and a light-emitting device each including an oxide semiconductor.

In this specification and the like, a semiconductor device generally means a device that can function by utilizing semiconductor characteristics. In some cases, a display device, an electro-optical device, a semiconductor circuit, or an electronic device includes a semiconductor device.

2. Description of the Related Art

A technique by which a transistor is formed using a semiconductor material has been attracting attention. The transistor is used in a wide range of electronic devices such as an integrated circuit (IC) or an image display device (also simply referred to as a display device). A silicon-based semiconductor material is widely known as a semiconductor material applicable to the transistor, but an oxide semiconductor (OS) has been attracting attention as an alternative material. A transistor in which an oxide semiconductor is used in a channel is referred to as an OS transistor.

For example, a technique for manufacturing a transistor using zinc oxide or an In—Ga—Zn-based oxide semiconductor as an oxide semiconductor applicable to the OS transistor is disclosed (see Patent Documents 1 and 2).

In addition, it has been reported that in the case where a Corbino TFT in which a drain electrode concentrically surrounds a source electrode is formed using an oxide semiconductor, favorable saturation characteristics where the drain voltage of the transistor is constant in a saturation region of $V_d$–$I_d$ (drain voltage–drain current) characteristics can be obtained (Non-Patent Document 1).

REFERENCE

Patent Document

[Patent Document 1] Japanese Published Patent Application No. 2007-123861
[Patent Document 2] Japanese Published Patent Application No. 2007-096055

Non-Patent Document

[Non-Patent Document 1] M. Mativenga et al., "Corbino TFTs for Large-Area AMOLED Displays", SID International Symposium Digest of Technical Papers, 49.2 (2014), pp. 705-708.

SUMMARY OF THE INVENTION

An object of one embodiment of the present invention is to provide a transistor whose drain current is constant in a saturation region. Another object of one embodiment of the present invention is to provide a transistor having a high on-state current. Another object of one embodiment of the present invention is to provide a transistor having stable electric characteristics. Another object of one embodiment of the present invention is to provide a novel semiconductor device.

Note that the descriptions of a plurality of objects do not preclude the existence of each object. One embodiment of the present invention does not necessarily achieve all the objects listed above. Objects other than those listed above are apparent from the description of the specification, drawings, claims, and the like, and such objects can be an object of one embodiment of the present invention.

One embodiment of the present invention is a transistor including a first oxide semiconductor layer, a second oxide semiconductor layer, a third oxide semiconductor layer, a gate electrode, and a gate insulating layer. The second oxide semiconductor layer has a portion positioned between the first oxide semiconductor layer and the third oxide semiconductor layer. The gate insulating layer has a region in contact with a top surface of the third oxide semiconductor layer. The gate electrode overlaps with a top surface of the portion with the gate insulating layer positioned therebetween. The gate electrode faces a side surface of the portion in a channel width direction with the gate insulating layer positioned therebetween. The second oxide semiconductor layer includes a region having a thickness greater than or equal to 2 nm and less than 8 nm. A length in the channel width direction of the second oxide semiconductor layer is less than 60 nm.

One embodiment of the present invention is a transistor including a first oxide semiconductor layer, a second oxide semiconductor layer, a third oxide semiconductor layer, a first conductive film, a second conductive film, a first insulating film, and a second insulating film. The second oxide semiconductor layer has a portion positioned between the first oxide semiconductor layer and the third oxide semiconductor layer. The first insulating film has a region in contact with a top surface of the third oxide semiconductor layer. The first conductive film overlaps with a top surface of the portion with the first insulating film positioned therebetween. The first conductive film faces a side surface of the portion in a channel width direction with the first insulating film positioned therebetween. The second insulating film has a region in contact with a bottom surface of the first oxide semiconductor layer. The second conductive film overlaps with the portion with the second insulating film positioned therebetween. The second oxide semiconductor layer includes a region having a thickness greater than or equal to 2 nm and less than 8 nm. A length in the channel width direction of the second oxide semiconductor layer is less than 60 nm.

In the above embodiment, a channel length of the transistor is preferably greater than or equal to 10 nm and less than 1 μm.

In the above embodiment, the first to third oxide semiconductor layers preferably contain indium, zinc, and M (M is Al, Ti, Ga, Y, Zr, La, Ce, Nd, or Hf).

In the above embodiment, the first and third oxide semiconductor layers preferably have a higher atomic ratio of M to In than the second oxide semiconductor layer.

One embodiment of the present invention is an electronic device which includes the transistor of the above embodiment and at least one of a microphone, a speaker, a display portion, and an operation key.

One embodiment of the present invention can provide a transistor whose drain current is constant in a saturation region. One embodiment of the present invention can provide a transistor having a high on-state current. One embodiment of the present invention can provide a transistor having stable electric characteristics. One embodiment of the present invention can provide a novel semiconductor device.

Note that the descriptions of these effects do not preclude the existence of other effects. One embodiment of the present invention does not necessarily achieve all the effects listed above. Other effects will be apparent from and can be derived from the descriptions of the specification, the drawings, the claims, and the like.

BRIEF DESCRIPTION OF THE DRAWINGS

FIGS. 6A to 6D are top views and cross-sectional views illustrating a structure example of a transistor.

FIGS. 23A to 23D are Cs-corrected high-resolution TEM images of a plane of a CAAC-OS.

DETAILED DESCRIPTION OF THE INVENTION

Figure 1A:
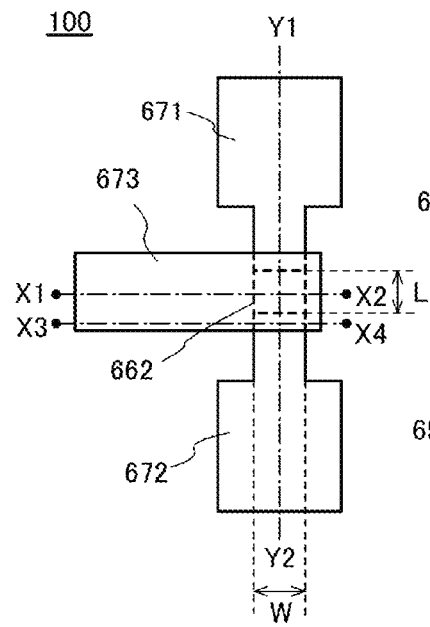
FIGS. 1A to 1D are a top view and cross-sectional views illustrating a structure example of a transistor.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Furthermore, the same hatch pattern is applied to similar functions, and these are not especially denoted by reference numerals in some cases.

Note that in each drawing described in this specification, the size, the layer thickness, or the region of each component is exaggerated for clarity in some cases. Therefore, embodiments of the invention are not limited to such scales.

Note that ordinal numbers such as "first" and "second" in this specification and the like are used in order to avoid confusion among components, and the terms do not limit the components numerically.

Note that a "semiconductor" includes characteristics of an "insulator" in some cases when, for example, the conductivity is sufficiently low. Furthermore, a "semiconductor" and an "insulator" cannot be strictly distinguished from each other in some cases because the border between the "semiconductor" and the "insulator" is not clear. Accordingly, a "semiconductor" in this specification can be called an "insulator" in some cases. Similarly, an "insulator" in this specification can be called a "semiconductor" in some cases.

A transistor is a kind of semiconductor element and is able to achieve amplification of a current or a voltage, switching operation for controlling conduction or non-conduction, or the like. A transistor in this specification includes an insulated-gate field effect transistor (IGFET) and a thin film transistor (TFT).

Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification.

Note that the terms "film" and "layer" can be interchanged with each other depending on the case or circumstances. For example, the term "conductive layer" can be changed into the term "conductive film" in some cases, and the term "insulating film" can be changed into the term "insulating layer" in some cases.

Embodiment 1

In this embodiment, examples of a transistor which is one embodiment of the present invention will be described.

Structure Example 1 of Transistor

Figure 1B:
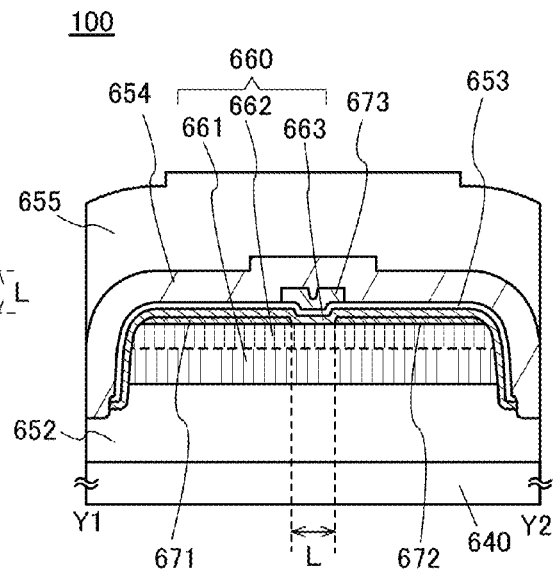
Figure 1C:
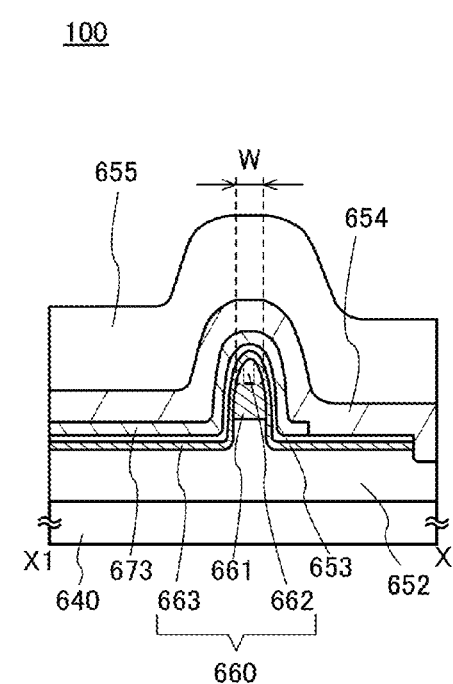
Figure 1D:
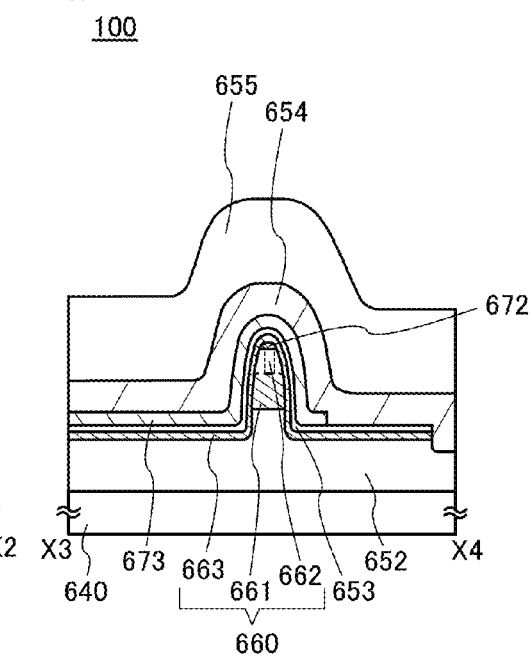

FIGS. 1A to 1D are a top view and cross-sectional views of a transistor 100. FIG. 1A is the top view. FIG. 1B illustrates a cross section along dashed-dotted line Y1-Y2 in FIG. 1A. FIG. 1C illustrates a cross section along dashed-dotted line X1-X2 in FIG. 1A. FIG. 1D illustrates a cross section along dashed-dotted line X3-X4 in FIG. 1A. In FIGS. 1A to 1D, some components are scaled up or down or omitted for easy understanding. In some cases, the direction of the dashed-dotted line Y1-Y2 is referred to as a channel length direction and the direction of the dashed-dotted line X1-X2 is referred to as a channel width direction.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel length L in FIGS. 1A and 1B represents the channel length of the transistor 100.

A channel width W in FIGS. 1A and 1C represents the channel width (apparent channel width or surrounded channel width) of the transistor 100.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel with is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of the semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

The transistor 100 includes a substrate 640; an insulating film 652 over the substrate 640; a semiconductor 661 and a semiconductor 662 stacked over the insulating film 652 in this order; a conductive film 671 and a conductive film 672 in contact with a top surface of the semiconductor 662; a semiconductor 663 in contact with the semiconductor 661, the semiconductor 662, the conductive film 671, and the conductive film 672; an insulating film 653 and a conductive film 673 over the semiconductor 663; an insulating film 654 over the conductive film 673 and the insulating film 653; and an insulating film 655 over the insulating film 654. Note that the semiconductor 661, the semiconductor 662, and the semiconductor 663 are collectively referred to as a semiconductor 660.

The conductive film 671 has a function as a source electrode of the transistor 100. The conductive film 672 has a function as a drain electrode of the transistor 100.

The conductive film 673 has a function as a gate electrode of the transistor 100.

The insulating film 653 has a function as a gate insulating layer of the transistor 100.

As illustrated in FIG. 1C, a side surface of the semiconductor 662 is surrounded by the conductive film 673. With such a structure, the semiconductor 662 can be electrically surrounded by an electric field of the conductive film 673 (a transistor structure in which a semiconductor is electrically surrounded by an electric field of a conductive film (gate electrode) is referred to as a surrounded channel (s-channel) structure). Therefore, a channel is formed in the entire semiconductor 662 (bulk) in some cases. In the s-channel structure, a large amount of current can flow between a source and a drain of a transistor, so that a high current in an on state (on-state current) can be achieved. The s-channel structure enables a transistor to operate at high frequency.

The s-channel structure, because of its high on-state current, is suitable for a semiconductor device such as large-scale integration (LSI) which requires a miniaturized transistor. A semiconductor device including the miniaturized transistor can have a high integration degree and high density. The transistor preferably has, for example, a region where a channel length is greater than or equal to 10 nm and less than 1 μm, further preferably greater than or equal to 10 nm and less than 100 nm, still further preferably greater than or equal to 10 nm and less than 60 nm, and yet still further preferably greater than or equal to 10 nm and less than 30 nm.

Furthermore, the s-channel structure is suitable for a transistor that needs to operate at high frequency because of its high on-state current. A semiconductor device including the transistor can operate at high frequency.

In addition, the s-channel structure is suitable for a power control transistor because of its high on-state current. To employ the s-channel structure in the power control transistor that requires a high withstand voltage, the channel length is preferably long. For example, the transistor preferably has a region where the channel length is greater than or equal to 1 μm, further preferably greater than or equal to 10 μm, and still further preferably greater than or equal to 100 μm.

The insulating film 652 preferably includes an oxide. In particular, the insulating film 652 preferably includes an oxide material from which part of oxygen is released by heating. The insulating film 652 preferably includes an oxide containing oxygen in excess of that in the stoichiometric composition. Part of oxygen is released by heating from the oxide film containing oxygen in excess of that in the stoichiometric composition. Oxygen released from the insulating film 652 is supplied to the semiconductor 660 that is an oxide semiconductor, so that oxygen vacancies in the oxide semiconductor can be reduced. Consequently, changes in the electrical characteristics of the transistor can be reduced and the reliability of the transistor can be improved.

The oxide film containing oxygen in excess of that in the stoichiometric composition is an oxide film of which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis, for example. Note that the temperature of the film surface in the TDS analysis is preferably higher than or equal to 100° C. and lower than or equal to 700° C., or higher than or equal to 100° C. and lower than or equal to 500° C.

The insulating film 654 has a function of blocking oxygen, hydrogen, water, alkali metal, alkaline earth metal, and the like. Providing the insulating film 654 can prevent outward diffusion of oxygen from the semiconductor 660 and entry of hydrogen, water, or the like into the semiconductor 660 from the outside.

<<Semiconductor>>

Next, semiconductors which can be used as the semiconductors 661 to 663 or the like will be described below.

In the transistor 100, it is preferable that the current flowing between a source and drain in an off state (off-state current) be low. Here, the term "low off-state current" means that normalized off-state current per micrometer of channel width at room temperature with a source-drain voltage of 3 V is lower than or equal to $10\times10^{-21}$ A. An example of a transistor with such a low off-state current is a transistor including an oxide semiconductor as a semiconductor.

The semiconductor 662 is, for example, an oxide semiconductor containing indium (In). The semiconductor 662 has a high carrier mobility (electron mobility) when containing, for example, indium. The semiconductor 662 preferably contains an element M. The element M is preferably aluminum (Al), gallium (Ga), tin (Sn), or the like. Other elements which can be used as the element M include boron (B), silicon (Si), titanium (Ti), iron (Fe), nickel (Ni), germanium (Ge), yttrium (Y), zirconium (Zr), molybdenum (Mo), lanthanum (La), cerium (Ce), neodymium (Nd), hafnium (Hf), tantalum (Ta), and tungsten (W). Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 662 preferably contains zinc (Zn). When the oxide semiconductor contains zinc, the oxide semiconductor is easily crystallized in some cases.

Note that the semiconductor 662 is not limited to the oxide semiconductor containing indium. The semiconductor 662 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 662, an oxide with a wide energy gap may be used. For example, the energy gap of the semiconductor 662 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The semiconductor 662 preferably includes a CAAC-OS film which will be described later.

For example, the semiconductor 661 and the semiconductor 663 include one or more, or two or more elements other than oxygen included in the semiconductor 662. Since the semiconductor 661 and the semiconductor 663 each include one or more, or two or more elements other than oxygen included in the semiconductor 662, an interface state is less likely to be formed at the interface between the semiconductor 661 and the semiconductor 662 and the interface between the semiconductor 662 and the semiconductor 663.

Note that in the case of using an In-M-Zn oxide as the semiconductor 661, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case where the semiconductor 661 is formed by a sputtering method, a sputtering target with the above composition, for example, a sputtering target containing In, M, and Zn at an atomic ratio of 1:3:2, is preferably used.

In the case where an In-M-Zn oxide is used for the semiconductor 662 and the summation of In and M is assumed to be 100 atomic %, the proportions of In and M are preferably set to be greater than 25 atomic % and less than 75 atomic %, respectively, and more preferably greater than 34 atomic % and less than 66 atomic %, respectively. In the case where the semiconductor 662 is formed by a sputtering method, a sputtering target with the above composition, for example, a sputtering target containing In, M, and Zn at an atomic ratio of 1:1:1, 1:1:1.2, 2:1:3, 3:1:2, or 4:2:4.1, is preferably used. In particular, when a sputtering target containing In, Ga, and Zn at an atomic ratio of 4:2:4.1 is used, the semiconductor 662 may contain In, Ga, and Zn at an atomic ratio of around 4:2:3.

In the case of using an In-M-Zn oxide as the semiconductor 663, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the semiconductor 663 and the semiconductor 661 may be formed using the same type of oxide. Note that the semiconductor 661 and/or the semiconductor 663 do/does not necessarily contain indium in some cases. For example, the semiconductor 661 and/or the semiconductor 663 may be gallium oxide.

Figure 2A:
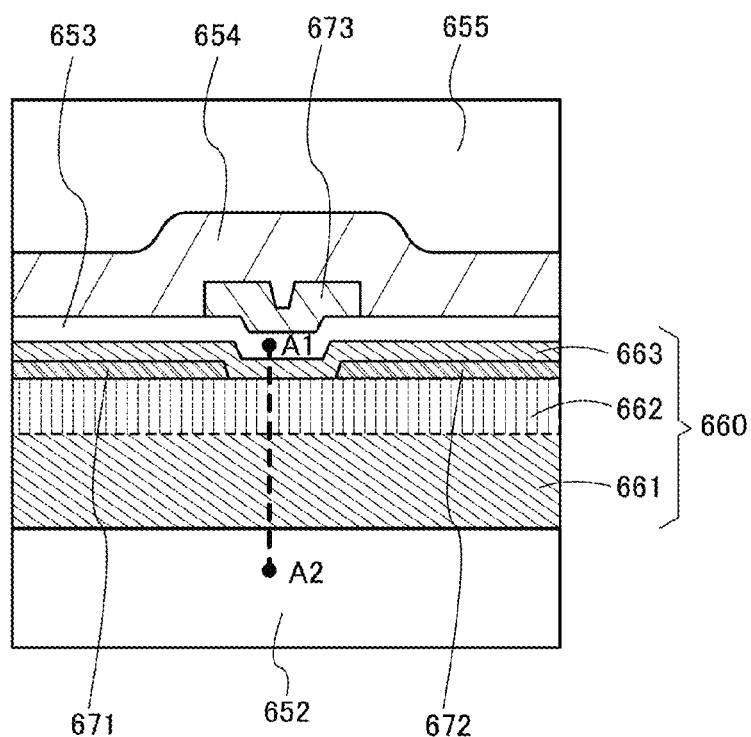
FIGS. 2A and 2B are a cross-sectional view illustrating a structure example of a transistor and a band diagram of the transistor.
Figure 2B:
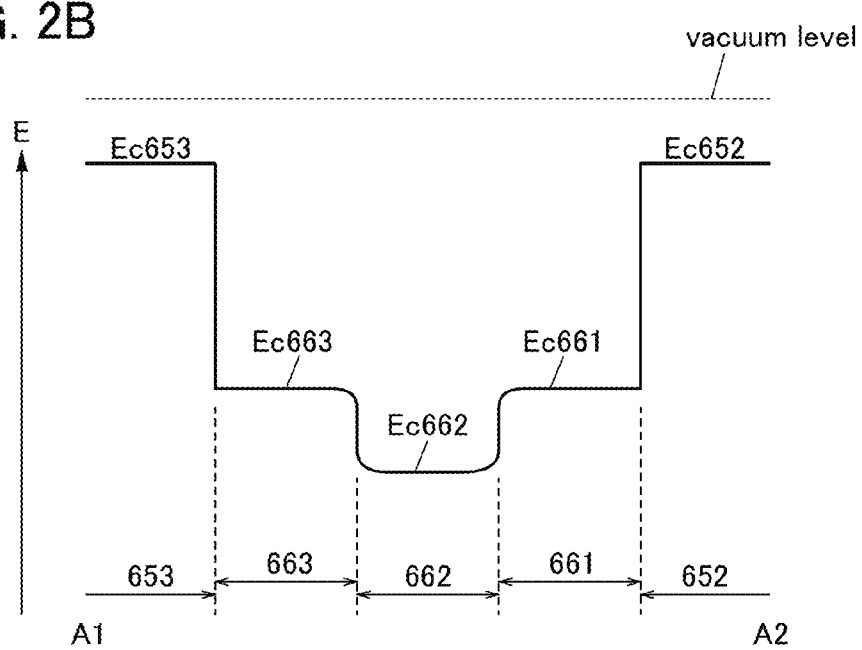

Next, a function and an effect of the semiconductor 660 in which the semiconductor 661, the semiconductor 662, and the semiconductor 663 are stacked will be described using an energy band diagram in FIG. 2B. FIG. 2A is an enlarged view of the channel portion of the transistor 100 illustrated in FIG. 1B. FIG. 2B shows an energy band diagram of a portion along chain line A1-A2 in FIG. 2A. In other words, FIG. 2B illustrates the energy band diagram of a channel formation region of the transistor 100.

In FIG. 2B, Ec652, Ec661, Ec662, Ec663, and Ec653 indicate the energy of the conduction band minimum of the insulating film 652, the semiconductor 661, the semiconductor 662, the semiconductor 663, and the insulating film 653, respectively.

Here, a difference in energy between the vacuum level and the conduction band minimum (the difference is also referred to as electron affinity) corresponds to a value obtained by subtracting an energy gap from a difference in energy between the vacuum level and the valence band maximum (the difference is also referred to as ionization potential). The energy gap can be measured using a spectroscopic ellipsometer. The energy difference between the vacuum level and the valence band maximum can be measured using an ultraviolet photoelectron spectroscopy (UPS) device.

Since the insulating film 652 and the insulating film 653 are insulators, Ec652 and Ec653 are closer to the vacuum level than Ec661, Ec662, and Ec663. That is, the insulating film 652 and the insulating film 653 have a smaller electron affinity than the semiconductor 661, the semiconductor 662, and the semiconductor 663.

As the semiconductor 662, an oxide having an electron affinity higher than those of the semiconductors 661 and 663 is used. For example, as the semiconductor 662, an oxide having an electron affinity higher than those of the semiconductors 661 and 663 by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the conduction band minimum.

An indium gallium oxide has a small electron affinity and a high oxygen-blocking property. Therefore, the semiconductor 663 preferably includes an indium gallium oxide. The gallium atomic ratio [Ga/(In+Ga)] is, for example, higher than or equal to 70%, preferably higher than or equal to 80%, more preferably higher than or equal to 90%.

At this time, when a gate voltage is applied, a channel is formed in the semiconductor 662 having the highest electron affinity among the semiconductors 661 to 663.

Here, in some cases, there is a mixed region of the semiconductor 661 and the semiconductor 662 between the semiconductor 661 and the semiconductor 662. Furthermore, in some cases, there is a mixed region of the semiconductor 662 and the semiconductor 663 between the semiconductor 662 and the semiconductor 663. The mixed region has a low interface state density. For that reason, the stack of the semiconductor 661, the semiconductor 662, and the semiconductor 663 has a band structure where energy at each interface and in the vicinity of the interface is changed continuously (also referred to as a band structure with a continuous junction).

At this time, electrons move mainly in the semiconductor 662, not in the semiconductor 661 and the semiconductor 663. As described above, when the interface state density at the interface between the semiconductor 661 and the semiconductor 662 and the interface state density at the interface between the semiconductor 662 and the semiconductor 663 are decreased, electron movement in the semiconductor 662 is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness in a channel formation region is large.

To increase the on-state current of the transistor, for example, root mean square (RMS) roughness with a measurement area of 1 μm×1 μm of a top surface or a bottom surface of the semiconductor 662 (a formation surface; here, the semiconductor 661) is less than 1 nm, preferably less than 0.6 nm, more preferably less than 0.5 nm, still more preferably less than 0.4 nm. The average surface roughness (also referred to as Ra) with the measurement area of 1 μm×1 μm is less than 1 nm, preferably less than 0.6 nm, more preferably less than 0.5 nm, still more preferably less than 0.4 nm. The maximum difference (P–V) with the measurement area of 1 μm×1 μm is less than 10 nm, preferably less than 9 nm, more preferably less than 8 nm, still more preferably less than 7 nm. Note that RMS roughness, Ra, and P–V can be measured using a scanning probe microscope SPA-500 manufactured by SII Nano Technology Inc.

The electron movement is also inhibited, for example, in the case where the density of defect states is high in a region where a channel is formed.

For example, in the case where the semiconductor 662 contains oxygen vacancies (also denoted by $V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the semiconductor 662, the on-state current of the transistor can be increased in some cases.

For example, the hydrogen concentration at a certain depth in the semiconductor 662 or in a certain region of the semiconductor 662, which is measured by secondary ion mass spectrometry (SIMS), is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$.

To decrease oxygen vacancies in the semiconductor 662, for example, there is a method in which excess oxygen in the insulating film 652 is moved to the semiconductor 662 through the semiconductor 661. In this case, the semiconductor 661 is preferably a layer having oxygen permeability (a layer through which oxygen can permeate).

In the case where the transistor has an s-channel structure, a channel is formed in the whole of the semiconductor 662. Therefore, as the semiconductor 662 has a larger thickness, a channel region becomes larger. In other words, the thicker the semiconductor 662 is, the larger the on-state current of the transistor is.

However, in the case of a short-channel transistor with a channel length of less than 1 μm, as the thickness of the semiconductor 662 becomes larger, the drain current increases in accordance with the drain voltage because such a transistor does not exhibit saturation characteristics in the $V_d$-$I_d$ characteristics because of a channel length modulation effect.

In order that the transistor may have favorable saturation characteristics, the semiconductor 662 should include a region with a thickness greater than or equal to 2 nm and less than 20 nm, preferably greater than or equal to 2 nm and less than 10 nm, further preferably greater than or equal to 2 nm and less than 8 nm, still further preferably greater than or equal to 2 nm and less than 5 nm, and yet still further preferably greater than or equal to 2 nm and less than 3 nm, for example.

Moreover, for favorable saturation characteristics, the channel width of the transistor should be less than 100 nm, preferably less than 80 nm, further preferably less than 60 nm, and still further preferably less than 40 nm, for example.

Moreover, the thickness of the semiconductor 663 is preferably as small as possible to increase the on-state current of the transistor. For example, the semiconductor 663 has a region with a thickness of less than 10 nm, preferably less than or equal to 5 nm, more preferably less than or equal to 3 nm. Meanwhile, the semiconductor 663 has a function of blocking entry of elements other than oxygen (such as hydrogen and silicon) included in the adjacent insulator into the semiconductor 662 where a channel is formed. For this reason, it is preferable that the semiconductor 663 have a certain thickness. For example, the semiconductor 663 has a region with a thickness of greater than or equal to 0.3 nm, preferably greater than or equal to 1 nm, more preferably greater than or equal to 2 nm. The semiconductor 663 preferably has an oxygen blocking property to suppress outward diffusion of oxygen released from the insulating film 652 and the like.

To improve reliability, preferably, the thickness of the semiconductor 661 is large and the thickness of the semiconductor 663 is small. For example, the semiconductor 661 has a region with a thickness of greater than or equal to 10 nm, preferably greater than or equal to 20 nm, more preferably greater than or equal to 40 nm, still more preferably greater than or equal to 60 nm. When the thickness of the semiconductor 661 is made large, the distance from an interface between the adjacent insulator and the semiconductor 661 to the semiconductor 662 in which a channel is formed can be large. However, to prevent the productivity of the semiconductor device from being decreased, the semiconductor 661 has a region with a thickness of, for example, less than or equal to 200 nm, preferably less than or equal to 120 nm, more preferably less than or equal to 80 nm.

For example, a region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by SIMS analysis is provided between the semiconductor 662 and the semiconductor 661. A region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by SIMS is provided between the semiconductor 662 and the semiconductor 663.

It is preferable to reduce the concentration of hydrogen in the semiconductor 661 and the semiconductor 663 in order to reduce the concentration of hydrogen in the semiconductor 662. The semiconductor 661 and the semiconductor 663 each have a region in which the concentration of hydrogen measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. It is preferable to reduce the concentration of nitrogen in the semiconductor 661 and the semiconductor 663 in order to reduce the concentration of nitrogen in the semiconductor 662. The semiconductor 661 and the semiconductor 663 each have a region in which the concentration of nitrogen measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The above three-layer structure is an example. For example, a two-layer structure without the semiconductor 661 or the semiconductor 663 may be employed. A four-layer structure in which any one of the semiconductors described as examples of the semiconductor 661, the semiconductor 662, and the semiconductor 663 is provided under or over the semiconductor 661 or under or over the semiconductor 663 may be employed. An n-layer structure (n is an integer of 5 or more) in which any one of the semiconductors described as examples of the semiconductor 661, the semiconductor 662, and the semiconductor 663 is provided at two or more of the following positions: over the semiconductor 661, under the semiconductor 661, over the semiconductor 663, and under the semiconductor 663.

When the semiconductors 661, 662, and 663 have the above structures, the transistor 100 can have a high on-state current and stable electric characteristics.

Structure Example 2 of Transistor

Next, a structure example different from that of the transistor 100 illustrated in FIGS. 1A to 1D will be described with reference to FIGS. 3A to 3D.

Figure 3A:
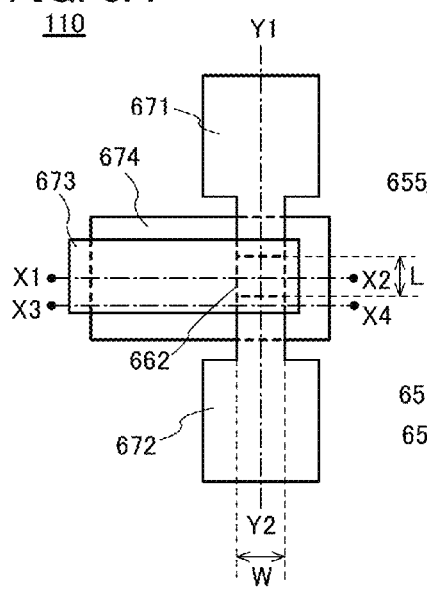
FIGS. 3A to 3D are a top view and cross-sectional views illustrating a structure example of a transistor.
Figure 3B:
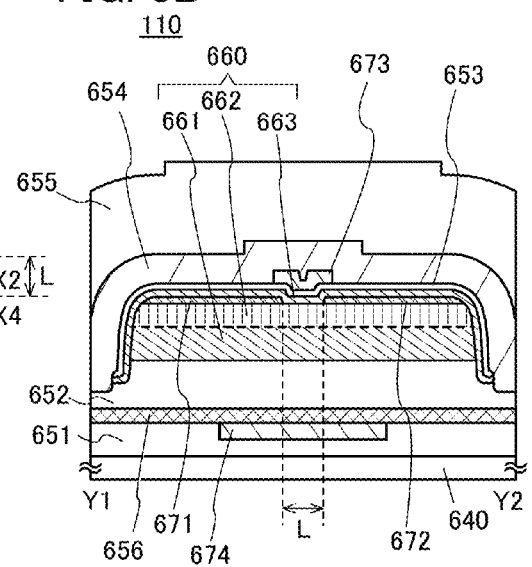
Figure 3C:
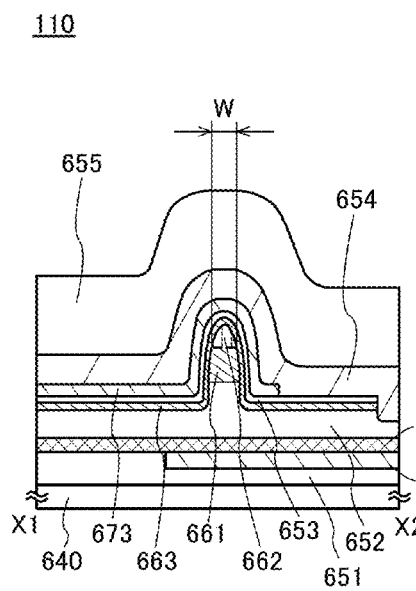
Figure 3D:
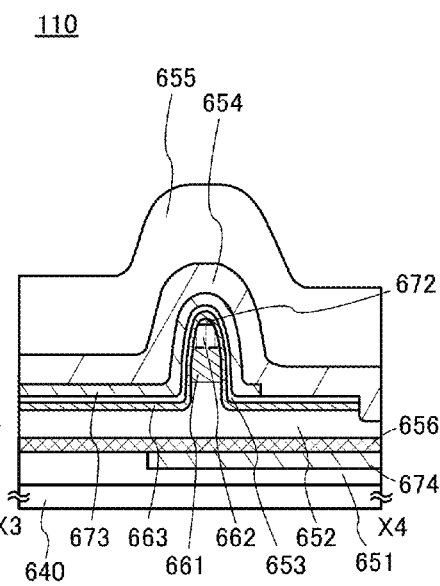

Although the transistor 100 has one gate electrode, one embodiment of the present invention is not limited thereto, and the transistor may have a plurality of gate electrodes. A transistor 110 illustrated in FIGS. 3A to 3D includes a conductive film 674 as a second gate electrode. FIG. 3B illustrates a cross section along dashed-dotted line Y1-Y2 in FIG. 3A. FIG. 3C illustrates a cross section along dashed-dotted line X1-X2 in FIG. 3A. FIG. 3D illustrates a cross section along dashed-dotted line X3-X4 in FIG. 3A. In FIGS. 3A to 3D, some components are scaled up or down or omitted for easy understanding.

FIGS. 3A to 3D differ from FIGS. 1A to 1D in that an insulating film 651, the conductive film 674, and an insulating film 656 are provided between the substrate 640 and the insulating film 652.

The insulating film 651 has a function of electrically isolating the substrate 640 and the conductive film 674 from each other.

The conductive film 674 has a function as a second gate electrode. The conductive film 674 may be supplied with a constant potential, or a potential or a signal that is the same as that supplied to the conductive film 673.

The insulating film 656 has a function of preventing oxygen contained in the insulating film 652 from decreasing by bonding to metal contained in the conductive film 674.

Owing to the conductive film 674 serving as a second gate electrode, a channel can be formed in the upper and lower regions of the semiconductor 662 in the transistor 110; thus, an on-state current can be increased. In addition, the transistor 110 can obtain favorable saturation characteristics in the $V_d$-$I_d$ characteristics and thus can obtain stable electric characteristics.

Structure Example 3 of Transistor

Next, a structure example different from that of the transistor 110 illustrated in FIGS. 3A to 3D will be described with reference to FIGS. 4A to 4D.

Figure 4A:
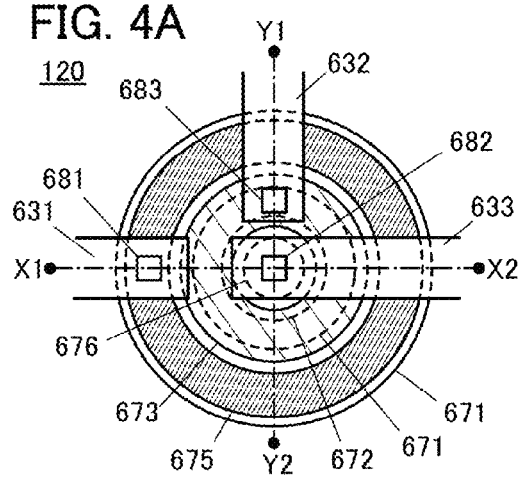
FIGS. 4A to 4D are top views and cross-sectional views illustrating a structure example of a transistor.

FIG. 4A is a top view of a transistor 120 that is a semiconductor device of one embodiment of the present invention. FIG. 4B is a cross-sectional view taken along dashed-dotted line X1-X2 in FIG. 4A, and FIG. 4C is a cross-sectional view taken along dashed-dotted line Y1-Y2 in FIG. 4A.

Figure 4D:
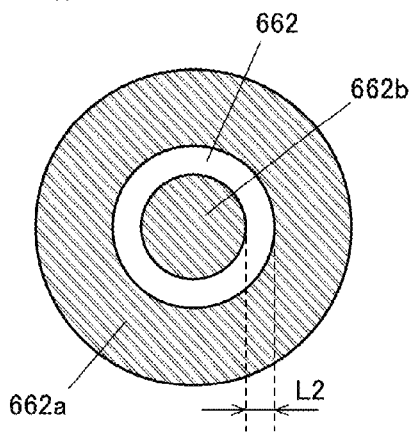
Figure 4B:
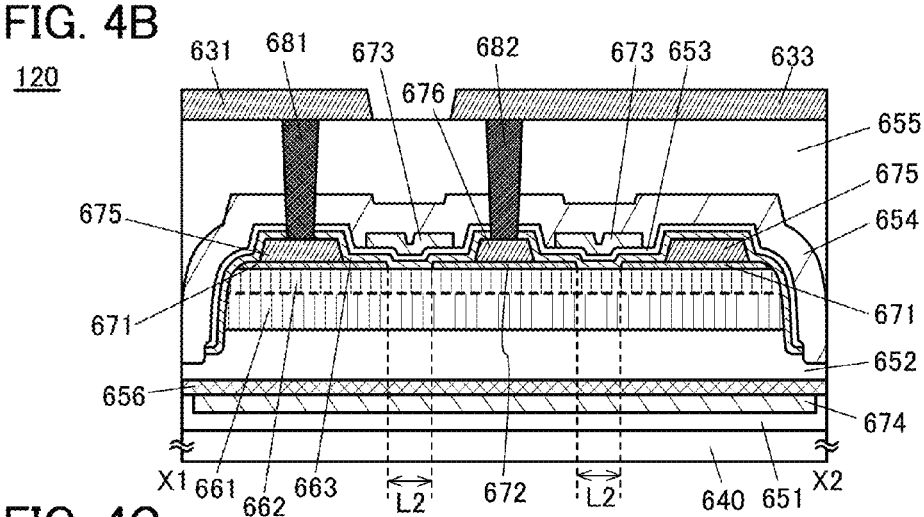
Figure 4C:
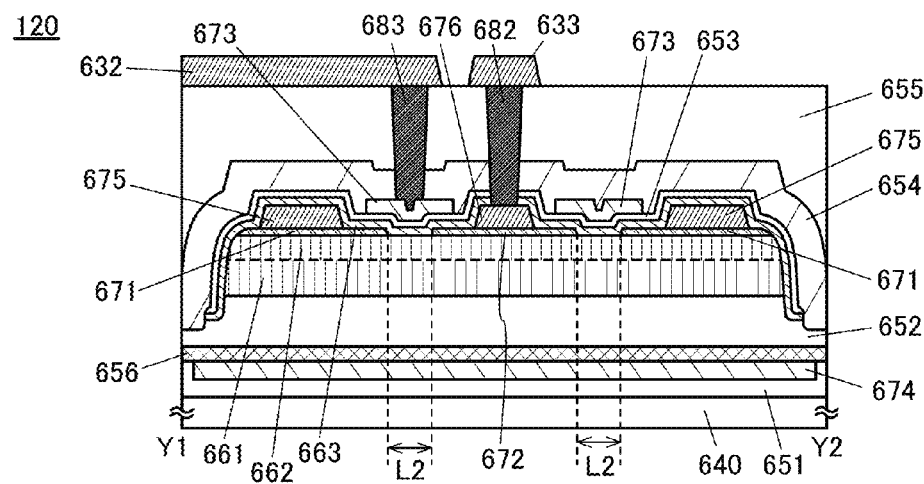

The transistor 120 illustrated in FIGS. 4A to 4C is different from the transistor 110 in that, when seen from the top, the conductive film 671 serving as one of a source and a drain concentrically surrounds the conductive film 672 serving as the other of the source and the drain.

FIG. 4D is a top view of the semiconductor 662 included in the transistor 120. As illustrated in FIG. 4D, the semiconductor 662 has a region 662a overlapping with the conductive film 671 and a region 662b overlapping with the conductive film 672. The region 662a and the region 662b each have an end portion opposed to the other region have an end portion opposed to the other region. When seen from the top, the length of the end portion of the region 662b is shorter than that of the end portion of the region 662a.

To establish an electrical connection between the conductive film 671 and an external terminal, a conductive film 675 is formed over the conductive film 671, a plug 681 is formed over the conductive film 675, and a conductive film 631 is formed over the plug 681.

To establish an electrical connection between the conductive film 672 and an external terminal, a conductive film 676 is formed over the conductive film 672, a plug 682 is formed over the conductive film 676, and a conductive film 633 is formed over the plug 682.

To establish an electrical connection between the conductive film 673 and an external terminal, a plug 683 is formed over the conductive film 673 and a conductive film 632 is formed over the plug 683.

The conductive films 675 and 676, the conductive films 631 to 633, and the plugs 681 to 683 preferably have a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. In addition, the conductive films are preferably formed using a low-resistance conductive material such as aluminum or copper. The conductive films are further preferably formed using a Cu—Mn alloy, in which case manganese oxide formed at the interface with an insulator containing oxygen has a function of preventing Cu diffusion.

A top surface of the insulating film 655 may be planarized.

Components of the transistor 120 other than the above are similar to those of the transistor 110; thus, the detailed description thereof is omitted.

It is preferable that, in the transistor 120, the conductive film 671 serve as a drain electrode and the conductive film 672 serve as a source electrode. With such a structure in which the drain electrode surrounds the source electrode, the transistor 120 is hardly affected by a channel length modulation effect, leading to favorable saturation characteristics in $V_d$-$I_d$ characteristics and stable electric characteristics.

In FIGS. 4B to 4D, "L2" represents the channel length of the transistor 120. As in the case of the transistor 100 illustrated in FIGS. 1A to 1D, the channel length L2 of the transistor 120 is the distance between an end portion of the conductive film 671 and an end portion of the conductive film 672 in the top surface of the semiconductor 662. That is, the channel length L2 is the distance between the end portion of the conductive film 671 and the end portion of the conductive film 672.

When the transistor 120 is applied to a highly integrated semiconductor device such as LSI, the channel length L2 is greater than or equal to 10 nm and less than 1 μm, preferably greater than or equal to 10 nm and less than 100 nm, further preferably greater than or equal to 10 nm and less than 60 nm, and still further preferably greater than or equal to 10 nm and less than 30 nm, for example.

When the transistor 120 is applied to a semiconductor device that requires a high withstand voltage, such as a power control device, the channel length L2 is greater than or equal to 1 μm, preferably greater than or equal to 10 μm, and further preferably greater than or equal to 100 μm, for example.

Structure Example 4 of Transistor

Next, a structure example different from that of the transistor 120 illustrated in FIGS. 4A to 4C will be described with reference to FIGS. 5A to 5D.

Figure 5A:
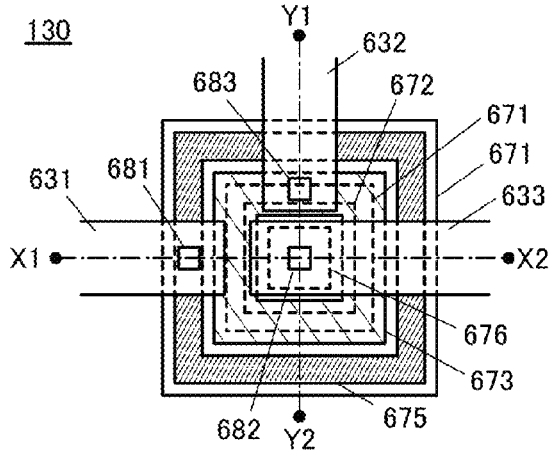
FIGS. 5A to 5D are top views and cross-sectional views illustrating a structure example of a transistor.

FIG. 5A is a top view of a transistor 130 that is a semiconductor device of one embodiment of the present invention. FIG. 5B is a cross-sectional view taken along dashed-dotted line X1-X2 in FIG. 5A, and FIG. 5C is a cross-sectional view taken along dashed-dotted line Y1-Y2 in FIG. 5A.

Figure 5D:
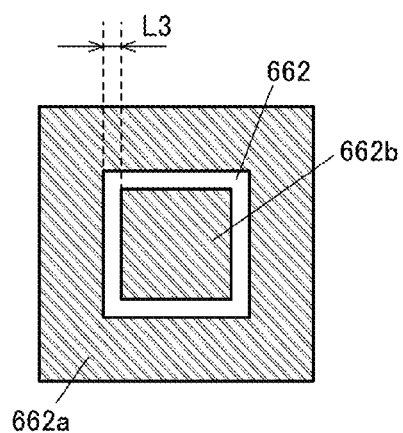
Figure 5B:
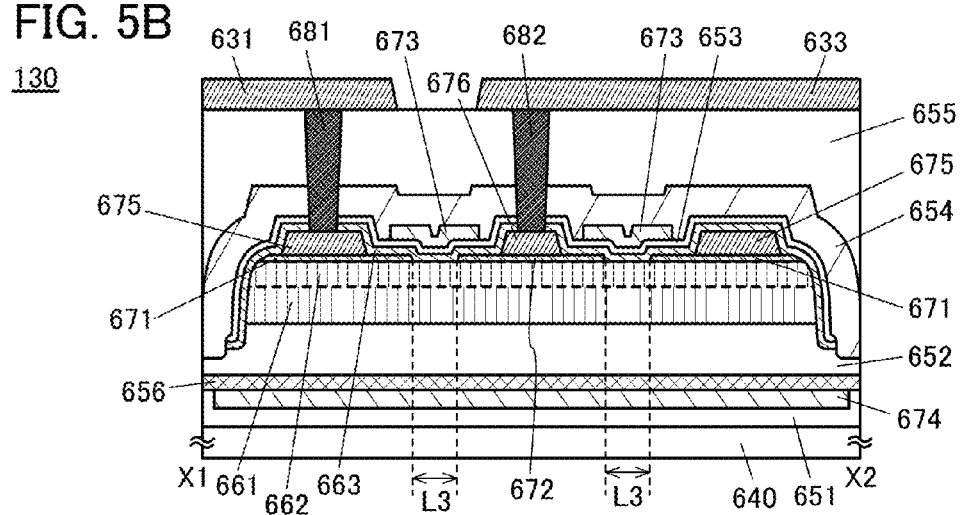
Figure 5C:
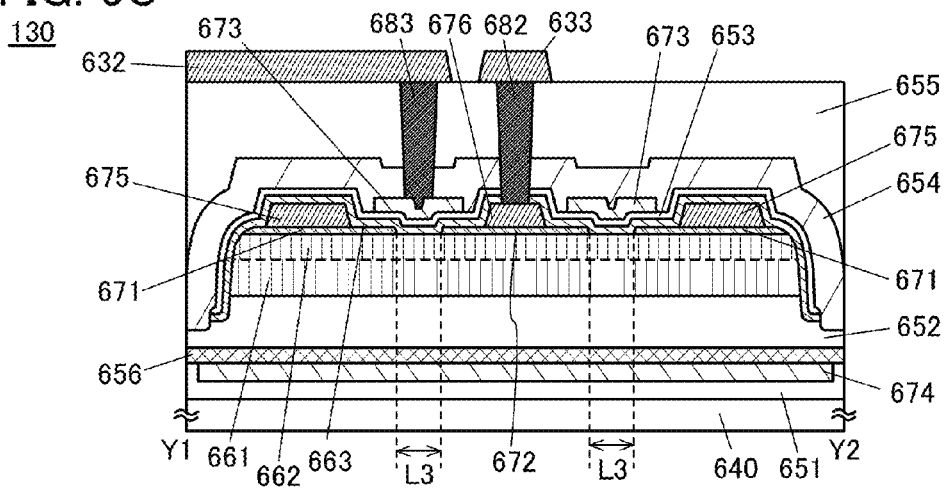

The transistor 130 illustrated in FIGS. 5A to 5C is different from the transistor 120 in that, when seen from the top, the conductive film 671 serving as one of a source and a drain surrounds the conductive film 672 serving as the other of the source and the drain in a tetragon. Other components of the transistor 130 are similar to those of the transistor 120; thus, the detailed description thereof is omitted.

FIG. 5D is a top view of the semiconductor 662 included in the transistor 130. As illustrated in FIG. 5D, the semiconductor 662 has the region 662a overlapping with the conductive film 671 and the region 662b overlapping with the conductive film 672. The region 662a and the region 662b each have an end portion opposed to the other region have an end portion opposed to the other region. When seen from the top, the length of the end portion of the region 662b is shorter than that of the end portion of the region 662a.

It is preferable that, in the transistor 130, the conductive film 671 serve as a drain electrode and the conductive film 672 serve as a source electrode. With such a structure in which the drain electrode surrounds the source electrode, the transistor 130 is hardly affected by a channel length modulation effect, leading to favorable saturation characteristics in $V_d$–$I_d$ characteristics and stable electric characteristics.

In FIGS. 5B to 5D, "L3" represents the channel length of the transistor 130. As in the case of the transistor 100 illustrated in FIGS. 1A to 1D, the channel length L3 of the transistor 130 is the distance between an end portion of the conductive film 671 and an end portion of the conductive film 672 in the top surface of the semiconductor 662. That is, the channel length L3 is the distance between the end portion of the conductive film 671 and the end portion of the conductive film 672.

When the transistor 130 is applied to a highly integrated semiconductor device such as LSI, the channel length L3 is greater than or equal to 10 nm and less than 1 μm, preferably greater than or equal to 10 nm and less than 100 nm, further preferably greater than or equal to 10 nm and less than 60 nm, and still further preferably greater than or equal to 10 nm and less than 30 nm, for example.

When the transistor 130 is applied to a semiconductor device that requires a high withstand voltage, such as a power control device, the channel length L3 is greater than or equal to 1 μm, preferably greater than or equal to 10 μm, and further preferably greater than or equal to 100 μm, for example.

Structure Example 5 of Transistor

Next, a structure example different from that of the transistor 110 illustrated in FIGS. 3A to 3D will be described with reference to FIGS. 6A to 6D.

FIG. 6A is a top view of a transistor 140 that is a semiconductor device of one embodiment of the present invention. FIG. 6B is a cross-sectional view taken along dashed-dotted line X1-X2 in FIG. 6A, and FIG. 6C is a cross-sectional view taken along dashed-dotted line Y1-Y2 in FIG. 6A. FIG. 6D is a top view of the semiconductor 662.

The transistor 140 illustrated in FIGS. 6A to 6C is different from the transistor 110 illustrated in FIGS. 3A to 3D in that, when seen from the top, the conductive film 671 serving as one of a source and a drain and the conductive film 672 serving as the other of the source and the drain are opposed to each other and form a fan shape.

Furthermore, unlike in the transistor 110 illustrated in FIGS. 3A to 3D, the semiconductor 662 has the region 662a overlapping with the conductive film 671 and the region 662b overlapping with the conductive film 672, the region 662a and the region 662b each have an end portion opposed to the other region, and when seen from the top, the length of the end portion of the region 662a is shorter than that of the end portion of the region 662b, as illustrated in FIG. 6D. Other components of the transistor 140 are similar to those of the transistor 110; thus, the detailed description thereof is omitted.

It is preferable that, in the transistor 140, the conductive film 671 serve as a source electrode and the conductive film 672 serve as a drain electrode. With such a structure, the transistor 140 is hardly affected by a channel length modulation effect, leading to favorable saturation characteristics in $V_d$–$I_d$ characteristics and stable electric characteristics.

In FIGS. 6A and 6D, "L4" represents the channel length of the transistor 140. As in the case of the transistor 100 illustrated in FIGS. 1A to 1D, the channel length L4 of the transistor 140 is the distance between an end portion of the conductive film 671 and an end portion of the conductive film 672 in the top surface of the semiconductor 662. That is, the channel length L4 is the distance between the end portion of the conductive film 671 and the end portion of the conductive film 672.

When the transistor 140 is applied to a highly integrated semiconductor device such as LSI, the channel length L4 is greater than or equal to 10 nm and less than 1 μm, preferably greater than or equal to 10 nm and less than 100 nm, further preferably greater than or equal to 10 nm and less than 60 nm, and still further preferably greater than or equal to 10 nm and less than 30 nm, for example.

When the transistor 140 is applied to a semiconductor device that requires a high withstand voltage, such as a power control device, the channel length L4 is greater than or equal to 1 μm, preferably greater than or equal to 10 μm, and further preferably greater than or equal to 100 μm, for example.

Structure Example 6 of Transistor

Next, a structure example different from that of the transistor 140 illustrated in FIGS. 6A to 6C will be described with reference to FIGS. 7A to 7D.

Figure 7A:
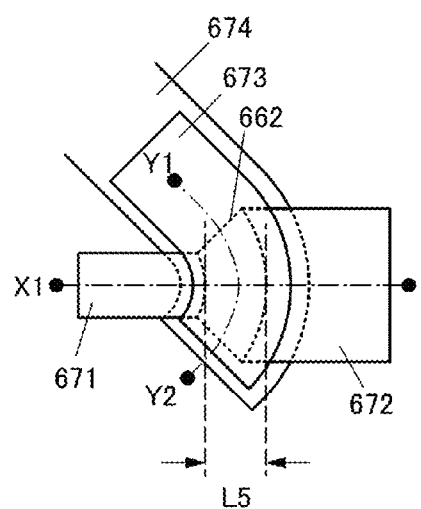
FIGS. 7A to 7D are top views and cross-sectional views illustrating a structure example of a transistor.
Figure 7B:
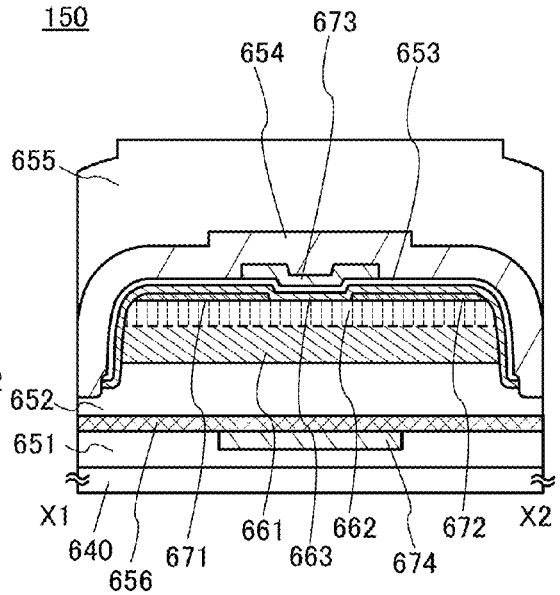
Figure 7C:
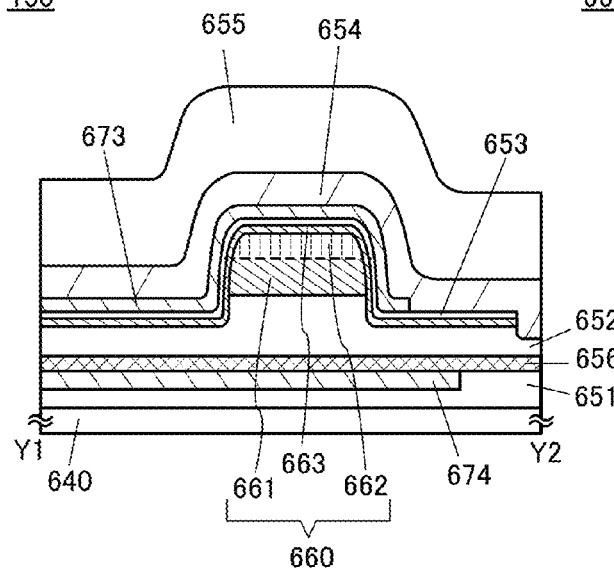
Figure 7D:
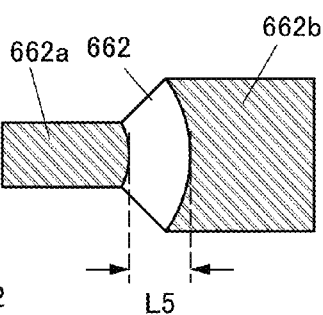

FIG. 7A is a top view of a transistor 150 that is a semiconductor device of one embodiment of the present invention. FIG. 7B is a cross-sectional view taken along dashed-dotted line X1-X2 in FIG. 7A, and FIG. 7C is a cross-sectional view taken along dashed-dotted line Y1-Y2 in FIG. 7A. FIG. 7D is a top view of the semiconductor 662.

The transistor 150 illustrated in FIGS. 7A to 7C is different from the transistor 140 illustrated in FIGS. 6A to 6C in that, when seen from the top, end portions of the conductive films 671 and 672 each have a certain curvature. The conductive films 673 and 674 are curved with the curvature. Components of the transistor 150 other than the above are similar to those of the transistor 140; thus, the detailed description thereof is omitted.

It is preferable that, in the transistor 150, the conductive film 671 serve as a source electrode and the conductive film 672 serve as a drain electrode. With such a structure, the transistor 150 is hardly affected by a channel length modulation effect, leading to favorable saturation characteristics in $V_d$–$I_d$ characteristics and stable electric characteristics.

In FIGS. 7A and 7D, "L5" represents the channel length of the transistor 150. As in the case of the transistor 100 illustrated in FIGS. 1A to 1D, the channel length L5 of the transistor 150 is the distance between an end portion of the conductive film 671 and an end portion of the conductive film 672 in the top surface of the semiconductor 662. That is, the channel length L5 is the distance between the end portion of the conductive film 671 and the end portion of the conductive film 672.

When the transistor 150 is applied to a highly integrated semiconductor device such as LSI, the channel length L5 is greater than or equal to 10 nm and less than 1 µm, preferably greater than or equal to 10 nm and less than 100 nm, further preferably greater than or equal to 10 nm and less than 60 nm, and still further preferably greater than or equal to 10 nm and less than 30 nm, for example.

When the transistor 150 is applied to a semiconductor device that requires a high withstand voltage, such as a power control device, the channel length L5 is greater than or equal to 1 µm, preferably greater than or equal to 10 µm, and further preferably greater than or equal to 100 µm, for example.

Structure Example 7 of Transistor

Next, a structure example different from that of the transistor 110 illustrated in FIGS. 3A to 3D will be described with reference to FIGS. 8A to 8D.

Figure 8A:
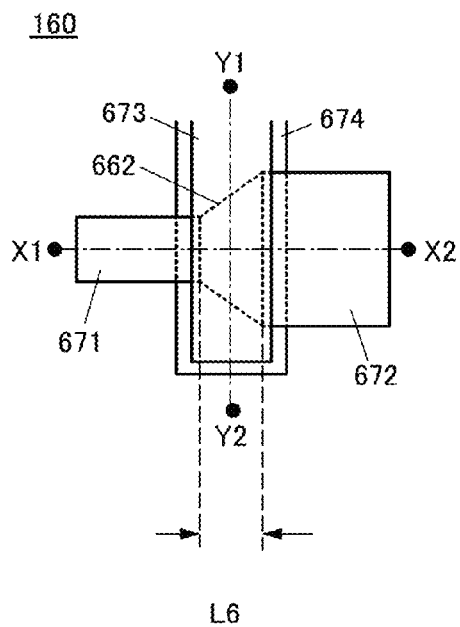
FIGS. 8A to 8D are top views and cross-sectional views illustrating a structure example of a transistor.
Figure 8B:
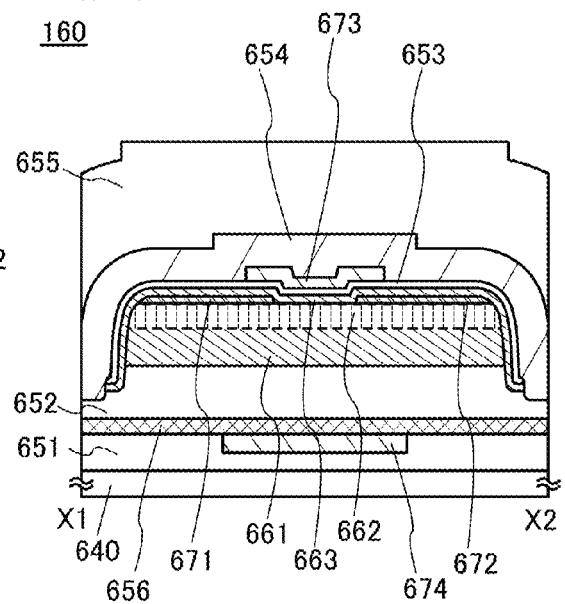
Figure 8C:
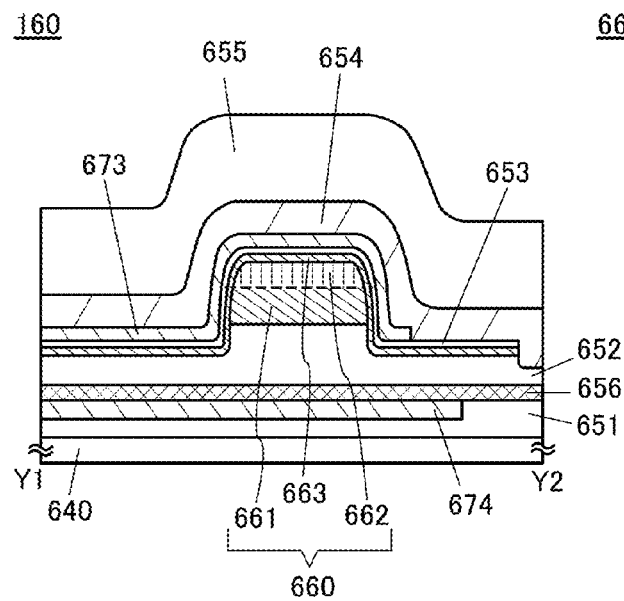
Figure 8D:
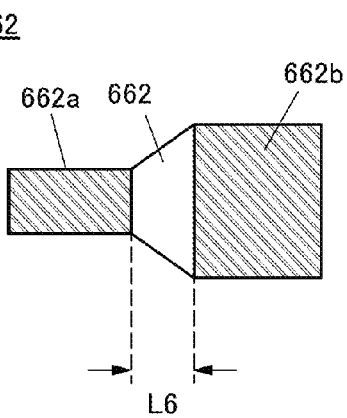

FIG. 8A is a top view of a transistor 160 that is a semiconductor device of one embodiment of the present invention. FIG. 8B is a cross-sectional view taken along dashed-dotted line X1-X2 in FIG. 8A, and FIG. 8C is a cross-sectional view taken along dashed-dotted line Y1-Y2 in FIG. 8A. FIG. 8D is a top view of the semiconductor 662.

The transistor 160 illustrated in FIGS. 8A to 8C is different from the transistor 110 illustrated in FIGS. 3A to 3D in that, when seen from the top, the conductive film 671 serving as one of a source and a drain and the conductive film 672 serving as the other of the source and the drain are opposed to each other and form a trapezoid.

Furthermore, unlike in the transistor 110 illustrated in FIGS. 3A to 3D, the semiconductor 662 has a region 662a overlapping with the conductive film 671 and a region 662b overlapping with the conductive film 672, the region 662a and the region 662b each have an end portion opposed to the other region, and when seen from the top, the length of the end portion of the region 662a is shorter than that of the end portion of the region 662b, as illustrated in FIG. 8D. Other components of the transistor 160 are similar to those of the transistor 110; thus, the detailed description thereof is omitted.

It is preferable that, in the transistor 160, the conductive film 671 serve as a source electrode and the conductive film 672 serve as a drain electrode. With such a structure, the transistor 160 is hardly affected by a channel length modulation effect, leading to favorable saturation characteristics in $V_d$-$I_d$ characteristics and stable electric characteristics.

In FIGS. 8A and 8D, "L6" represents the channel length of the transistor 160. As in the case of the transistor 100 illustrated in FIGS. 1A to 1D, the channel length L6 of the transistor 160 is the distance between an end portion of the conductive film 671 and an end portion of the conductive film 672 in the top surface of the semiconductor 662. That is, the channel length L6 is the distance between the end portion of the conductive film 671 and the end portion of the conductive film 672.

When the transistor 160 is applied to a highly integrated semiconductor device such as LSI, the channel length L6 is greater than or equal to 10 nm and less than 1 µm, preferably greater than or equal to 10 nm and less than 100 nm, further preferably greater than or equal to 10 nm and less than 60 nm, and still further preferably greater than or equal to 10 nm and less than 30 nm, for example.

When the transistor 160 is applied to a semiconductor device that requires a high withstand voltage, such as a power control device, the channel length L6 is greater than or equal to 1 µm, preferably greater than or equal to 10 µm, and further preferably greater than or equal to 100 µm, for example.

Structure Example 8 of Transistor

Figure 9A:
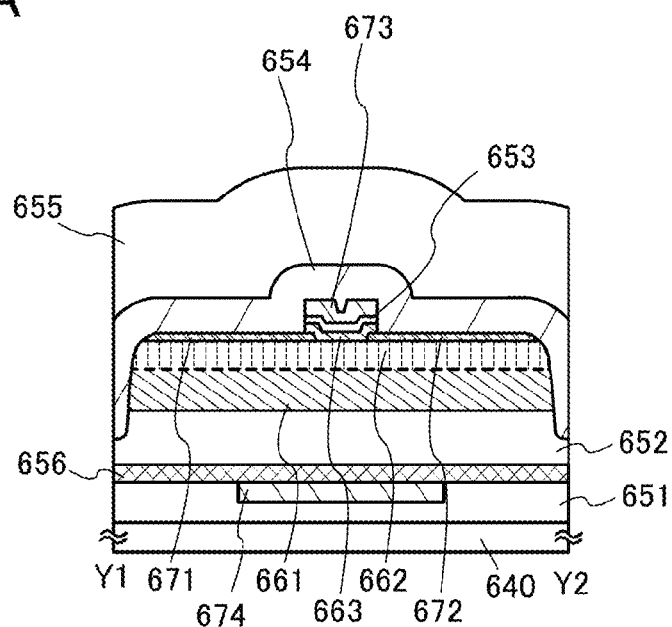
FIGS. 9A and 9B are cross-sectional views illustrating a structure example of a transistor.
Figure 9B:
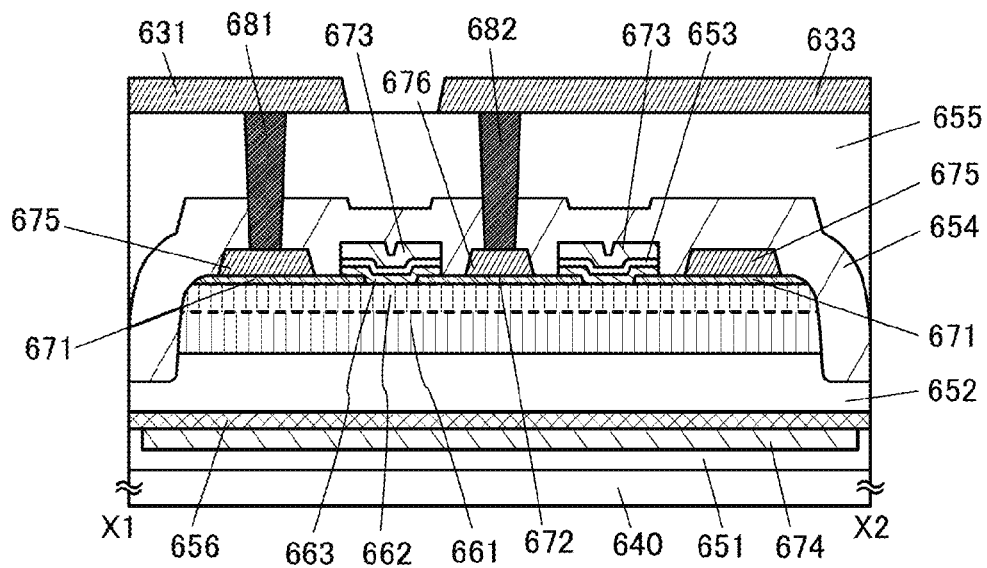

In each of the transistors described in this embodiment, the semiconductor 663 and the insulating film 653 may be etched at the same time when the conductive film 673 is formed by etching. FIGS. 9A and 9B illustrate examples of such a case.

FIG. 9A illustrates the case where the semiconductor 663 and the insulating film 653 in FIG. 3B, FIG. 6B, FIG. 7B, or FIG. 8B are provided only under the conductive film 673.

FIG. 9B illustrates the case where the semiconductor 663 and the insulating film 653 in FIG. 4B or FIG. 5B are provided only under the conductive film 673.

Structure Example 9 of Transistor

Figure 10A:
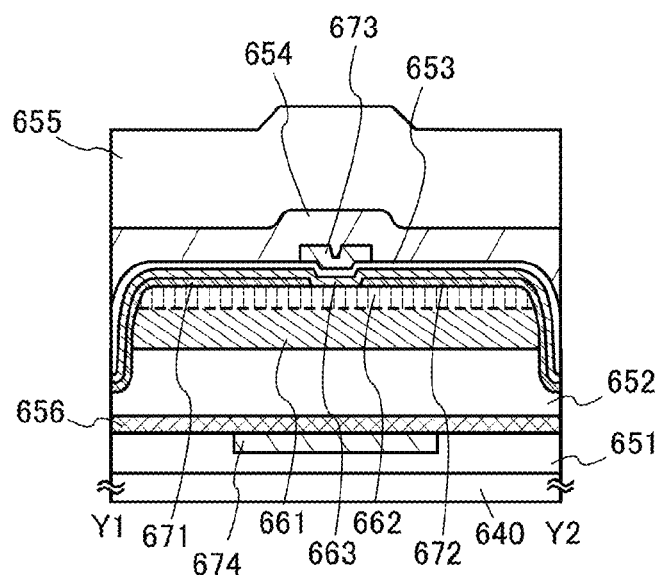
FIGS. 10A and 10B are cross-sectional views illustrating a structure example of a transistor.
Figure 10B:
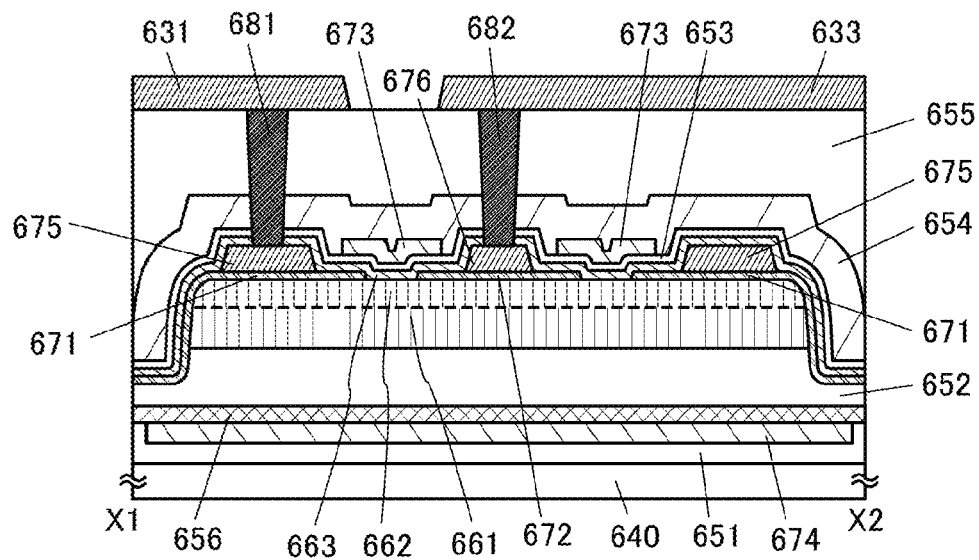

In each of the transistors described in this embodiment, the conductive films 671 and 672 may be in contact with side surfaces of the semiconductors 661 and 662. FIGS. 10A and 10B illustrate examples of such a case.

FIG. 10A illustrates the case where the conductive films 671 and 672 in FIG. 3B, FIG. 6B, FIG. 7B, or FIG. 8B are in contact with the side surfaces of the semiconductors 661 and 662.

FIG. 10B illustrates the case where the conductive film 671 in FIG. 4B or FIG. 5B is in contact with the side surfaces of the semiconductors 661 and 662.

Structure Example 10 of Transistor

Figure 11A:
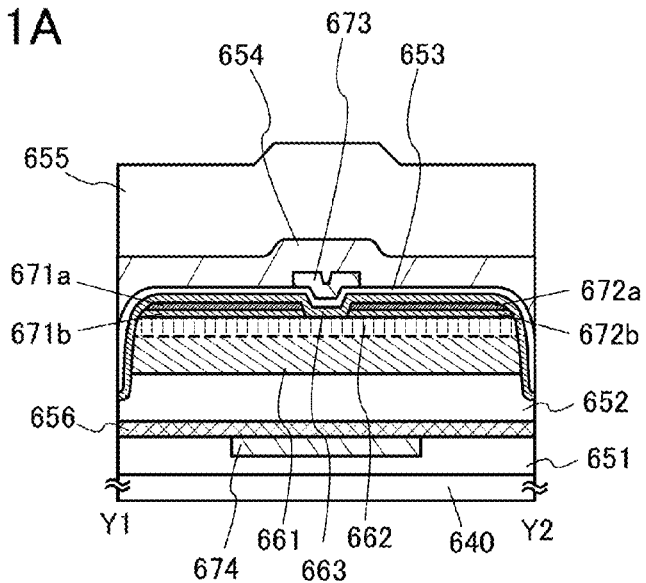
FIGS. 11A and 11B are cross-sectional views illustrating a structure example of a transistor.
Figure 11B:
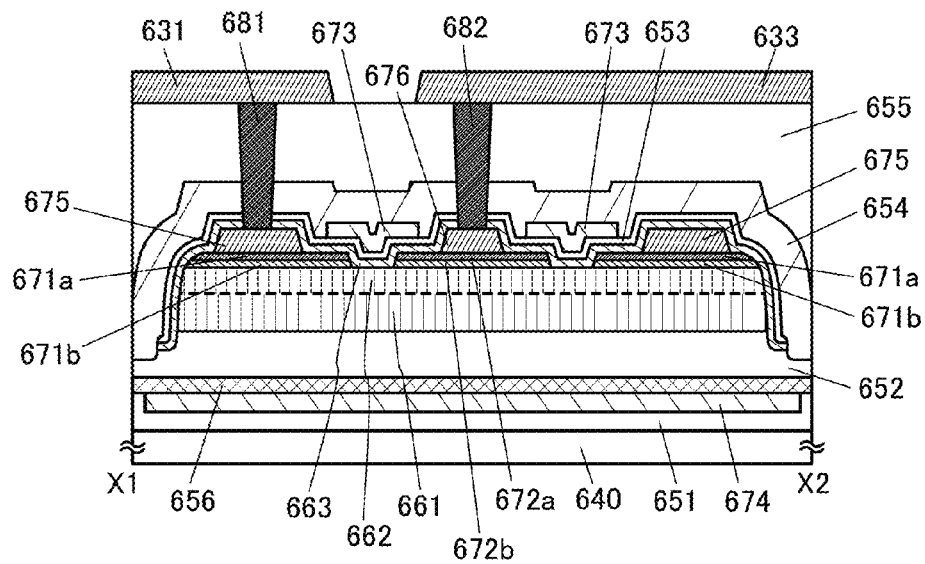

In each of the transistors described in this embodiment, the conductive film 671 may be a stack including a conductive film 671a and a conductive film 671b. Furthermore, the conductive film 672 may be a stack including a conductive film 672a and a conductive film 672b. FIGS. 11A and 11B illustrate examples of such a case.

FIG. 11A illustrates the case where the conductive film 671 and the conductive film 672 in FIG. 3B, FIG. 6B, FIG. 7B, or FIG. 8B are a stack including the conductive films 671a and 671b and a stack including the conductive films 672a and 672b, respectively.

FIG. 11B illustrates the case where the conductive film 671 and the conductive film 672 in FIG. 4B or FIG. 5B are a stack including the conductive films 671a and 671b and a stack including the conductive films 672a and 672b, respectively.

The conductive films 671b and 672b may be formed using a transparent conductor, an oxide semiconductor, a nitride semiconductor, or an oxynitride semiconductor, for example. The conductive films 671b and 672b may be formed using, for example, a film containing indium, tin, and oxygen, a film containing indium and zinc, a film containing indium, tungsten, and zinc, a film containing tin and zinc, a film containing zinc and gallium, a film containing zinc and aluminum, a film containing zinc and fluorine, a film containing zinc and boron, a film containing tin and antimony, a film containing tin and fluorine, a film containing titanium and niobium, or the like. Alternatively, any of these films may contain hydrogen, carbon, nitrogen, silicon, germanium, or argon.

The conductive films 671b and 672b may have a property of transmitting visible light. Alternatively, the conductive films 671b and 672b may have a property of not transmitting visible light, ultraviolet light, infrared light, or X-rays by reflecting or absorbing it. In some cases, such a property can suppress a change in electrical characteristics of the transistor due to stray light.

The conductive films 671b and 672b may preferably be formed using a layer which does not form a Schottky barrier with the semiconductor 662 or the like. Accordingly, on-state characteristics of the transistor can be improved.

Each of the conductive films 671a and 672a may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. For example, an alloy film or a compound film may be used, and a conductor containing aluminum, a conductor containing copper and titanium, a conductor containing copper and manganese, a conductor containing indium, tin, and oxygen, a conductor containing titanium and nitrogen, or the like may be used.

Note that the conductive films 671b and 672b may preferably be formed using a film having a resistance higher than that of the conductive films 671a and 672a. The conductive films 671b and 672b may preferably be formed using a film having a resistance lower than that of the channel of the transistor. For example, the conductive films 671b and 672b may have a resistivity higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The conductive films 671b and 672b having a resistivity within the above range can reduce electric field concentration in a boundary portion between the channel and the drain. Therefore, a change in electrical characteristics of the transistor can be suppressed. In addition, a punch-through current generated by an electric field from the drain can be reduced. Thus, a transistor with a small channel length can have favorable saturation characteristics. Note that in a circuit configuration where the source and the drain do not interchange, only one of the conductive films 671b and 672b (e.g., the film on the drain side) may preferably be provided.

Structure Example 11 of Transistor

Figure 12A:
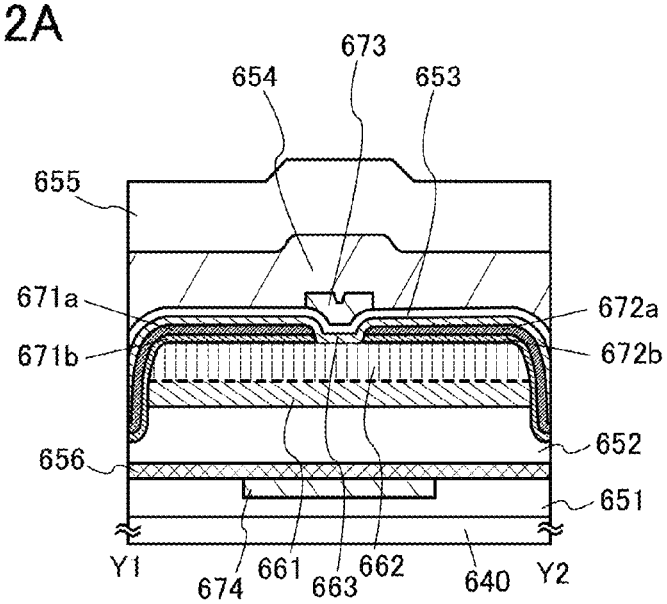
FIGS. 12A and 12B are cross-sectional views illustrating a structure example of a transistor.
Figure 12B:
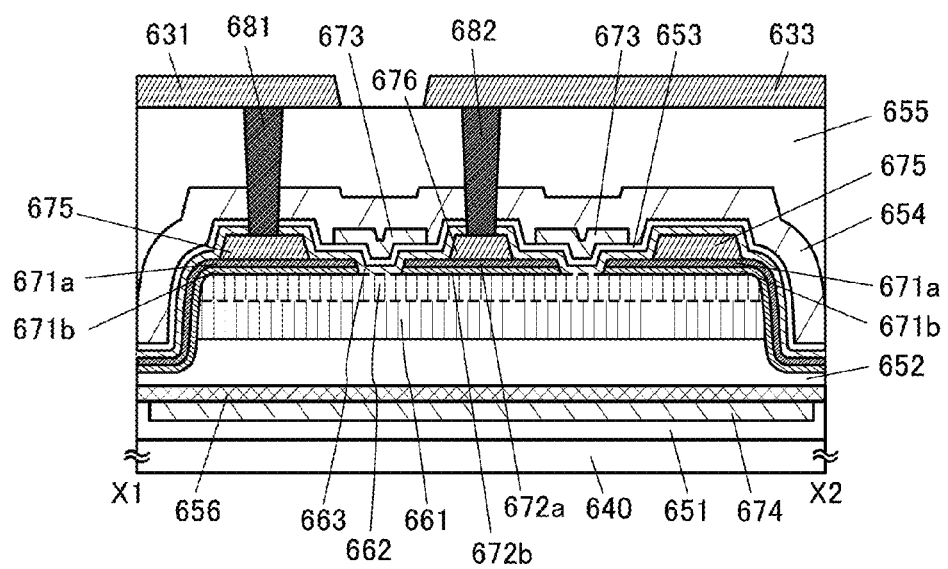

In each of the transistors illustrated in FIGS. 11A and 11B, the conductive films 671b and 672b may be in contact with side surfaces of the semiconductors 661 and 662. FIGS. 12A and 12B illustrate examples of such cases.

FIG. 12A illustrates the case where the conductive films 671b and 672b in FIG. 11A are in contact with the side surfaces of the semiconductors 661 and 662.

FIG. 12B illustrates the case where the conductive film 671b in FIG. 11B is in contact with the side surfaces of the semiconductors 661 and 662.

<Method for Manufacturing Transistor>

A method for manufacturing the transistor illustrated in FIGS. 3A to 3D, FIGS. 6A to 6C, FIGS. 7A to 7C, or FIGS. 8A to 8C of the transistors described in the above structure examples will be described below with reference to FIGS. 13A to 13E and FIGS. 14A to 14D. Note that cross-sectional views of the transistor in the channel length direction (cross-sectional views along dashed-dotted line X1-X2 in FIGS. 3A to 3C, FIGS. 6A and 6B, FIGS. 7A and 7B, or FIGS. 8A and 8B) are shown on the left side of FIGS. 13A to 13E and FIGS. 14A to 14D, and cross-sectional views of the transistor in the channel width direction (cross-sectional views along dashed-dotted line Y1-Y2 in FIGS. 3A and 3B, FIGS. 6A and 6C, FIGS. 7A and 7C, or FIGS. 8A and 8C) are shown on the right side of FIGS. 13A to 13E and FIGS. 14A to 14D.

The transistors described in this embodiment other than the transistors illustrated in FIGS. 3A to 3D, FIGS. 6A to 6C, FIGS. 7A to 7C, and FIGS. 8A to 8C can be easily manufactured according to the following manufacturing method.

Figure 13A:
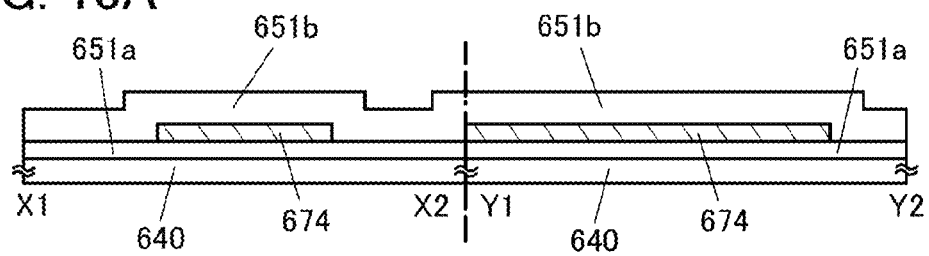
FIGS. 13A to 13E are cross-sectional views illustrating a method for manufacturing a transistor.

First, an insulating film 651a is formed over the substrate 640. Then, the conductive film 674 is formed, followed by an insulating film 651b (FIG. 13A).

As the substrate 640, for example, an insulator substrate, a semiconductor substrate, or a conductor substrate may be used. As the insulator substrate, for example, a glass substrate, a quartz substrate, a sapphire substrate, a stabilized zirconia substrate (e.g., an yttria-stabilized zirconia substrate), or a resin substrate is used. As the semiconductor substrate, for example, a single material semiconductor substrate made of silicon, germanium, or the like; a compound semiconductor substrate made of silicon carbide, silicon germanium, gallium arsenide, indium phosphide, zinc oxide, or gallium oxide; or the like is used. A semiconductor substrate in which an insulator region is provided in the above semiconductor substrate, e.g., a silicon on insulator (SOI) substrate may also be used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like may also be used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 640. As a method for providing a transistor over a flexible substrate, there is a method in which the transistor is formed over a non-flexible substrate and then the transistor is separated and transferred to the substrate 640 which is a flexible substrate. In that case, a separation layer is preferably provided between the non-flexible substrate and the transistor. As the substrate 640, a sheet, a film, or a foil containing a fiber may be used. The substrate 640 may have elasticity. The substrate 640 may have a property of returning to its original shape when bending or pulling is stopped. Alternatively, the substrate 640 may have a property of not returning to its original shape. The thickness of the substrate 640 is, for example, greater than or equal to 5 µm and less than or equal to 700 µm, preferably greater than or equal to 10 µm and less than or equal to 500 µm, more preferably greater than or equal to 15 µm and less than or equal to 300 µm. When the substrate 640 has a small thickness, the weight of the semiconductor device can be reduced. When the substrate 640 has a small thickness, even in the case of using glass or the like, the substrate 640 may have elasticity or a property of returning to its original shape when bending or pulling is stopped. Therefore, an impact applied to the semiconductor device over the substrate 640, which is caused by dropping or the like, can be reduced. That is, a durable semiconductor device can be provided.

For the substrate 640 which is a flexible substrate, for example, metal, an alloy, resin, glass, or fiber thereof can be used. The flexible substrate 640 preferably has a lower coefficient of linear expansion because deformation due to an environment is suppressed. The flexible substrate 640 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate 640 because of its low coefficient of linear expansion.

As a material for the insulating films 651a and 651b, a material containing silicon oxide, silicon nitride, silicon oxynitride, or silicon nitride oxide is preferably used. Alternatively, a metal oxide such as aluminum oxide, aluminum oxynitride, gallium oxide, gallium oxynitride, yttrium oxide, yttrium oxynitride, hafnium oxide, or hafnium oxynitride can be used. Note that in this specification, "oxynitride" refers to a material that contains oxygen at a higher proportion than nitrogen, and a "nitride oxide" refers to a material that contains nitrogen at a higher proportion than oxygen.

The insulating films 651a and 651b may be formed using silicon oxide with high step coverage which is formed by reacting tetraethyl orthosilicate (TEOS), silane, or the like with oxygen, nitrous oxide, or the like.

The insulating films 651a and 651b may be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or the like. In particular, it is preferable that the insulating films be formed by a CVD method, further preferably a plasma CVD method, because coverage can be further improved. It is preferable to use a thermal CVD method, an MOCVD method, or an ALD method in order to reduce plasma damage.

In the case of using a semiconductor substrate as the substrate 640, the insulating film 651a may be formed using a thermal oxide film.

The conductive film 674 preferably has a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive films are preferably formed using a low-resistance conductive material such as aluminum or copper. The conductive films are further preferably formed using a Cu—Mn alloy, in which case manganese oxide formed at the interface with an insulator containing oxygen has a function of preventing Cu diffusion.

The conductive film 674 can be formed by a sputtering method, a CVD method (including a thermal CVD method, an MOCVD method, a PECVD method, and the like), an MBE method, an ALD method, a PLD method, or the like.

Figure 13B:
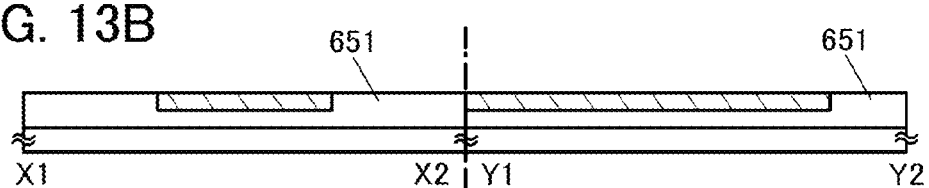

Next, a surface of the insulating film 651b is planarized by a chemical mechanical polishing (CMP) method (see FIG. 13B).

As the insulating film 651b, a planarization film may be used. At this time, a CMP method or the like is not necessarily used for planarization. The planarization film can be formed by, for example, an atmospheric pressure CVD method, a coating method, or the like. An example of a film which can be formed by an atmospheric pressure CVD method is a film of boron phosphorus silicate glass (BPSG). Furthermore, an example of a film which can be formed by a coating method is a film of hydrogen silsesquioxane (HSQ).

Hereinafter, the insulating films 651a and 651b are collectively referred to as the insulating film 651.

Figure 13C:
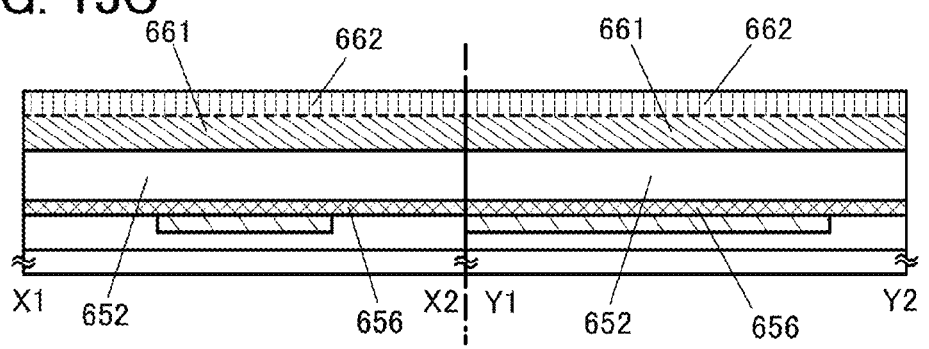
Figure 13D:
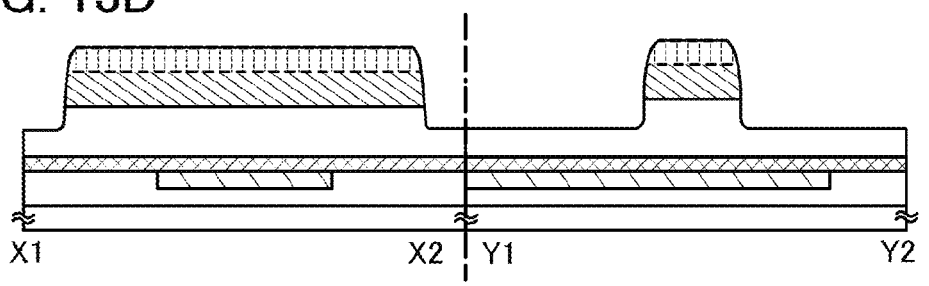
Figure 13E:
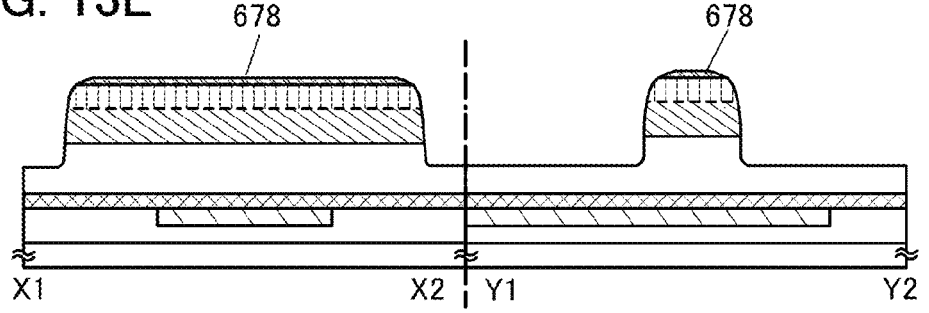

Next, the insulating film 656, the insulating film 652, the semiconductor 661, and the semiconductor 662 are formed (see FIG. 13C).

The insulating films 656 and 652 may be formed by a sputtering method, a CVD method (including a thermal CVD method, an MOCVD method, a PECVD method, and the like), an MBE method, an ALD method, a PLD method, or the like.

The insulating film 656 preferably has a blocking effect against oxygen, hydrogen, water, alkali metal, alkaline earth metal, and the like. The insulating film 656 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like, may be provided. As the oxide insulating film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

The insulating film 652 preferably contains an oxide that can supply oxygen to the semiconductor 660. For example, for the insulating film 652, a material containing silicon oxide or silicon oxynitride is preferably used. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

To make the insulating film 652 contain excess oxygen, the insulating film 652 may be formed in an oxygen atmosphere, for example. Alternatively, a region containing excess oxygen may be formed by introducing oxygen into the insulating film 652 that has been formed. Both the methods may be combined.

For example, oxygen (at least including any of oxygen radicals, oxygen atoms, and oxygen ions) is introduced into the insulating film 652 which has been formed, whereby a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, and the like can be used. Furthermore, a rare gas may be included in the gas containing oxygen for the oxygen introduction treatment. Moreover, hydrogen or the like may be included.

After the insulating film 652 is formed, the insulating film 652 may be subjected to planarization treatment using a CMP method or the like to improve the planarity the top surface thereof.

The semiconductors 661 and 662 are preferably formed successively without contact with the air. The semiconductors 661 and 662 are formed by a sputtering method, a CVD method (including a thermal CVD method, an MOCVD method, a PECVD method, and the like), an MBE method, a PLD method, an ALD method, or the like.

The description of the semiconductors 661 and 662 in FIGS. 1A to 1D can be referred to for a material that can be used for the semiconductors 661 and 662.

Note that in the case where In—Ga—Zn oxide layers formed by an MOCVD method are used as the semiconductors 661 and 662, trimethylindium, trimethylgallium, dimethylzinc, and the like may be used as source gases. The source gases are not limited to the above combination, and triethylindium or the like may be used instead of trimethylindium. Alternatively, triethylgallium or the like may be used instead of trimethylgallium. Further alternatively, diethylzinc or the like may be used instead of dimethylzinc.

Here, after the semiconductor 661 is formed, oxygen may be introduced into the semiconductor 661. For example, oxygen (at least including any of oxygen radicals, oxygen atoms, and oxygen ions) is introduced into the semiconductor 661 which has been formed, whereby a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, and the like can be used. Furthermore, a rare gas may be included in the gas containing oxygen for the oxygen introduction treatment. Moreover, hydrogen or the like may be included.

After the semiconductors 661 and 662 are formed, heat treatment is preferably performed. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidizing gas at 10 ppm or more, in order to compensate for released oxygen. The heat treatment may be performed directly after the formation of oxide semiconductor films or may be performed after the oxide semiconductor films are processed into the island-shaped semiconductors 661 and 662. Through the heat treatment, oxygen can be supplied to the semiconductors from the insulating film 652 and the oxide film; thus, oxygen vacancies in the semiconductors can be reduced.

Then, a resist mask is formed by a method similar to that described above, and an unnecessary portion is removed by etching. Then, the resist mask is removed. In this manner, a stacked-layer structure including the island-shaped semiconductors 661 and 662 can be formed (see FIG. 13D). Note that, in some cases, part of the insulating film 652 is etched in the etching of the semiconductor films to reduce the thickness of a portion of the insulating film 652 which is not covered with the semiconductors 661 and 662. For this reason, the insulating film 652 is preferably formed to have a large thickness so as not to be removed by the etching.

Note that there is a possibility that the resist is totally removed depending on the etching conditions of the semiconductor films; therefore, what is called a hard mask formed of a material with high resistance to etching, such as an inorganic film or a metal film, may be used. Here, for example, a conductive film is used as a hard mask 678, and the semiconductor film is processed using the hard mask 678 to form the semiconductors 661 and 662 (see FIG. 13E).

The hard mask 678 preferably has a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductive films are preferably formed using a low-resistance conductive material such as aluminum or copper. The conductive films are further preferably formed using a Cu—Mn alloy, in which case manganese oxide formed at the interface with an insulator containing oxygen has a function of preventing Cu diffusion.

The hard mask 678 is preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

The hard mask 678 can be formed by a sputtering method, a CVD method (including a thermal CVD method, an MOCVD method, a PECVD method, and the like), an MBE method, an ALD method, a PLD method, or the like.

Figure 14A:
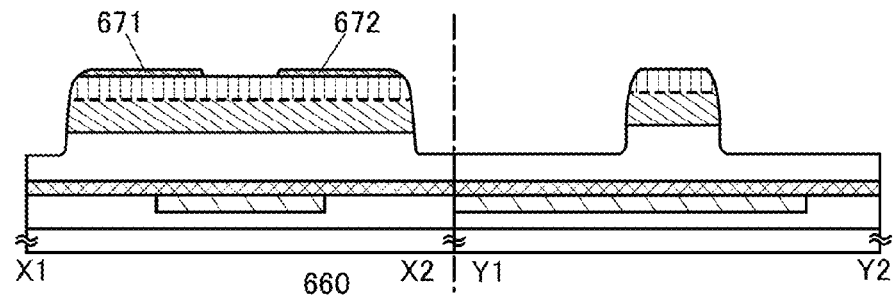
FIGS. 14A to 14D are cross-sectional views illustrating a method for manufacturing a transistor.
Figure 14B:
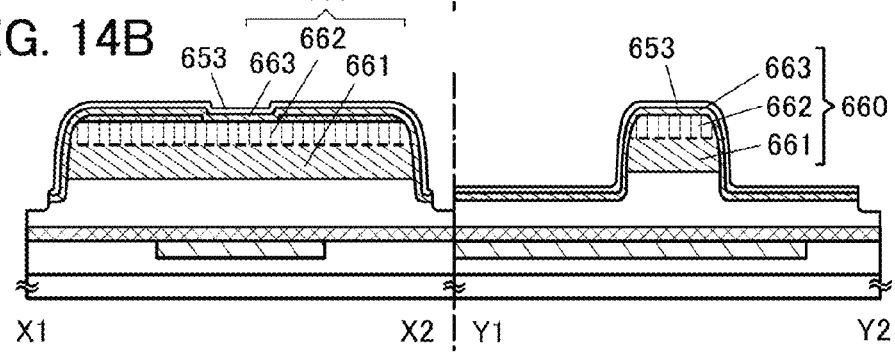

Next, a resist mask is formed, and the hard mask 678 is processed into the conductive films 671 and 672 by etching (see FIG. 14A). Note that in some cases, upper portions of the semiconductor 662 and the insulating film 652 are partly etched in etching of the hard mask 678, so that a portion not overlapping with the conductive film 671 or 672 is thinned. For this reason, the semiconductor 662 is preferably formed to have a large thickness in advance in consideration of the etching depth.

Then, the semiconductor 663 and the insulating film 653 are formed. After that, a resist mask is formed, the semiconductor 663 and the insulating film 653 are processed by etching, and the resist mask is removed (see FIG. 14B).

Figure 14C:
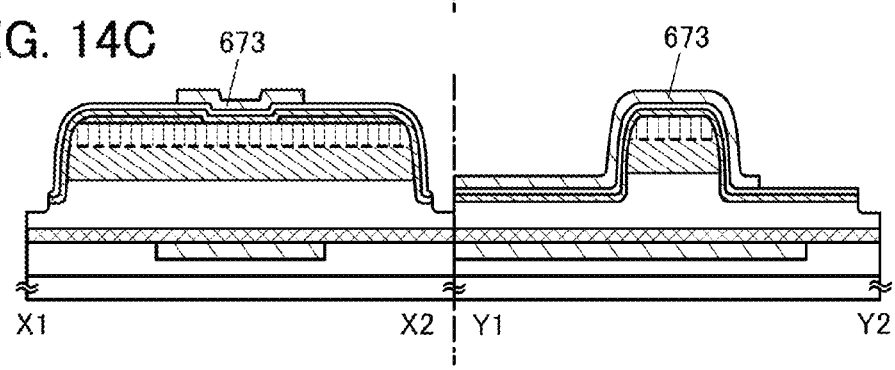
Figure 14D:
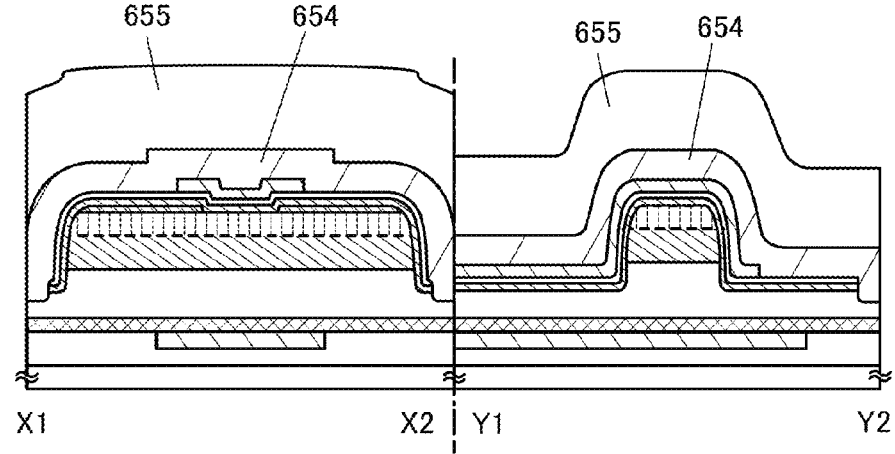

Next, the conductive film 673 is deposited, a resist mask is formed, the conductive film 673 is processed by etching, and the resist mask is removed, whereby a gate electrode is formed (see FIG. 14C).

The semiconductor 663, the insulating film 653, and the conductive film 673 may be formed by a sputtering method, a CVD method (including a thermal CVD method, an MOCVD method, a PECVD method, and the like), an MBE method, a PLD method, an ALD method, or the like. In particular, it is preferable to use a CVD method, further preferably a plasma CVD method because coverage can be further improved. It is preferable to use a thermal CVD method, an MOCVD method, or an ALD method in order to reduce plasma damage.

The semiconductor 663 and the insulating film 653 may be etched after the conductive film 673 is formed. The etching may be performed with a resist mask, for example. Alternatively, the insulating film 653 and the semiconductor 663 may be etched using the conductive film 673 as a mask.

After the semiconductor 663 is formed, oxygen may be introduced into the semiconductor 663. For example, oxygen (at least including any of oxygen radicals, oxygen atoms, and oxygen ions) is introduced into the semiconductor 663 which has been formed, whereby a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, and the like can be used. Furthermore, a rare gas may be included in the gas containing oxygen for the oxygen introduction treatment. Moreover, hydrogen or the like may be included.

The description of the semiconductor 663 in FIGS. 1A to 1D can be referred to for a material that can be used for the semiconductor 663.

The insulating film 653 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 653 may be a stack including any of the above materials. The insulating film 653 may contain lanthanum (La), nitrogen, or zirconium (Zr) as an impurity.

An example of a stacked-layer structure of the insulating film 653 is described. The insulating film 653 contains oxygen, nitrogen, silicon, or hafnium, for example. Specifically, the insulating film 653 preferably includes hafnium oxide and silicon oxide or silicon oxynitride.

Hafnium oxide has a higher dielectric constant than silicon oxide and silicon oxynitride. Therefore, the thickness of the insulating film 653 can be made large as compared with the case where silicon oxide is used; as a result, a leakage current due to a tunnel current can be low. That is, it is possible to provide a transistor with a low off-state current.

Next, the insulating film 654 is formed. The insulating film 654 has a blocking effect against oxygen, hydrogen, water, alkali metal, alkaline earth metal, and the like. The insulating film 654 can be formed by a sputtering method, a CVD method (including a thermal CVD method, an MOCVD method, a PECVD method, and the like), an MBE method, an ALD method, a PLD method, or the like, for example. In particular, it is preferable that the insulating film be formed by a CVD method, further preferably a plasma CVD method because coverage can be further improved. It is preferable to use a thermal CVD method, an MOCVD method, or an ALD method in order to reduce plasma damage.

The insulating film 654 preferably has a blocking effect against oxygen, hydrogen, water, alkali metal, alkaline earth metal, and the like. The insulating film 654 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like, may be provided. As the oxide insulating film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An aluminum oxide film is preferably used as the insulating film 654 because it is highly effective in preventing transmission of both oxygen and impurities such as hydrogen and moisture. In addition, oxygen contained in the aluminum oxide film can be diffused into the semiconductor 660.

After the insulating film 654 is formed, heat treatment is preferably performed. Through this heat treatment, oxygen can be supplied to the semiconductor 660 from the insulating film 652 or the like; thus, oxygen vacancies in the semiconductor 660 can be reduced. Because oxygen released from the insulating film 652 is blocked by the insulating film 656 and the insulating film 654 at this time, the oxygen can be effectively confined. Thus, the amount of oxygen supplied to the semiconductor 660 can be increased, so that oxygen vacancies in the semiconductor 660 can be effectively reduced.

Next, the insulating film 655 is formed. The insulating film 655 can be formed by a sputtering method, a CVD method (including a thermal CVD method, an MOCVD method, a PECVD method, and the like), an MBE method, an ALD method, a PLD method, or the like. In particular, it is preferable that the insulating film be formed by a CVD method, further preferably a plasma CVD method, because coverage can be improved. It is preferable to use a thermal CVD method, an MOCVD method, or an ALD method in order to reduce plasma damage. In the case where the insulating film 655 is formed using an organic insulating material such as an organic resin, a coating method such as a spin coating method may be used. After the insulating film 655 is formed, a top surface thereof is preferably subjected to planarization treatment.

The insulating film 655 can be formed using an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for the insulating film 655, an organic resin such as a polyimide resin, a polyamide resin, an acrylic resin, a siloxane resin, an epoxy resin, or a phenol resin can be used. The insulating film 655 may be a stack including any of the above materials.

The structures, methods, and the like described in this embodiment can be used as appropriate in combination with any of the structures, methods, and the like described in other embodiments.

Embodiment 2

In this embodiment, an example of a circuit including the transistor of one embodiment of the present invention is described with reference to drawings.

<Cross-Sectional View of Semiconductor Device>

Figure 15A:
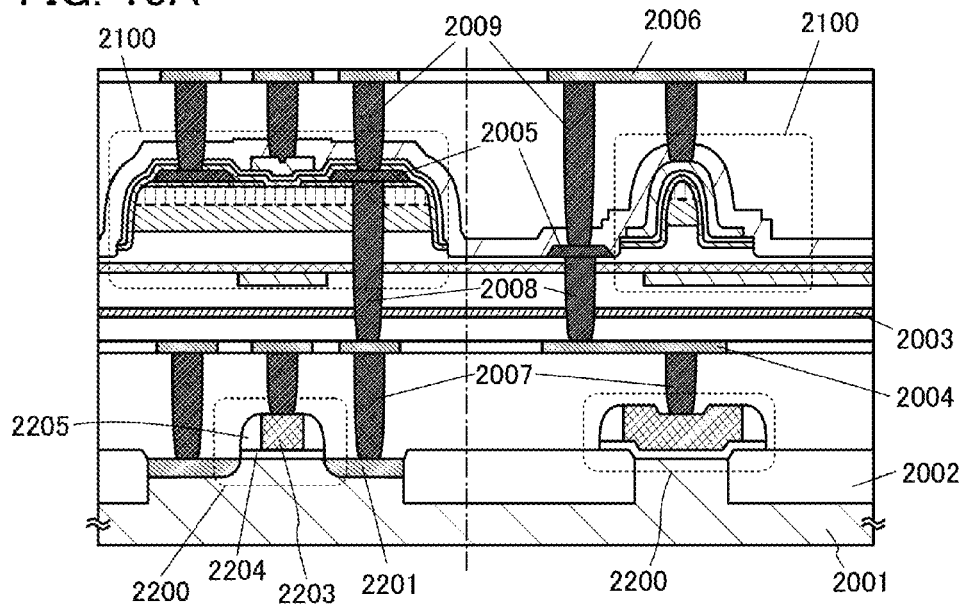
FIGS. 15A to 15E are cross-sectional views and circuit diagrams each illustrating a structure example of a semiconductor device.

FIG. 15A is a cross-sectional view of a semiconductor device of one embodiment of the present invention. The semiconductor device illustrated in FIG. 15A includes a substrate 2001, a transistor 2200, a transistor 2100, an element isolation layer 2002, an insulating film 2003, a conductive film 2004, a conductive film 2005, a conductive film 2006, a plug 2007, a plug 2008, and a plug 2009. The transistor 2200 includes an impurity region 2201 serving as a source region or a drain region, a gate electrode 2203, a gate insulating layer 2204, and a sidewall insulating layer 2205.

The semiconductor device illustrated in FIG. 15A includes a transistor 2200 containing a first semiconductor material in a lower portion and a transistor 2100 containing a second semiconductor material in an upper portion. In FIG. 15A, an example is described in which the transistor described in Embodiment 1 as an example is used as the transistor 2100 containing the second semiconductor material. A cross-sectional view of the transistors 2100 and 2200 in a channel length direction is on the left side of a dashed-dotted line, and a cross-sectional view of the transistors 2100 and 2200 in a channel width direction is on the right side of the dashed-dotted line.

The first and second semiconductor materials preferably have different band gaps. For example, the first semiconductor material can be a semiconductor material other than an oxide semiconductor (examples of such a semiconductor material include silicon, germanium, silicon germanium, silicon carbide, and gallium arsenide), and the second semiconductor material can be an oxide semiconductor. A transistor using a material other than an oxide semiconductor, such as single crystal silicon, can operate at high speed easily. In contrast, a transistor including an oxide semiconductor has a low off-state current.

The transistor 2200 may be either an n-channel transistor or a p-channel transistor; an appropriate transistor is used depending on a circuit. Furthermore, the specific structure of the semiconductor device, such as the material or the structure used for the semiconductor device, is not necessarily limited to those described here except for the use of the transistor of one embodiment of the present invention which includes an oxide semiconductor.

The transistor 2200 may be provided with an impurity region serving as a lightly doped drain (LDD) region or an extension region under the sidewall insulating layer 2205. In particular, when the transistor 2200 is an n-channel transistor, the LDD region or the extension region is preferably provided in order to suppress the deterioration due to hot carriers.

As the transistor 2200, a transistor containing silicide (salicide) or a transistor that does not include the sidewall insulating layer 2205 may be used. When a structure that contains silicide (salicide) is used, the resistance of the source region and the drain region can be further lowered and the speed of the semiconductor device can be increased. Furthermore, the semiconductor device can operate at a low voltage; thus, power consumption of the semiconductor device can be reduced.

Since the two kinds of transistors are stacked, the area occupied by the circuit can be reduced, allowing a plurality of circuits to be highly integrated.

As the substrate 2001, a single crystal semiconductor substrate or a polycrystalline semiconductor substrate made of silicon or silicon carbide, a compound semiconductor substrate made of silicon germanium, a silicon on insulator (SOI) substrate, or the like may be used. A transistor formed using a semiconductor substrate can easily operate at high speed. In the case of using a p-type single crystal silicon substrate as the substrate 2001, an impurity element imparting n-type conductivity may be added to part of the substrate 2001 to form an n-well, and a p-type transistor can be formed in a region where the n-well is formed. As the impurity element imparting n-type conductivity, phosphorus (P), arsenic (As), or the like can be used. As the impurity element imparting p-type conductivity, boron (B) or the like may be used.

Alternatively, the substrate 2001 may be an insulating substrate or a metal substrate provided with a semiconductor film. Examples of the insulating substrate are a glass substrate, a quartz substrate, a plastic substrate, a flexible substrate, an attachment film, paper including a fibrous material, and a base film. Examples of the metal substrate are a stainless steel substrate, a substrate including stainless steel foil, a tungsten substrate, and a substrate including tungsten foil. Examples of the glass substrate are a barium borosilicate glass substrate, an aluminoborosilicate glass substrate, and a soda lime glass substrate. Examples of the flexible substrate are flexible synthetic resin substrates such as substrates of plastics typified by polyethylene terephthalate (PET), polyethylene naphthalate (PEN), and polyether sulfone (PES) and an acrylic substrate. Examples of the attachment film are attachment films formed using polypropylene, polyester, polyvinyl fluoride, polyvinyl chloride, and the like. Examples of the base film are base films formed using polyester, polyamide, polyimide, aramid, epoxy, an inorganic vapor deposition film, and paper.

Alternatively, a semiconductor element may be formed using one substrate, and then, transferred to another substrate. Examples of a substrate to which a semiconductor element is transferred include, in addition to the above-described substrates, a paper substrate, a cellophane substrate, an aramid film substrate, a polyimide film substrate, a stone substrate, a wood substrate, a cloth substrate (including a natural fiber (e.g., silk, cotton, and hemp), a synthetic fiber (e.g., nylon, polyurethane, and polyester), a regenerated fiber (e.g., acetate, cupra, rayon, and regenerated polyester), and the like)), a leather substrate, and a rubber substrate. When such a substrate is used, a transistor with excellent properties or a transistor with low power consumption can be formed, a device with high durability, high heat resistance can be provided, or reduction in weight or thickness can be achieved.

The transistor 2200 is isolated from other transistors formed on the substrate 2001 by the element isolation layer 2002. The element isolation layer 2002 can be formed using an insulator containing one or more materials selected from aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like.

Here, in the case where a silicon-based semiconductor material is used for the transistor 2200 provided in a lower tier, hydrogen in an insulating layer provided in the vicinity of the semiconductor layer of the transistor 2200 terminates dangling bonds of silicon; accordingly, the reliability of the transistor 2200 can be improved. Meanwhile, in the case where an oxide semiconductor is used for the transistor 2100 provided in an upper tier, hydrogen in an insulating layer provided in the vicinity of the semiconductor layer of the transistor 2100 becomes a factor of generating carriers in the oxide semiconductor; thus, the reliability of the transistor 2100 might be decreased. Therefore, in the case where the transistor 2100 formed using an oxide semiconductor is provided over the transistor 2200 formed using a silicon-based semiconductor material, it is particularly effective that the insulating film 2003 having a function of preventing diffusion of hydrogen is provided between the transistors 2100 and 2200. The insulating film 2003 makes hydrogen remain in the lower tier, thereby improving the reliability of the transistor 2200. In addition, since the insulating film 2003 suppresses diffusion of hydrogen from the lower tier to the upper tier, the reliability of the transistor 2100 can also be improved.

The insulating film 2003 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

The conductive films 2004 to 2006 preferably have a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. In addition, the plugs are preferably formed using a low-resistance conductive material such as aluminum or copper. The plugs are further preferably formed using a Cu—Mn alloy, in which case manganese oxide formed at the interface with an insulator containing oxygen has a function of preventing Cu diffusion.

The plugs 2007 to 2009 preferably have a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. In addition, the wirings are preferably formed using a low-resistance conductive material such as aluminum or copper. The wirings are further preferably formed using a Cu—Mn alloy, in which case manganese oxide formed at the interface with an insulator containing oxygen has a function of preventing Cu diffusion.

In FIG. 15A, regions without reference numerals and hatch patterns represent regions formed of an insulator. The regions can be formed using an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for the regions, an organic resin such as a polyimide resin, a polyamide resin, an acrylic resin, a siloxane resin, an epoxy resin, or a phenol resin can be used.

Figure 15B:
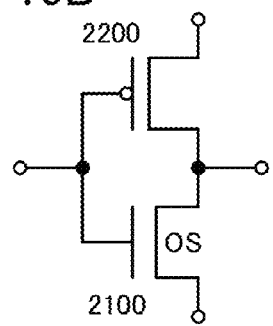
Figure 15C:
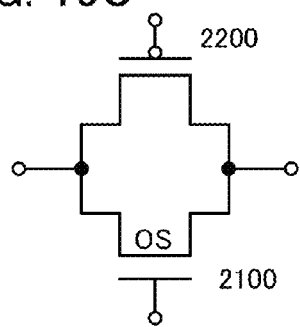
Figure 15D:
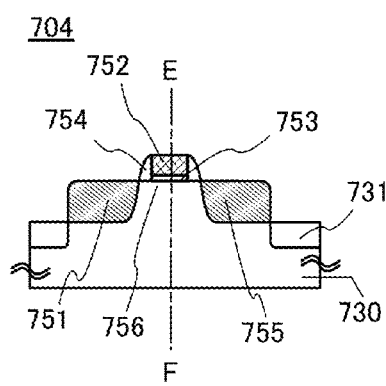
Figure 15E:
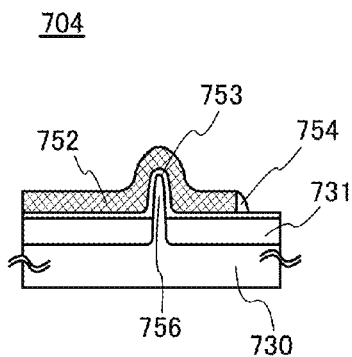

A transistor 704 illustrated in FIGS. 15D and 15E may be used instead of the transistor 2200. FIG. 15E illustrates a cross section along dashed-dotted line E-F in FIG. 15D. The transistor 704 formed over a semiconductor substrate 730 includes a semiconductor layer 756 where a channel is formed, an impurity region 751, an impurity region 755, a gate insulating layer 753, a gate electrode 752, a sidewall insulating layer 754, and an element isolation layer 731. The semiconductor layer 756 has a protrusion, and the gate insulating layer 753 and the gate electrode 752 are provided along top and side surfaces of the protrusion. Such a transistor is also referred to as a FIN transistor because it utilizes a protrusion of a semiconductor substrate. Note that an insulating film serving as a mask for forming the protrusion may be provided in contact with the top of the protrusion. Although the case where the protrusion is formed by processing a portion of the semiconductor substrate 730 is described here, a semiconductor layer having a protruding shape may be formed by processing an SOI substrate.

Figure 16:
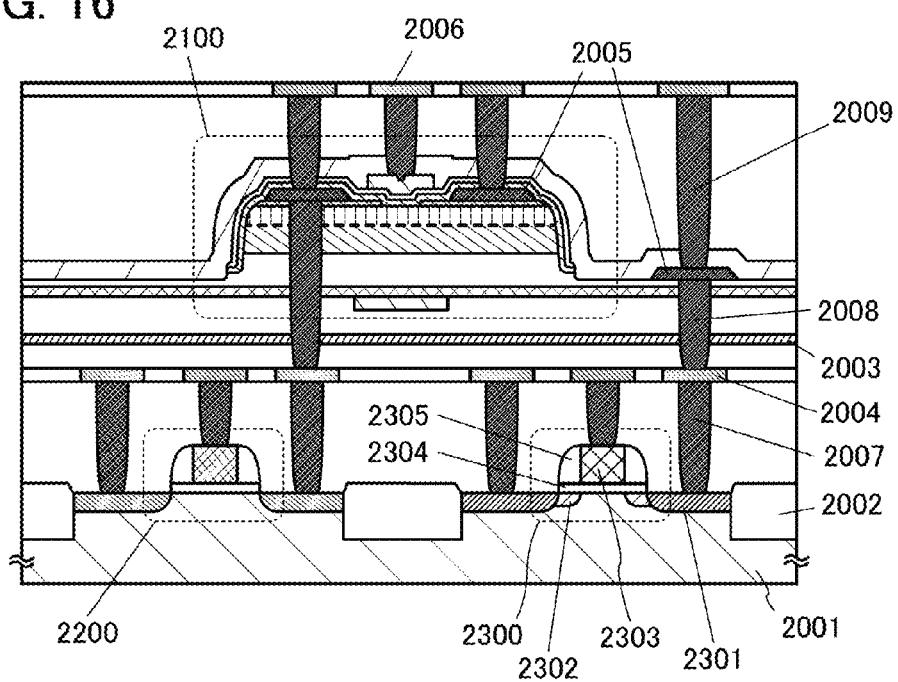
FIG. 16 is a cross-sectional view illustrating a structure example of a semiconductor device.

The semiconductor device illustrated in FIG. 15A may include a CMOS circuit having a transistor in which a channel is formed in the first semiconductor material. FIG. 16 is a cross-sectional view of a semiconductor device including a CMOS circuit having the transistor 2200 and a transistor 2300 in each of which a channel is formed in the first semiconductor material.

The transistor 2300 includes an impurity region 2301 serving as a source region or a drain region, a gate electrode 2303, a gate insulating layer 2304, and a sidewall insulating layer 2305. In the transistor 2300, an impurity region 2302 serving as an LDD region may be provided under the sidewall insulating layer 2305. For other components in FIG. 16, refer to the description for FIG. 15A.

The transistors 2200 and 2300 preferably have opposite polarities. For example, when the transistor 2200 is a PMOS transistor, the transistor 2300 is preferably an NMOS transistor.

A photoelectric conversion element such as a photodiode may be provided in the semiconductor devices illustrated in FIG. 15A and FIG. 16.

The photodiode can be formed using a single crystal semiconductor or a polycrystalline semiconductor. The photodiode formed using a single crystal semiconductor or a polycrystalline semiconductor is preferable because of its high light detection sensitivity.

Figure 17A:
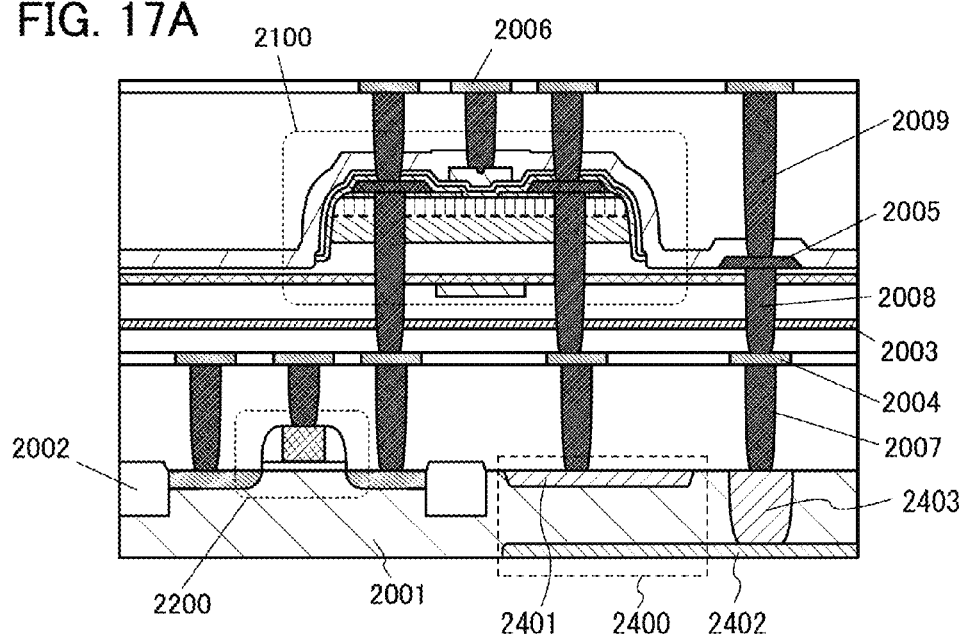
FIGS. 17A and 17B are cross-sectional views each illustrating a structure example of a semiconductor device.

FIG. 17A is a cross-sectional view of the case of providing the substrate 2001 with a photodiode 2400. The photodiode 2400 includes a conductive layer 2401 serving as one of an anode and a cathode, a conductive layer 2402 serving as the other of the anode and the cathode, and a conductive layer 2403 electrically connecting the conductive layer 2402 and the plug 2007. The conductive layers 2401 to 2403 may be formed by impurity injection to the substrate 2001.

In FIG. 17A, the photodiode 2400 is provided so that a current flows in the thickness direction of the substrate 2001; however, the photodiode 2400 may be provided so that a current flows in the lateral direction of the substrate 2001.

Figure 17B:
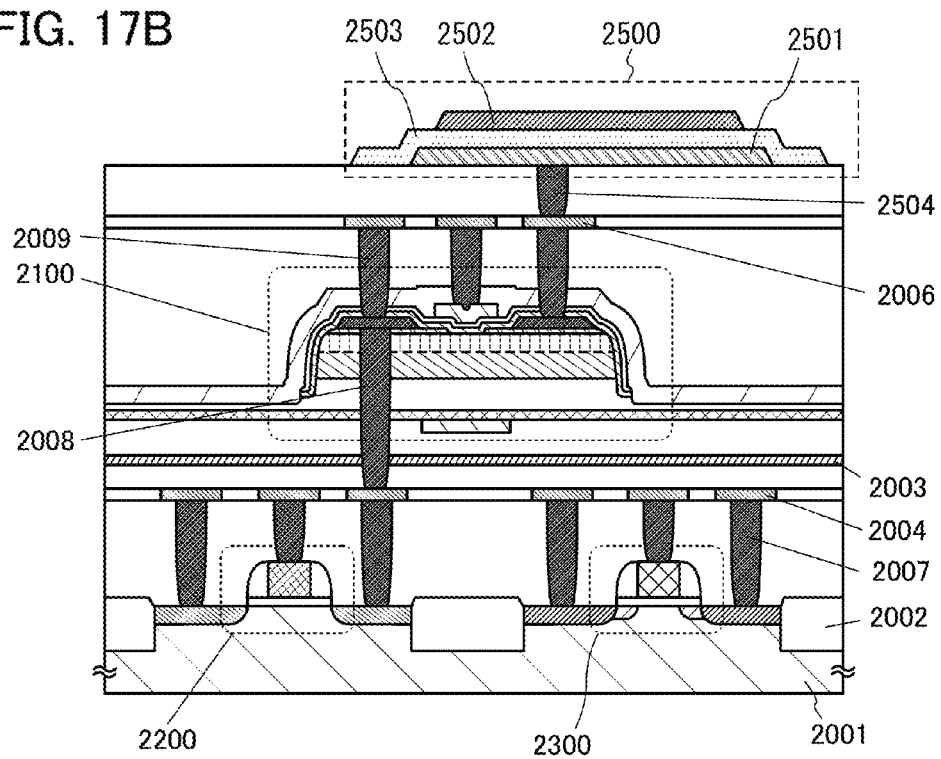

FIG. 17B is a cross-sectional view of a semiconductor device in which a photodiode 2500 is provided over the transistor 2100. The photodiode 2500 includes a conductive layer 2501 serving as one of an anode and a cathode, a conductive layer 2502 serving as the other of the anode and the cathode, and a semiconductor layer 2503. The photodiode 2500 is electrically connected to the conductive film 2006 through a plug 2504.

In FIG. 17B, the photodiode 2500 may be provided in the same tier as the transistor 2100, or in a tier between the transistor 2200 and the transistor 2100.

For the details of other components in FIGS. 17A and 17B, refer to the description for FIG. 15A and FIG. 16.

The photodiode 2400 or the photodiode 2500 may be formed using a material capable of generating charges by absorbing a radiation. Examples of the material capable of generating charges by absorbing a radiation include selenium, lead iodide, mercury iodine, gallium arsenide, CdTe, and CdZn.

The use of selenium for the photodiode 2400 or the photodiode 2500 can provide a photoelectric conversion element having a light absorption coefficient in a wide wavelength range of visible light, ultraviolet light, infrared light, X-rays, and gamma rays, for example.

When a connection between electrodes of the transistors 2100 and 2200 is changed from that illustrated in FIG. 15A, a variety of circuits can be formed. Examples of circuit configurations which can be achieved by using a semiconductor device of one embodiment of the present invention will be described below.

<CMOS Circuit>

A circuit diagram in FIG. 15B shows a configuration of what is called a CMOS circuit in which a p-channel transistor 2200 and an n-channel transistor 2100 are connected to each other in series and in which gates of them are connected to each other.

<Analog Switch>

A circuit diagram in FIG. 15C shows a configuration in which sources of the transistors 2100 and 2200 are connected to each other and drains of the transistors 2100 and 2200 are connected to each other. With such a configuration, the transistors can function as what is called an analog switch.

<Memory Device>

Figure 18A:
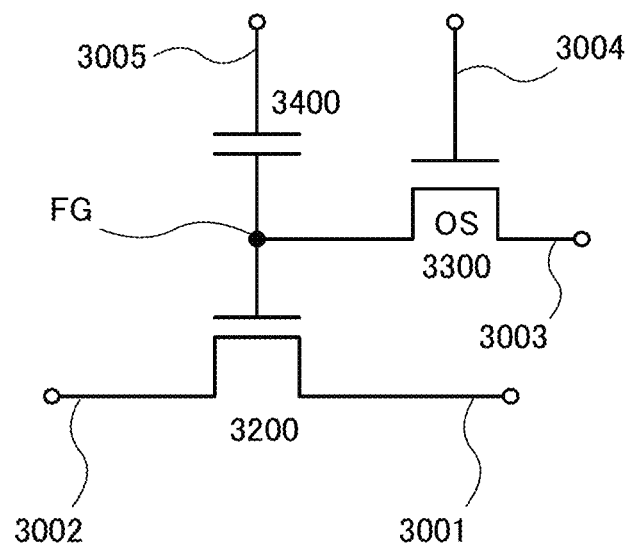
FIGS. 18A and 18B are circuit diagrams each illustrating an example of a memory device.
Figure 18B:
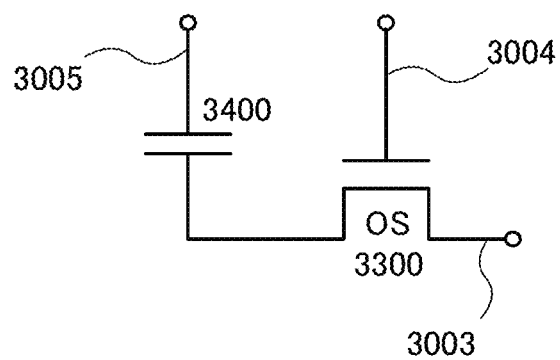

Examples of a semiconductor device (memory device) which includes the transistor of one embodiment of the present invention, which can retain stored data even when not powered, and which has an unlimited number of write cycles are shown in FIGS. 18A and 18B.

The semiconductor device illustrated in FIG. 18A includes a transistor 3200 using a first semiconductor material, a transistor 3300 using a second semiconductor material, and a capacitor 3400. Note that any of the transistors described in Embodiment 1 can be used as the transistor 3300.

The transistor 3300 is a transistor in which a channel is formed in a semiconductor layer including an oxide semiconductor. Since the off-state current of the transistor 3300 is low, stored data can be retained for a long period. In other words, power consumption can be sufficiently reduced because a semiconductor memory device in which refresh operation is unnecessary or the frequency of refresh operation is extremely low can be provided.

In FIG. 18A, a first wiring 3001 is electrically connected to a source of the transistor 3200. A second wiring 3002 is electrically connected to a drain of the transistor 3200. A third wiring 3003 is electrically connected to one of a source and a drain of the transistor 3300. A fourth wiring 3004 is electrically connected to a gate of the transistor 3300. A gate of the transistor 3200 and the other of the source and the drain of the transistor 3300 are electrically connected to a first terminal of the capacitor 3400. A fifth wiring 3005 is electrically connected to a second terminal of the capacitor 3400.

The semiconductor device in FIG. 18A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate of the transistor 3200 and the capacitor 3400. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate of the transistor 3200 is held (retaining).

Since the off-state current of the transistor 3300 is extremely low, the charge of the gate of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate of the transistor 3200. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate of the transistor 3200 can be determined. For example, in the case where the high-level charge is supplied to the gate of the transistor 3200 in writing and the potential of the fifth wiring 3005 is $V_0$ ($>V_{th\_H}$), the transistor 3200 is turned on. In the case where the low-level charge is supplied to the gate of the transistor 3200 in writing, even when the potential of the fifth wiring 3005 is $V_0$ ($<V_{th\_L}$), the transistor 3200 remains off. Thus, the data retained in the gate of the transistor 3200 can be read by determining the potential of the second wiring 3002.

Note that in the case where memory cells are arrayed, it is necessary that data of a desired memory cell be read. In the case where such reading is not performed, the fifth wiring 3005 may be supplied with a potential at which the transistor 3200 is turned off regardless of the state of the gate, that is, a potential lower than $V_{th\_H}$. Alternatively, the fifth wiring 3005 may be supplied with a potential at which the transistor 3200 is turned on regardless of the state of the gate, that is, a potential higher than $V_{th\_L}$.

The semiconductor device illustrated in FIG. 18B is different from the semiconductor device illustrated in FIG. 18A in that the transistor 3200 is not provided. Also in this case, writing and retaining operation of data can be performed in a manner similar to the above.

Next, reading of data in the semiconductor device in FIG. 18B is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the first terminal of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the first terminal of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the first terminal of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0}+C \times V_0)/(C_B+C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely low off-state current, the semiconductor device described in this embodiment can retain stored data for an extremely long time. In other words, power consumption can be sufficiently reduced because refresh operation becomes unnecessary or the frequency of refresh operation can be extremely low. Moreover, stored data can be retained for a long time even when power is not supplied (note that a potential is preferably fixed).

Furthermore, in the semiconductor device described in this embodiment, a high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating layer is not caused at all. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

The memory device described in this embodiment can also be used in an LSI such as a central processing unit (CPU), a digital signal processor (DSP), a custom LSI, or a programmable logic device (PLD), and a radio frequency (RF) tag, for example.

The structures, methods, and the like described in this embodiment can be used as appropriate in combination with any of the structures, methods, and the like described in other embodiments.

Embodiment 3

In this embodiment, a CPU in which any of the transistor described in Embodiment 1 can be used and the memory device described in Embodiment 2 is included will be described.

Figure 19:
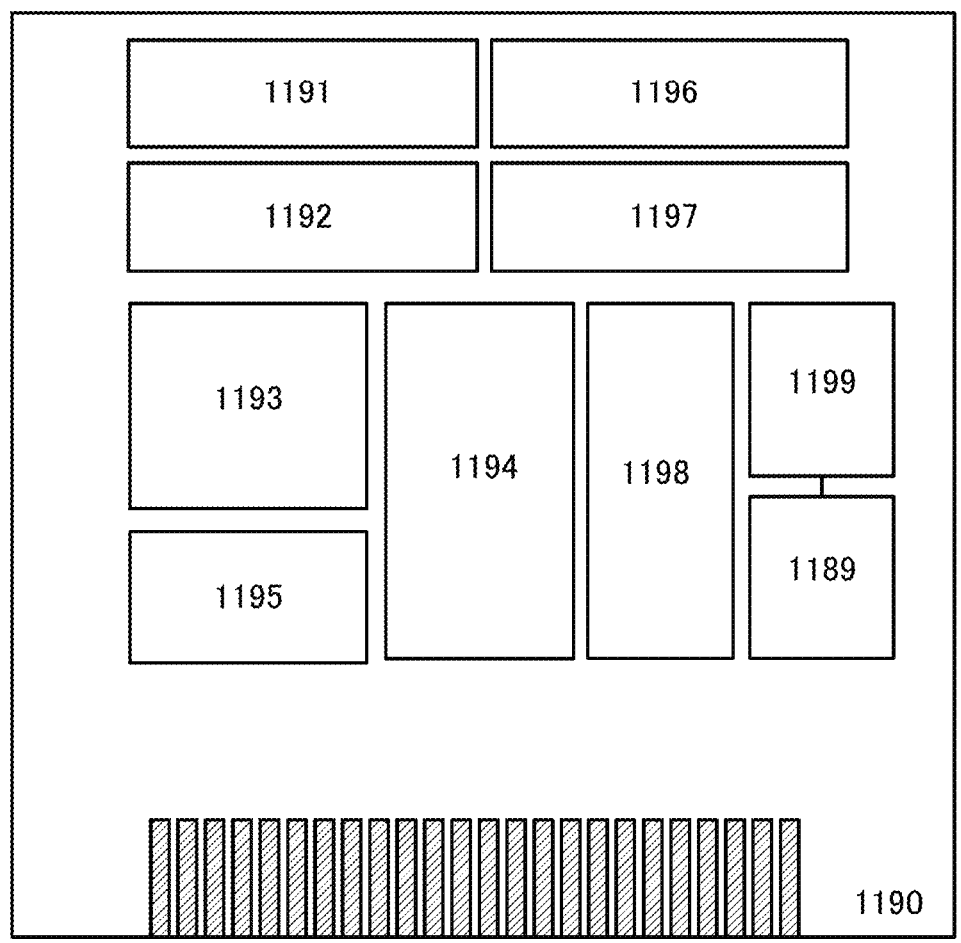
FIG. 19 is a block diagram illustrating an example of a CPU.

FIG. 19 is a block diagram illustrating a configuration example of a CPU at least partly including any of the transistors described in the above embodiments as a component.

The CPU illustrated in FIG. 19 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 19 is just an example in which the configuration is simplified, and an actual CPU may have a variety of configurations depending on the application. For example, the CPU may have the following configuration: a structure including the CPU illustrated in FIG. 19 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 19, a memory cell is provided in the register 1196. For the memory cell of the register 1196, any of the transistors described in Embodiment 1 or the memory devices described in Embodiment 2 can be used.

In the CPU illustrated in FIG. 19, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of the power supply voltage to the memory cell in the register 1196 can be stopped.

The structures, methods, and the like described in this embodiment can be used as appropriate in combination with any of the structures, methods, and the like described in other embodiments.

Embodiment 4

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 20A to 20F illustrate specific examples of these electronic devices.

Figure 20A:
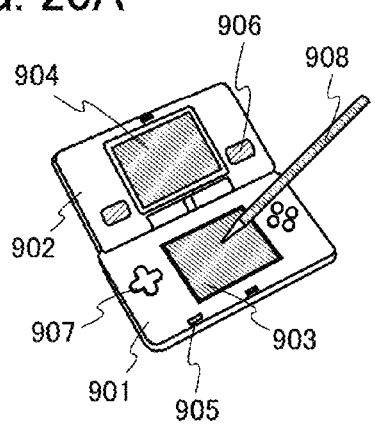
FIGS. 20A to 20F each illustrate an example of an electronic device.

FIG. 20A illustrates a portable game machine, which includes a housing 901, a housing 902, a display portion 903, a display portion 904, a microphone 905, a speaker 906, an operation key 907, a stylus 908, and the like. Although the portable game machine in FIG. 20A has the two display portions 903 and 904, the number of display portions included in a portable game machine is not limited to this.

Figure 20B:
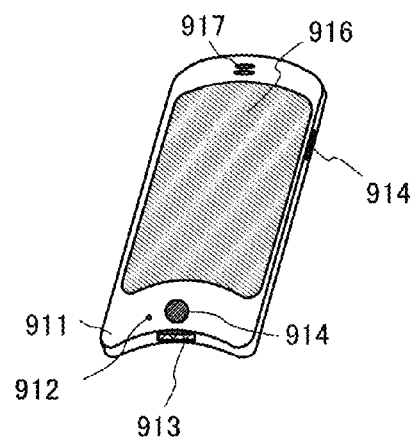

FIG. 20B illustrates a cellular phone, which is provided with a housing 911, a display portion 916, operation buttons 914, an external connection port 913, a speaker 917, a microphone 912, and the like. When the display portion 916 of the cellular phone illustrated in FIG. 20B is touched with a finger or the like, data can be input. Further, operations such as making a call and inputting a character can be performed by touch on the display portion 916 with a finger or the like. The power can be turned on or off with the operation button 914. In addition, types of images displayed on the display portion 916 can be switched; for example, switching images from a mail creation screen to a main menu screen is performed with the operation button 914.

Figure 20C:
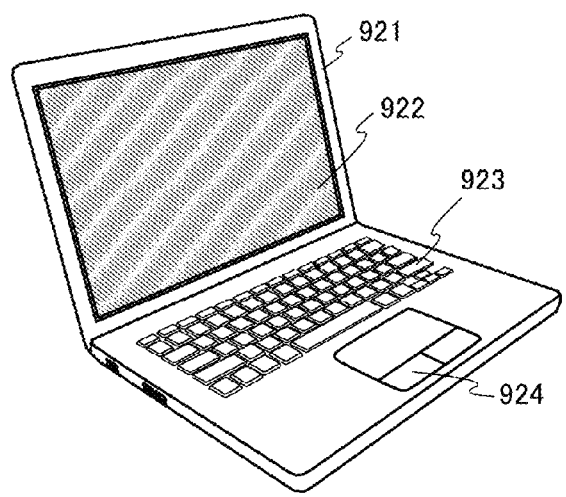

FIG. 20C illustrates a notebook personal computer, which includes a housing 921, a display portion 922, a keyboard 923, a pointing device 924, and the like.

Figure 20D:
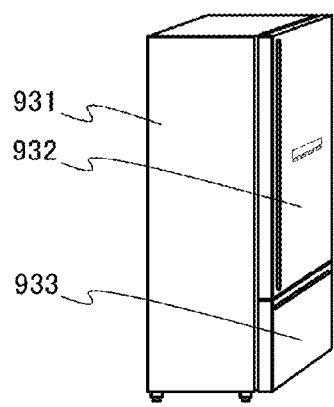

FIG. 20D illustrates an electric refrigerator-freezer, which includes a housing 931, a refrigerator door 932, a freezer door 933, and the like.

Figure 20E:
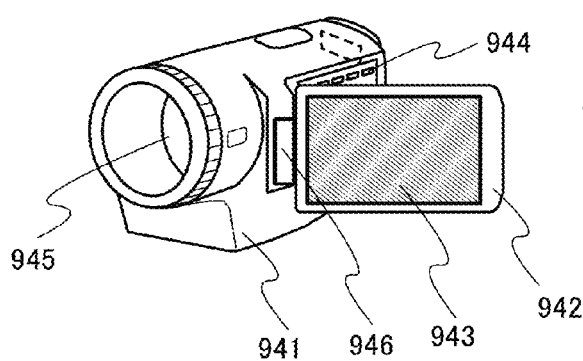

FIG. 20E illustrates a video camera, which includes a first housing 941, a second housing 942, a display portion 943, operation keys 944, a lens 945, a joint 946, and the like. The operation keys 944 and the lens 945 are provided in the first housing 941, and the display portion 943 is provided in the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 20F:
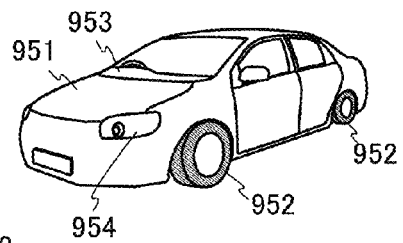
Figure 21A:
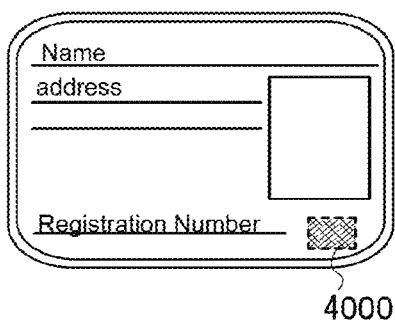
FIGS. 21A to 21F each illustrate an example of an RF tag.
Figure 21B:
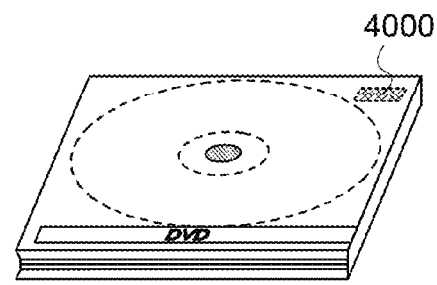
Figure 21C:
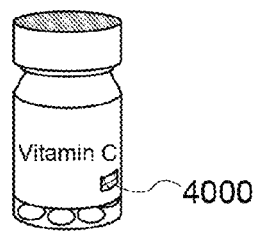
Figure 21D:
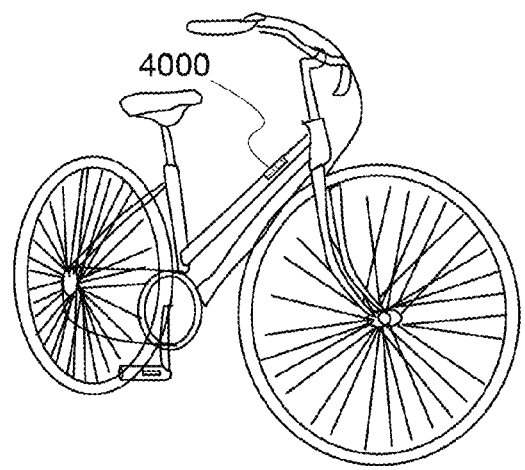
Figure 21E:
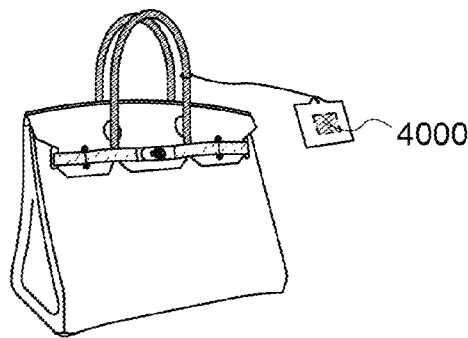
Figure 21F:
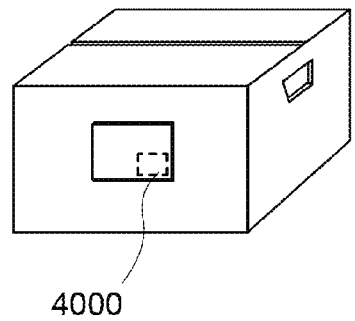

FIG. 20F illustrates a car, which includes a car body 951, wheels 952, a dashboard 953, lights 954, and the like.

Note that this embodiment can be combined with any of the other embodiments and examples in this specification as appropriate.

Embodiment 5

In this embodiment, application examples of an RF tag that can be formed using the semiconductor device of one embodiment of the present invention will be described with reference to FIGS. 21A to 21F. The RF tag is widely used and can be provided for, for example, products such as bills, coins, securities, bearer bonds, documents (e.g., driver's licenses or resident's cards, see FIG. 21A), recording media (e.g., DVDs or video tapes, see FIG. 21B), packaging containers (e.g., wrapping paper or bottles, see FIG. 21C), vehicles (e.g., bicycles, see FIG. 21D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 21E and 21F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Next, an example of use of a display device which can include the semiconductor device of one embodiment of the present invention will be described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be employed, for example.

In this specification and the like, for example, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on a current), an electron emitter, a liquid crystal element, electronic ink, an electrophoretic element, a grating light valve (GLV), a plasma display panel (PDP), a display element using a micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by electrical or magnetic effect may be included. Examples of a display device including an EL element include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or an electrophoretic element include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that this embodiment can be combined with any of the other embodiments and examples in this specification as appropriate.

Embodiment 6

In this embodiment, a structure of an oxide semiconductor film applicable to the semiconductor 662 will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

<Structure of Oxide Semiconductor>

The structure of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS will be described.

The CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 22A:
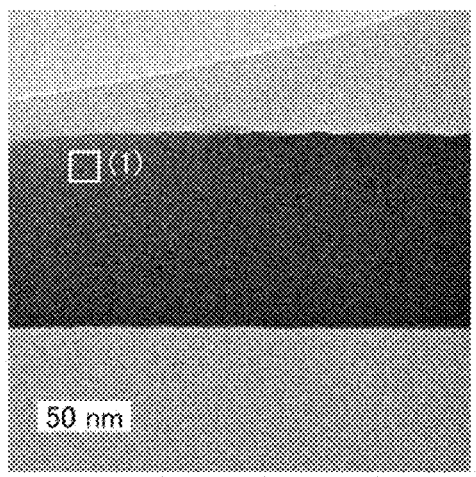
FIGS. 22A to 22D are Cs-corrected high-resolution TEM images of a cross section of a CAAC-OS and a schematic cross-sectional view of a CAAC-OS.

A CAAC-OS observed with TEM will be described below. FIG. 22A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 22B:
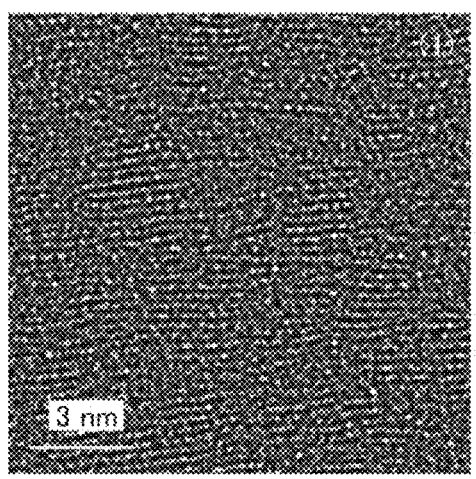

FIG. 22B is an enlarged Cs-corrected high-resolution TEM image of a region (1) in FIG. 22A. FIG. 22B shows that metal atoms are arranged in a layered manner in a pellet. Each metal atom layer has a configuration reflecting unevenness of a surface over which a CAAC-OS film is formed (hereinafter, the surface is referred to as a formation surface) or a top surface of the CAAC-OS film, and is arranged parallel to the formation surface or the top surface of the CAAC-OS film.

Figure 22C:
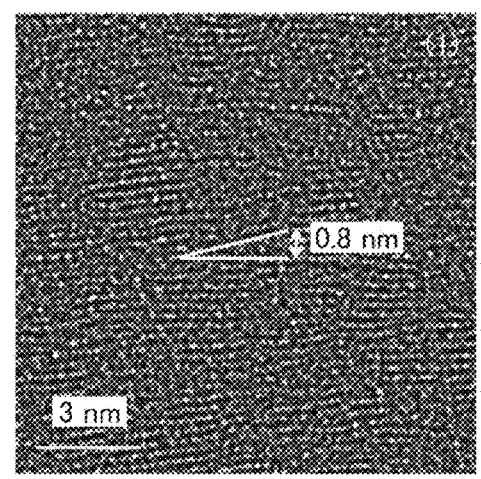

As shown in FIG. 22B, the CAAC-OS has a characteristic atomic arrangement. The characteristic atomic arrangement is denoted by an auxiliary line in FIG. 22C. FIGS. 22B and 22C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 22D:
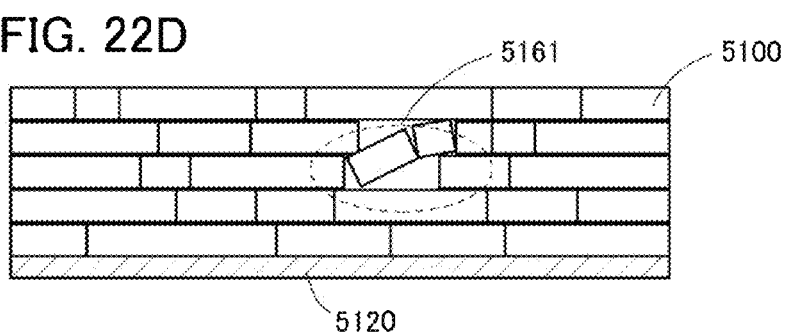

Here, according to the Cs-corrected high-resolution TEM images, the schematic arrangement of pellets 5100 of a CAAC-OS over a substrate 5120 is illustrated by such a structure in which bricks or blocks are stacked (see FIG. 22D). The part in which the pellets are tilted as observed in FIG. 22C corresponds to a region 5161 shown in FIG. 22D.

FIG. 23A shows a Cs-corrected high-resolution TEM image of a plane of the CAAC-OS observed from a direction substantially perpendicular to the sample surface. FIGS. 23B, 23C, and 23D are enlarged Cs-corrected high-resolution TEM images of regions (1), (2), and (3) in FIG. 23A, respectively. FIGS. 23B, 23C, and 23D indicate that metal atoms are arranged in a triangular, quadrangular, or hexagonal configuration in a pellet. However, there is no regularity of arrangement of metal atoms between different pellets.

Figure 24A:
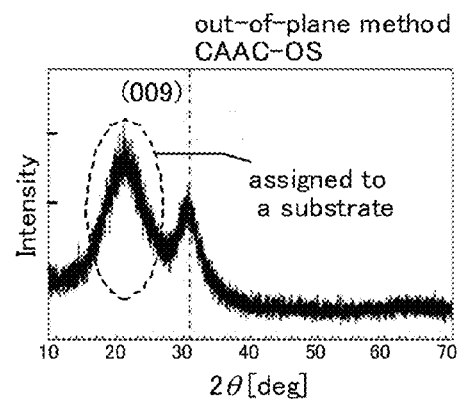
FIGS. 24A to 24C show structural analysis of a CAAC-OS and a single crystal oxide semiconductor by XRD.

Next, a CAAC-OS analyzed by X-ray diffraction (XRD) will be described. For example, when the structure of a CAAC-OS including an $InGaZnO_4$ crystal is analyzed by an out-of-plane method, a peak appears at a diffraction angle (2θ) of around 31° as shown in FIG. 24A. This peak is attributed to the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 24B:
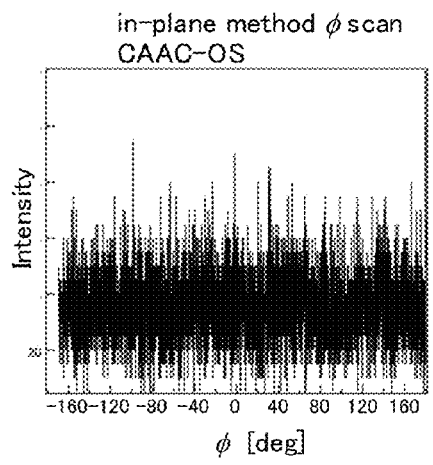
Figure 24C:
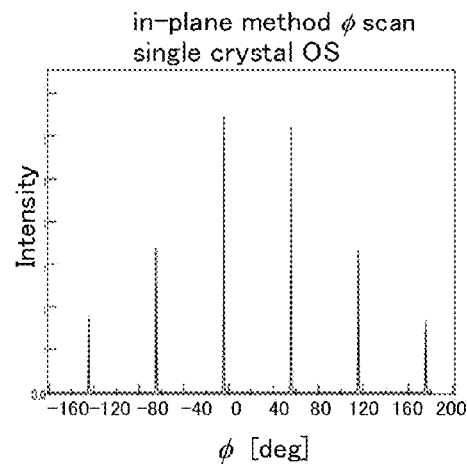

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 24B, a peak is not clearly observed. In contrast, in the case of a single crystal oxide semiconductor of InGaZnO$_4$, when φ scan is performed with 2θ fixed at around 56°, as shown in FIG. 24C, six peaks which are attributed to crystal planes equivalent to the (110) plane are observed. Accordingly, the structural analysis using XRD shows that the directions of a-axes and b-axes are irregularly oriented in the CAAC-OS.

Figure 25A:
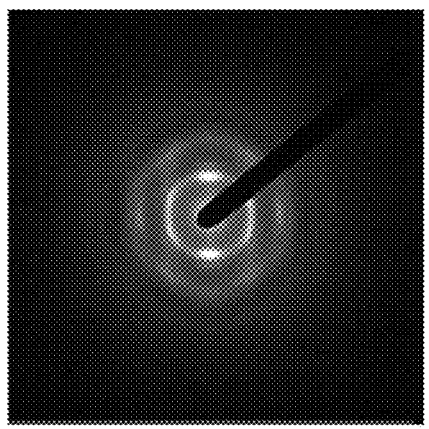
FIGS. 25A and 25B show electron diffraction patterns of a CAAC-OS.
Figure 25B:
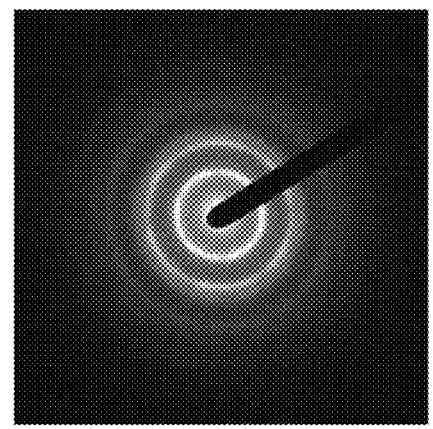

Next, a CAAC-OS analyzed by electron diffraction will be described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 25A can be obtained. In this diffraction pattern, spots attributed to the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 25B shows a diffraction pattern obtained in such a manner that an electron beam with a probe diameter of 300 nm is incident on the same sample in a direction perpendicular to the sample surface. As shown in FIG. 25B, a ring-like diffraction pattern is observed. Thus, the electron diffraction also indicates that the a-axes and b-axes of the pellets included in the CAAC-OS do not have regular alignment. The first ring in FIG. 25B is considered to be attributed to the (010) plane, the (100) plane, and the like of the InGaZnO$_4$ crystal. The second ring in FIG. 25B is considered to be attributed to the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. Furthermore, oxygen vacancy in the oxide semiconductor might serve as a carrier trap or serve as a carrier generation source when hydrogen is captured therein.

The CAAC-OS having small amounts of impurities and oxygen vacancy is an oxide semiconductor film with low carrier density. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, bright regions in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 26:
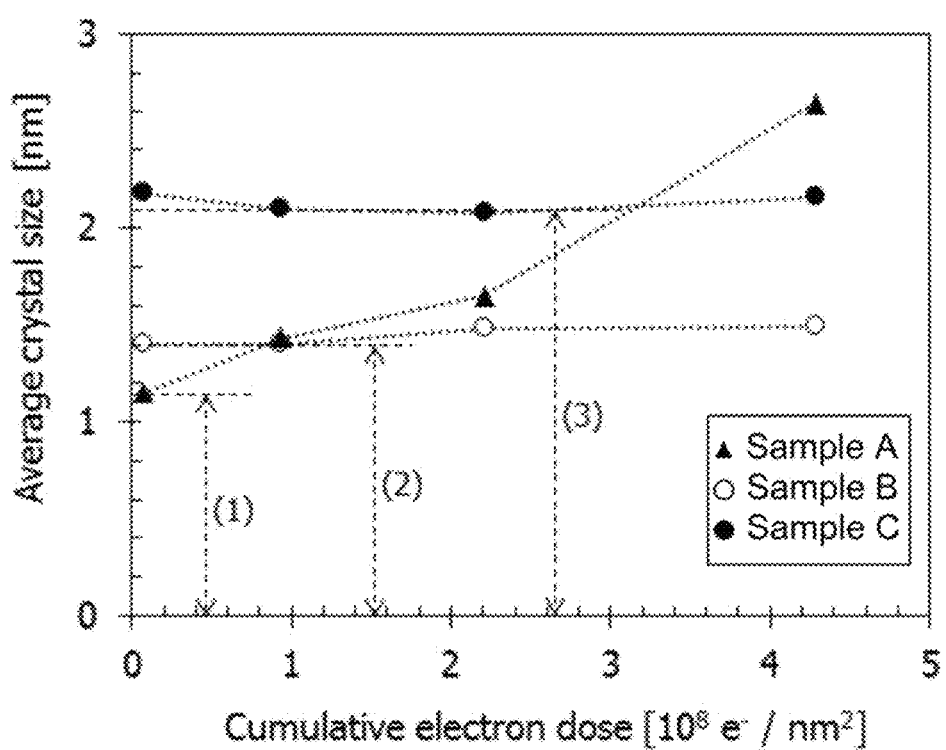
FIG. 26 shows changes in crystal parts of an In—Ga—Zn oxide induced by electron irradiation.

FIG. 26 shows change in the average size of crystal parts (at 22 points to 45 points) in each sample. Note that the crystal part size corresponds to the length of a lattice fringe. FIG. 26 indicates that the crystal part size in the a-like OS increases with an increase in the cumulative electron dose. Specifically, as shown by (1) in FIG. 26, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 26, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Deposition Model>

Examples of deposition models of a CAAC-OS and an nc-OS are described below.

Figure 27A:
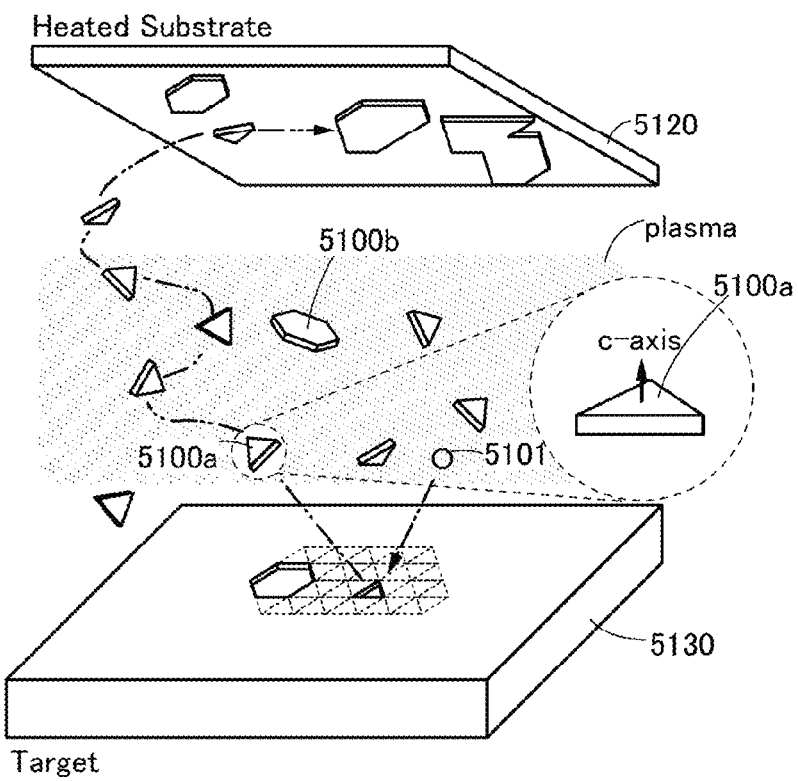
FIGS. 27A and 27B are schematic diagrams illustrating deposition models of a CAAC-OS and an nc-OS.

FIG. 27A is a schematic view of the inside of a deposition chamber where a CAAC-OS is deposited by a sputtering method.

A target 5130 is attached to a backing plate. A plurality of magnets is provided to face the target 5130 with the backing plate positioned therebetween. The plurality of magnets generates a magnetic field. A sputtering method in which the disposition rate is increased by utilizing a magnetic field of magnets is referred to as a magnetron sputtering method.

A substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a constant value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation (O$^+$) and an argon cation (Ar$^+$).

Figure 28A:
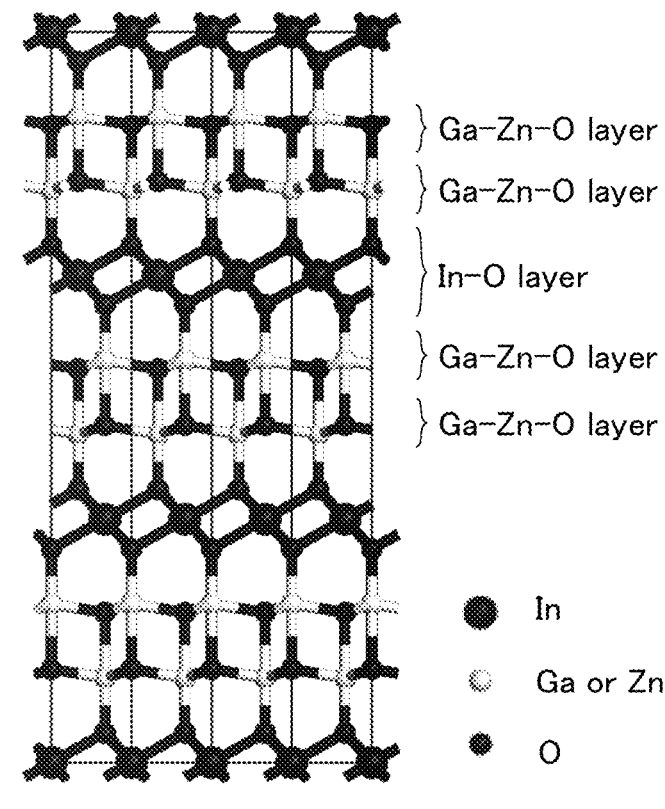
FIGS. 28A to 28C show an $InGaZnO_4$ crystal and a pellet.

Here, the target 5130 has a polycrystalline structure which includes a plurality of crystal grains and in which a cleavage plane exists in at least one crystal grain. FIG. 28A shows a structure of an InGaZnO$_4$ crystal included in the target 5130 as an example. Note that FIG. 28A shows a structure of the case where the InGaZnO$_4$ crystal is observed from a direction parallel to the b-axis. FIG. 28A indicates that oxygen atoms in a Ga—Zn—O layer are positioned close to those in an adjacent Ga—Zn—O layer. The oxygen atoms have negative charge, whereby repulsive force is generated between the two Ga—Zn—O layers. As a result, the InGaZnO$_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 28B:
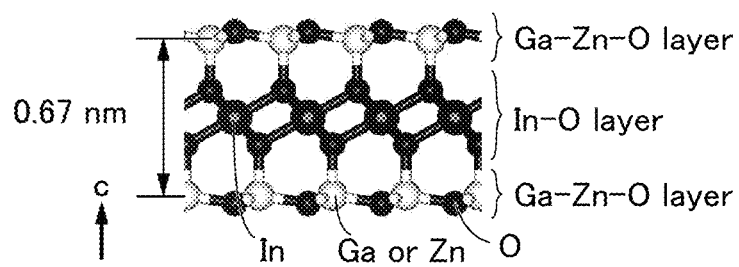
Figure 28C:
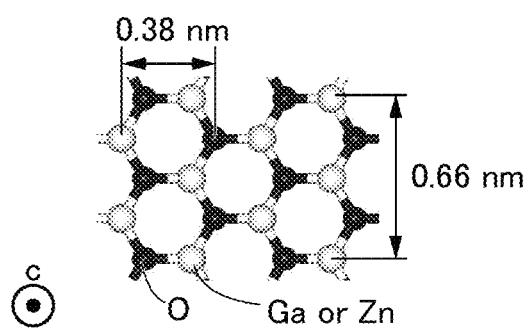

The thickness of the pellet 5100 is determined depending on the kind of deposition gas and the like. The thicknesses of the pellets 5100 are preferably uniform; the reasons thereof are described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 26. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 28B is separated. Note that FIG. 28C shows the structure of the separated pellet 5100 which is observed from a direction parallel to the c-axis. The pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. In the pellet 5100, an oxygen atom positioned on its side surface may be negatively charged. In this manner, when the side surfaces are charged with the same polarity, charges repel each other, and accordingly, the pellet 5100 can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 26 corresponds to the amount of growth in plasma. Here, in the case where the temperature of the substrate 5120 is at around room temperature, the pellet 5100 on the substrate 5120 hardly grows; thus, an nc-OS is formed (see FIG. 27B). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 27B:
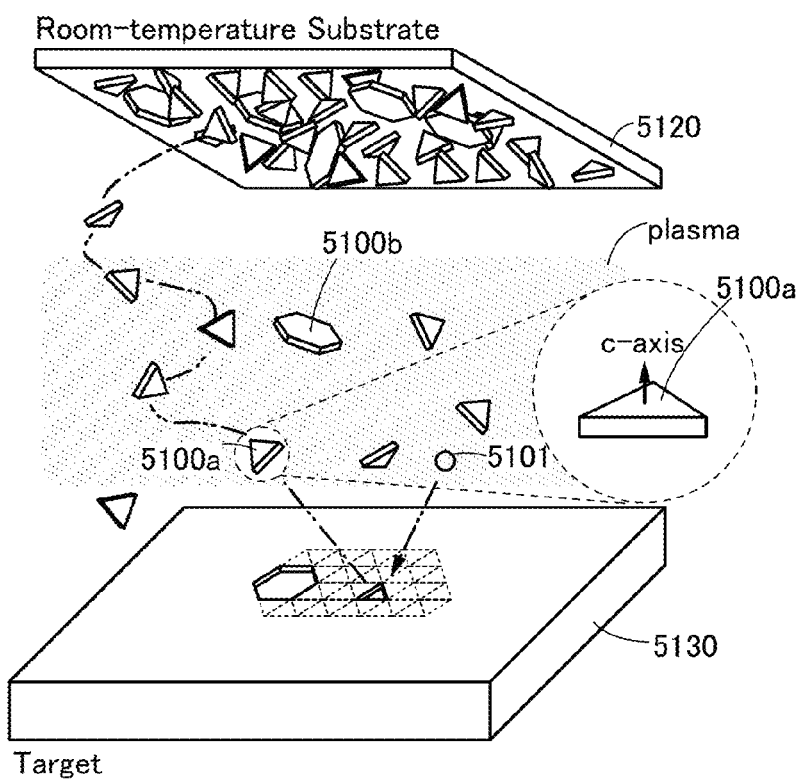

As shown in FIGS. 27A and 27B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, a current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and a current. In order to apply a sufficient force to the pellet 5100 so that the pellet 5100 moves over a top surface of the substrate 5120, it is preferable to provide, on the top surface of the substrate 5120, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface of the substrate 5120, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 27A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where the flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancy in a CAAC-OS is filled in some cases; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet 5100 and thus reaches the top surface of the substrate 5120 before the pellet 5100. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 29A to 29D are cross-sectional schematic views.

Figure 29A:
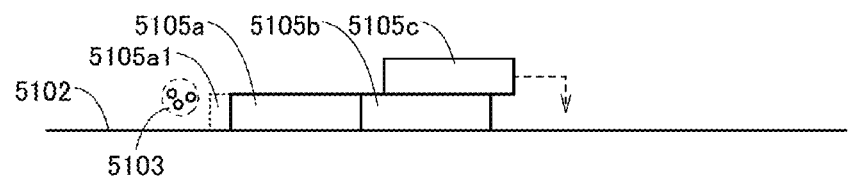
FIGS. 29A to 29D are schematic diagrams illustrating a deposition model of a CAAC-OS.

As illustrated in FIG. 29A, a pellet 5105$a$ and a pellet 5105$b$ are deposited over the zinc oxide layer 5102. Here, side surfaces of the pellet 5105$a$ and the pellet 5105$b$ are in contact with each other. In addition, a pellet 5105$c$ is deposited over the pellet 5105$b$, and then glides over the pellet 5105$b$. Furthermore, a plurality of particles 5103 separated from the target together with the zinc oxide is crystallized by heating of the substrate 5120 to form a region 5105$a1$ on another side surface of the pellet 5105$a$. Note that the plurality of particles 5103 may contain oxygen, zinc, indium, gallium, or the like.

Figure 29B:
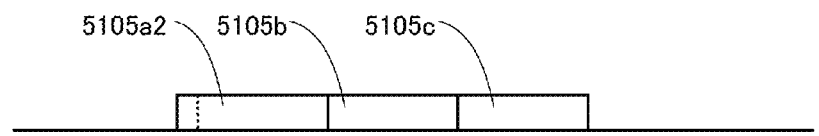

Then, as illustrated in FIG. 29B, the region 5105$a1$ grows to part of the pellet 5105$a$ to form a pellet 5105$a2$. In addition, a side surface of the pellet 5105$c$ is in contact with another side surface of the pellet 5105$b$.

Figure 29C:
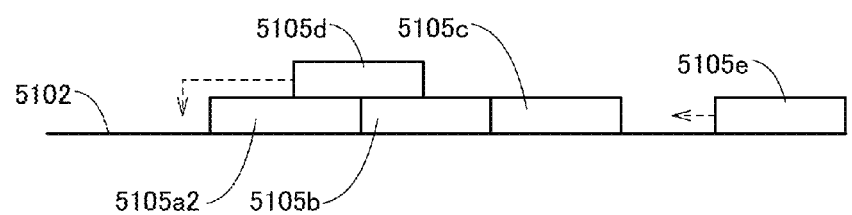

Next, as illustrated in FIG. 29C, a pellet 5105$d$ is deposited over the pellet 5105$a2$ and the pellet 5105$b$, and then glides over the pellet 5105$a2$ and the pellet 5105$b$. Furthermore, a pellet 5105$e$ glides toward another side surface of the pellet 5105$c$ over the zinc oxide layer 5102.

Figure 29D:
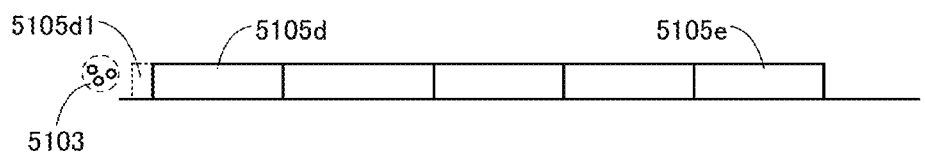

Then, as illustrated in FIG. 29D, the pellet 5105$d$ is placed so that a side surface of the pellet 5105$d$ is in contact with a side surface of the pellet 5105$a2$. Furthermore, a side surface of the pellet 5105$e$ is in contact with another side surface of the pellet 5105$c$. A plurality of particles 5103 separated from the target 5130 together with the zinc oxide is crystallized by heating of the substrate 5120 to form a region 5105$d1$ on another side surface of the pellet 5105$d$.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 26 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. Therefore, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure; therefore, a growth mechanism in this case is different from epitaxial growth. In addition, laser crystallization is not needed for formation of a CAAC-OS, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between in the pellets 5100 in the CAAC-OS in some cases. Note that owing to intermolecular force, the pellets 5100 are arranged so that a gap between the pellets is as small as possible even on the unevenness surface. Therefore, even when the formation surface has unevenness, a CAAC-OS with high crystallinity can be formed.

Since a CAAC-OS is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

Example 1

In this example, the electric characteristics and the like of the oxide semiconductor transistor (OS transistor) described in Embodiment 1 were calculated by device simulation.

Figure 30A:
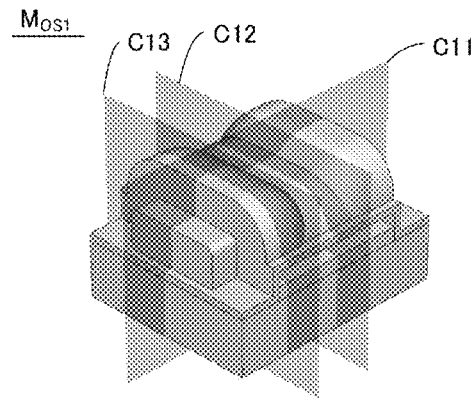
FIGS. 30A to 30D illustrate a device structure of an oxide semiconductor transistor calculated by device simulation.
Figure 30B:
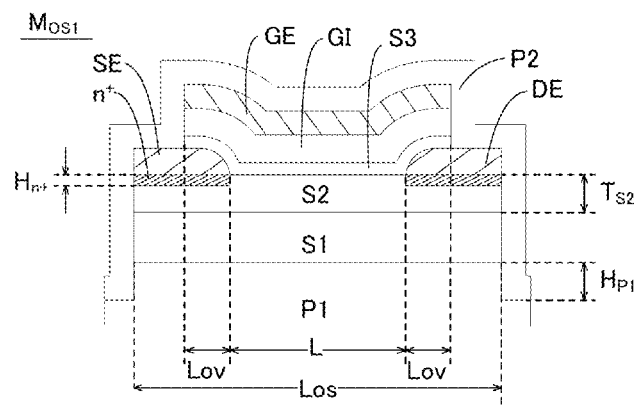
Figure 30C:
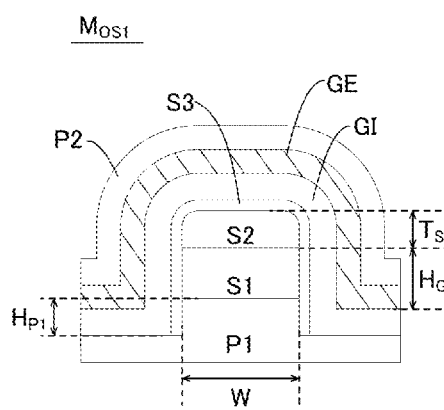
Figure 30D:
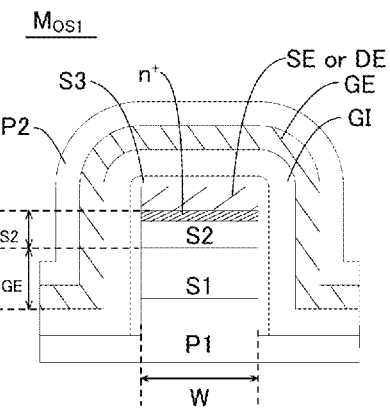

The electric characteristics and the like of a 3D transistor were calculated by device simulation software Sentaurus Device (Synopsys, Inc.). FIGS. 30A to 30D illustrate a structure of the transistor. Here, the transistor used for the calculation is referred to as a transistor $M_{OS1}$. FIG. 30A is a schematic view of the transistor $M_{OS1}$. FIG. 30B, FIG. 30C, and FIG. 30D are cross-sectional views taken along a plane C11, a plane C12, and a plane C13 in FIG. 30A, respectively. Specifically, FIG. 30B is a cross-sectional view of the transistor $M_{OS1}$ in a channel length direction, FIG. 30C is a cross-sectional view of the transistor $M_{OS1}$ in a channel width direction, and FIG. 30D is a cross-sectional view of the transistor $M_{OS1}$ in the channel width direction, which illustrates a portion including a source electrode or a drain electrode. As illustrated in FIGS. 30A to 30D, the transistor $M_{OS1}$ has an s-channel structure and includes an oxide semiconductor film with a three-layer structure.

Note that "GE", "SE", "DE", and "GI" are a gate electrode, the source electrode, the drain electrode, and a gate insulating layer, respectively. A layer P1 and a layer P2 are insulating layers. The layer P1 is a base insulating layer of the transistor $M_{OS1}$, and a layer S1 is provided on a protrusion of the layer P1. Here, "$H_{P1}$" represents the height of the protrusion. The layer S1, a layer S2, and a layer S3 are oxide semiconductor layers which form an island of the transistor $M_{OS1}$. In regions of the layer S2 which overlap with the source electrode and the drain electrode, regions (n+) having high donor density are formed. Note that "$H_{n+}$" represents the thickness of the region n+.

Note that "L" is the channel length, which is the distance between an end portion of the source electrode and an end portion of the drain electrode, and "W" is the channel width. Furthermore, "$L_{OS}$" represents the length in the channel length direction of the island, specifically the length of the layer S1, and "$L_{OV}$" represents the length in the channel length direction of a region where the gate electrode overlaps with the source electrode or the drain electrode. Moreover, "$H_{GE}$" represents the length of a region of the gate electrode which extends in the depth direction below the bottom surface of the layer S2. The transistor $M_{OS1}$ having a positive $H_{GE}$ value can be regarded as having the s-channel structure. In the example in FIGS. 30A to 30D, $H_{GE}$ corresponds to a value obtained by subtracting the thickness of the gate insulating layer GI from the sum of $H_{P1}$ and the thickness of the layer S1.

The following table shows conditions used for the calculation.

TABLE 1

| Transistor | Channel Length L | 60 nm |
|---|---|---|
| | Los | 140 nm |
| | Lov | 20 nm |
| | Channel Width W | 40, 60, 80 nm |
| | $H_{P1}$ | 15 nm |
| | $H_{GE}$ | 25 nm |
| | $H_{n+}$ | 1 nm |
| GI | Relative Dielectric Constant | 4.1 |
| | Thickness | 10 nm |
| S3 | Composition | In:Ga:Zn = 1:3:2 |
| | Electron Affinity | 4.3 eV |
| | Band Gap $E_g$ | 3.7 eV |
| | Relative Dielectric Constant | 15 |
| | Donor Density | $6.60 \times 10^{-9}$ cm$^{-3}$ |
| | Electron Mobility | 0.1 cm$^2$/Vs |
| | Hole Mobility | 0.01 cm$^2$/Vs |
| | Effective Density of States Nc in Conduction Band | $5.00 \times 10^{18}$ cm$^{-3}$ |
| | Effective Density of States Nv in Valence Band | $5.00 \times 10^{18}$ cm$^{-3}$ |
| | Thickness | 5 nm |

TABLE 1-continued

| S2 | Composition | In:Ga:Zn = 1:1:1 |
|---|---|---|
| | Electron Affinity | 4.6 eV |
| | Band Gap $E_g$ | 3.2 eV |
| | Relative Dielectric Constant | 15 |
| | Donor Density | $6.60 \times 10^{-9}$ cm$^{-3}$ |
| | Donor Density (n+ Region) | $5.00 \times 10^{18}$ cm$^{-3}$ |
| | Electron Mobility | 10 cm$^2$/Vs |
| | Hole Mobility | 0.01 cm$^2$/Vs |
| | Effective Density of States Nc in Conduction Band | $5.00 \times 10^{18}$ cm$^{-3}$ |
| | Effective Density of States Nv in Valence Band | $5.00 \times 10^{18}$ cm$^{-3}$ |
| | Thickness $T_{S2}$ | 3, 5, 8, 10, 15 nm |
| S1 | Composition | In:Ga:Zn = 1:3:2 |
| | Thickness | 20 nm |
| P1 | Relative Dielectric Constant | 4.1 |
| | Thickness | 400 nm |
| P2 | Relative Dielectric Constant | 4.1 |
| | Thickness | 10 nm |
| GE | Work Function | 5 eV |
| SE | Work Function | 4.6 eV |
| DE | Thickness | 10 nm |

The dependences of the $V_d$-$I_d$ characteristics of the transistor $M_{OS1}$ and the electron density distribution of the layer S2 on the thickness of the layer S2 ($T_{S2}$) were calculated for verification.

Figure 31:
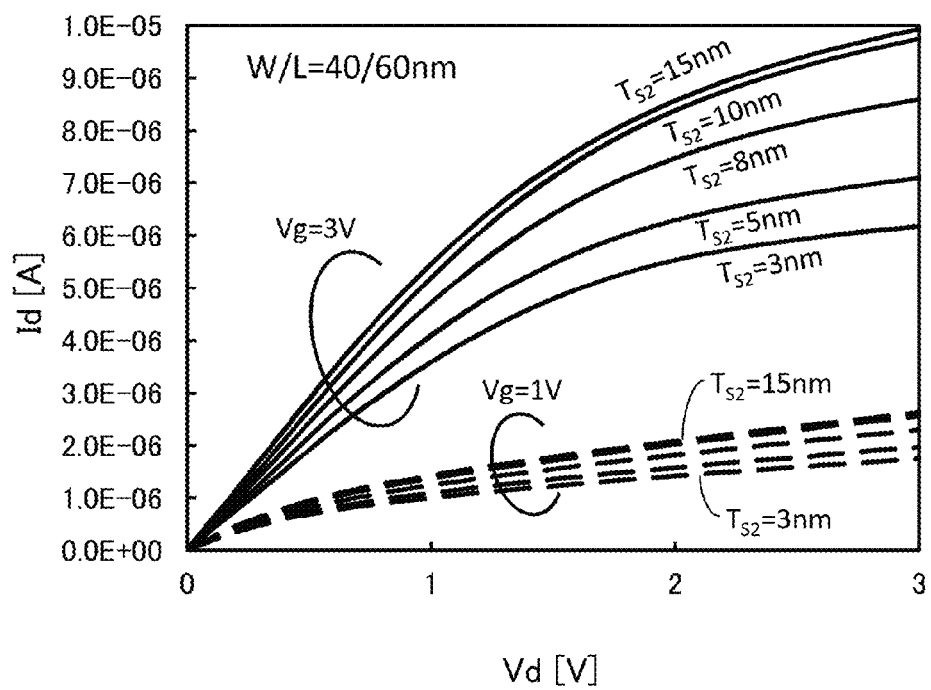
FIG. 31 shows dependence of $V_d$-$I_d$ characteristics on the thickness of an oxide semiconductor layer obtained by device simulation.

FIG. 31 shows the calculation results of the $V_d$-$I_d$ characteristics with varying thicknesses $T_{S2}$. The $V_d$-$I_d$ characteristics were calculated under a channel width W of 40 nm, a channel length L of 60 nm, and $T_{S2}$ of 3 nm, 5 nm, 8 nm, 10 nm, and 15 nm. The $V_d$-$I_d$ characteristics were calculated at gate voltages $V_g$ of 1 V and 3 V for each value of $T_{S2}$.

In addition, a channel length modulation coefficient ($\lambda$) for each case was calculated by the $V_d$-$I_d$ characteristics shown in FIG. 31 using Formula (1) below (Table 2). Specifically, $\lambda$ was calculated as follows: $\delta I_d/\delta V_d$ was calculated from the amount of change in drain current between $V_d$ of 2.8 V and 3.0 V and multiplied by the reciprocal of a drain current (1/$I_d$) at $V_d$ of 2.9 V. The smaller the value of $\lambda$ is, the smaller the effect of the channel length modulation effect is, leading to favorable saturation characteristics in the $V_d$-$I_d$ characteristics.

$$\lambda = \delta I_d/\delta V_d \times 1/I_d \tag{1}$$

TABLE 2

| | $T_{S2}$ (nm) | | | | |
|---|---|---|---|---|---|
| | 15 | 10 | 8 | 5 | 3 |
| $\lambda$ (Vg = 3 V) | 0.10 | 0.10 | 0.10 | 0.08 | 0.07 |
| $\lambda$ (Vg = 1 V) | 0.20 | 0.21 | 0.20 | 0.19 | 0.18 |

The results in FIG. 31 and Table 2 show that the saturation characteristics of the transistor $M_{OS1}$ are improved as the layer S2 becomes thinner. Note that $\lambda$ is reduced and the saturation characteristics are improved particularly when $T_{S2}$ is less than 8 nm.

Figure 32A:
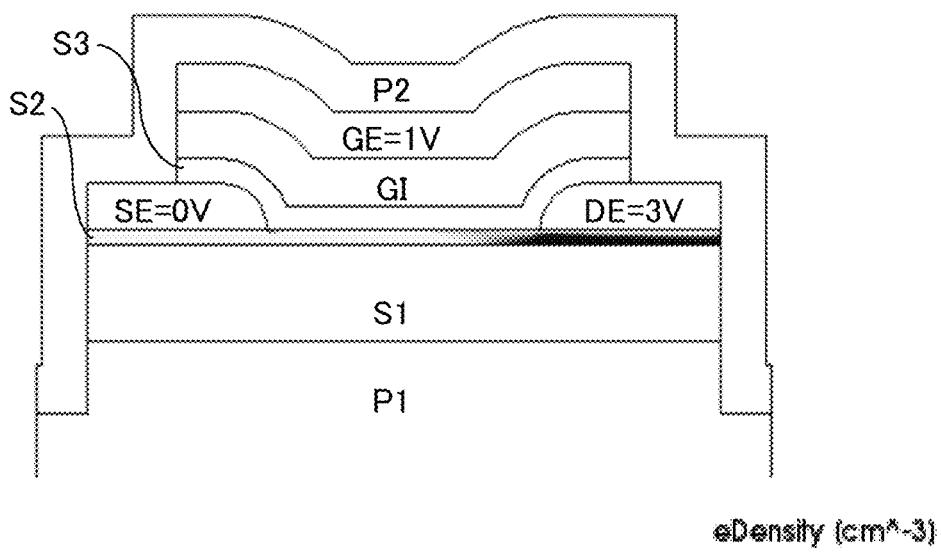
FIGS. 32A and 32B each show electron density distribution of an oxide semiconductor layer in a channel length direction obtained by device simulation.
Figure 32B:
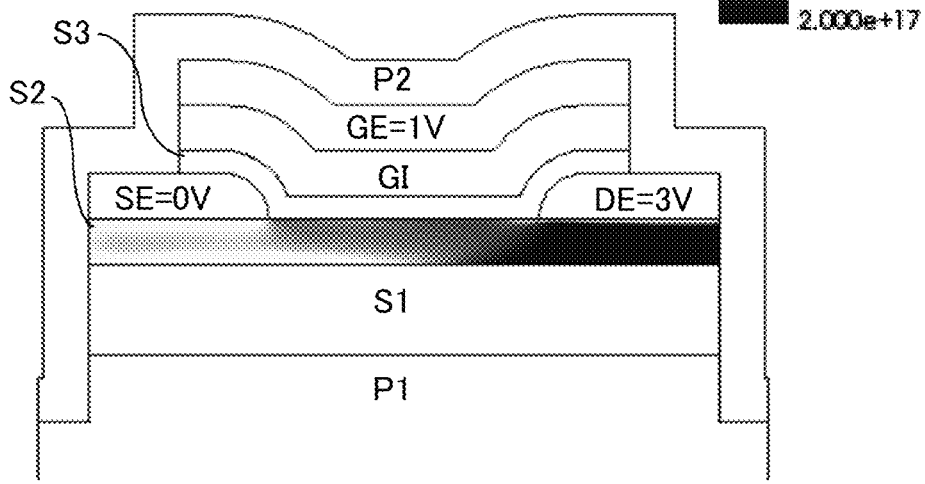

To determine the causes of the dependence of the $V_d$-$I_d$ characteristics on the thickness $T_{S2}$, the electron density distribution of the layer S2 in the channel length direction was calculated at a gate voltage of 1 V, a source voltage of 0 V, and a drain voltage of 3 V. The electron density distribution of the layer S2 was calculated for each of the cases with the thicknesses $T_{S2}$ of 3 nm and 10 nm. FIGS. 32A and 32B show calculation results. FIG. 32A shows electron density with $T_{S2}$ of 3 nm and FIG. 32B shows electron density with $T_{S2}$ of 10 nm. Note that FIGS. 32A and 32B show the electron density of only the layer S2.

As shown in FIGS. 32A and 32B, the electron density at a drain edge is higher in the thin layer S2 and the electron density at a deep portion of a channel is lower in the thick layer S2. This means that FIGS. 32A and 32B show that as the layer S2 becomes thinner, a pinch-off point is less likely to be in a channel and an effect of a drain electric field on the channel becomes smaller. This is one cause of the dependence of the $V_d$-$I_d$ characteristics of the transistor $M_{OS1}$ on the thickness of the layer S2. Thus, the effect of the channel length modulation can be reduced as the layer S2 becomes thinner, leading to an improvement in saturation characteristics of the transistor $M_{OS1}$.

Figure 33:
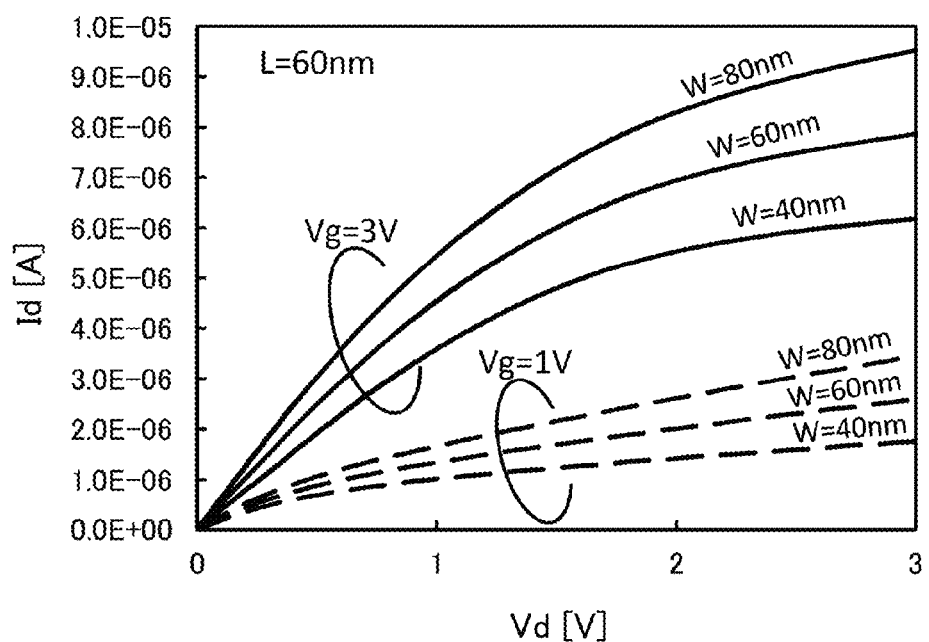
FIG. 33 shows dependence of $V_d$-$I_d$ characteristics on a channel width obtained by device simulation.

FIG. 33 shows the calculation results of the $V_d$-$I_d$ characteristics with varying channel widths W. The $V_d$-$I_d$ characteristics were calculated under a channel length L of 60 nm, a thickness $T_{S2}$ of the layer S2 of 3 nm, and W of 40 nm, 60 nm, and 80 nm. The $V_d$-$I_d$ characteristics were calculated at gate voltages $V_g$ of 1 V and 3 V for each value of W.

In addition, a channel length modulation coefficient (λ) for each case was calculated by the $V_d$-$I_d$ characteristics shown in FIG. 33 (Table 3). Note that calculation for λ in Table 3 was performed by the same method as that in Table 2.

TABLE 3

| | W (nm) | | |
|---|---|---|---|
| | 80 | 60 | 40 |
| λ (Vg = 3 V) | 0.10 | 0.09 | 0.07 |
| λ (Vg = 1 V) | 0.24 | 0.22 | 0.18 |

FIG. 33 and Table 3 show that the saturation characteristics are improved as the channel width W becomes smaller. This is because a reduction in the channel width increases carrier controllability of a gate potential at a side surface of the channel and reduces the effect of the drain electric field on the channel, for example. Note that λ is reduced and the saturation characteristics are improved particularly when the channel width is less than 60 nm.

Figure 34A:
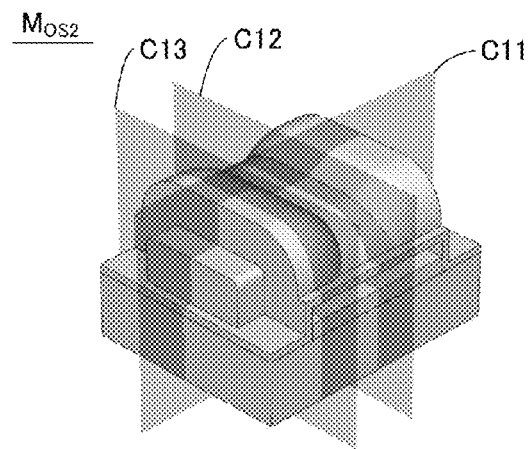
FIGS. 34A to 34D illustrate a device structure of an oxide semiconductor transistor calculated by device simulation.
Figure 34B:
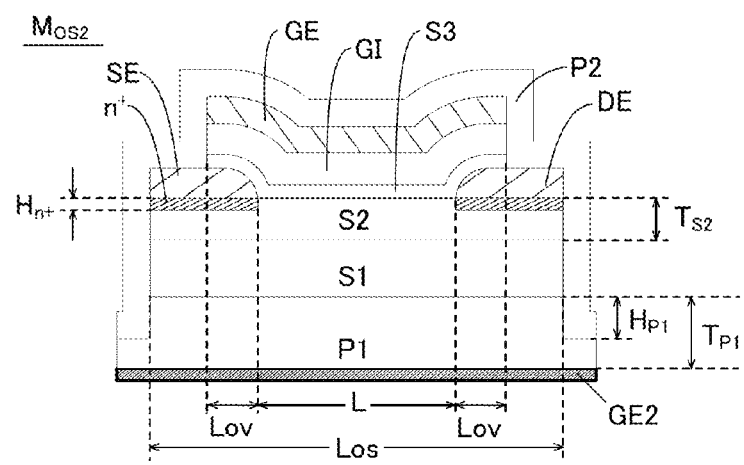
Figure 34C:
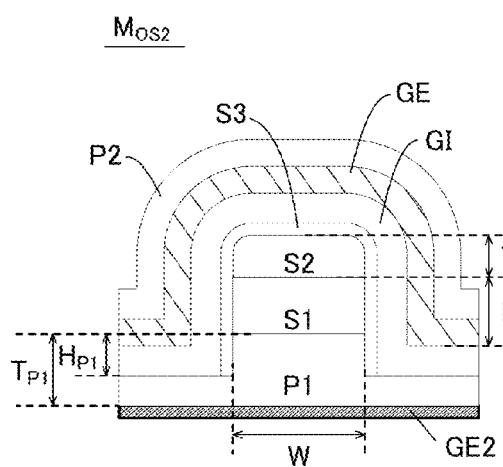
Figure 34D:
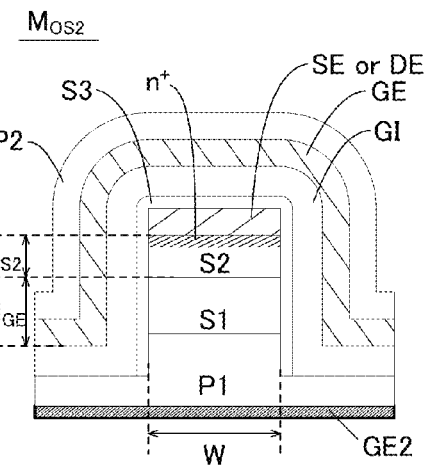

Next, a transistor $M_{OS2}$ illustrated in FIGS. 34A to 34D was assumed for calculation. FIG. 34A is a schematic view of the transistor $M_{OS2}$. FIG. 34B, FIG. 34C, and FIG. 34D are cross-sectional views taken along a plane C11, a plane C12, and a plane C13 in FIG. 34A, respectively. Specifically, FIG. 34B is a cross-sectional view of the transistor $M_{OS2}$ in a channel length direction, FIG. 34C is a cross-sectional view of the transistor $M_{OS2}$ in a channel width direction, and FIG. 34D is a cross-sectional view of the transistor $M_{OS2}$ in the channel width direction, which illustrates a portion including a source electrode or a drain electrode.

The transistor $M_{OS2}$ is different from the transistor $M_{OS1}$ in that GE2 serving as a second gate electrode is provided under the layer P1. In the transistor $M_{OS2}$, the layer P1 corresponds to a second gate insulating layer, and the thickness of the layer P1 ($T_{P1}$) corresponds to the thickness of the second gate insulating layer.

The channel length (L) was 60 nm, the channel width (W) was 60 nm, the thickness of the layer S1 was 5 nm, the thickness of the layer S2 ($T_{S2}$) was 3 nm, the height $H_{P1}$ was 10 nm, the height $H_{GE}$ was 5 nm, and the work function of GE2 was 5.0 eV. For the other assumed conditions for this calculation, refer to Table 1.

Figure 35:
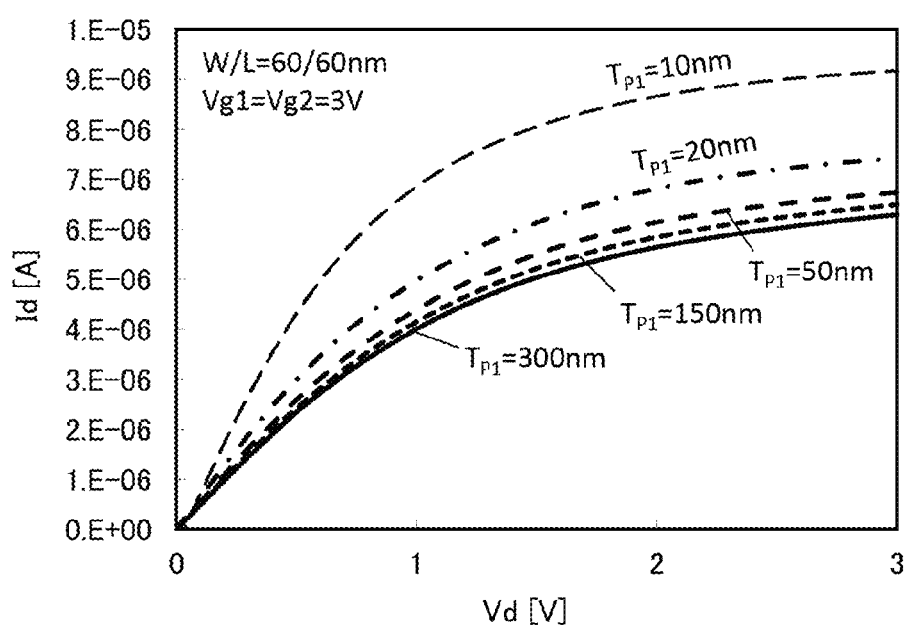
FIG. 35 shows dependence of $V_d$-$I_d$ characteristics on the thickness of a second gate insulating layer obtained by device simulation.

FIG. 35 shows the calculation results of the $V_d$-$I_d$ characteristics with varying $T_{P1}$. For the calculation of the $V_d$-$I_d$ characteristics, a voltage ($V_{g1}$) applied to a first gate electrode GE and a voltage ($V_{g2}$) applied to the second gate electrode GE2 were both assumed to be 3 V.

In addition, a channel length modulation coefficient (λ) for each case was calculated by the $V_d$-$I_d$ characteristics shown in FIG. 35 (Table 4). Note that calculation for λ in Table 4 was performed by the same method as that in Table 2.

TABLE 4

| | $T_{P1}$ (nm) | | | | |
|---|---|---|---|---|---|
| | 300 | 150 | 50 | 20 | 10 |
| λ | 0.08 | 0.08 | 0.06 | 0.05 | 0.03 |

The results in FIG. 35 show that the on-state current of the transistor $M_{OS2}$ can be increased as the layer P1 becomes thinner. Furthermore, Table 4 shows that the transistor $M_{OS2}$ is less likely to be affected by the channel length modulation effect as the layer P1 becomes thinner, leading to favorable saturation characteristics in $V_d$-$I_d$ characteristics.

This example revealed that a reduction in the thickness of the layer S2 and a reduction in the channel width W are each effective in reducing the effect of the channel length modulation and thus lead to an improvement in saturation characteristics of the transistor $M_{OS1}$. This example also revealed that the use of the second gate electrode GE2 can increase the on-state current and can improve the saturation characteristics.

Example 2

In this example, the oxide semiconductor transistors (OS transistors) described in Embodiment 1 were prototyped and saturation characteristics of the transistors were measured.

For measurement of transistor characteristics, transistors with the same structure as the transistor 100 illustrated in FIGS. 1A to 1D were prototyped.

A silicon oxynitride film formed by a PECVD method was used as the insulating film 652 in FIGS. 1A to 1D. After the insulating film 652 was formed, oxygen was introduced to the insulating film 652 by an ion implantation method.

For the semiconductors 661 to 663 in FIGS. 1A to 1D, oxide semiconductors formed by a sputtering method were used. Hereinafter, the semiconductor 661, the semiconductor 662, and the semiconductor 663 may be referred to as S1, S2, and S3, respectively.

The semiconductor 661 (S1) was formed using an In—Ga—Zn oxide with a thickness of 20 nm. The semiconductor 661 was formed by a DC sputtering method using a target of an In—Ga—Zn oxide containing In, Ga, and Zn at an atomic ratio of 1:3:4. The sputtering method was performed at a substrate temperature of 200° C. in a mixed gas of argon and oxygen.

The semiconductor 662 (S2) was formed using an In—Ga—Zn oxide. The semiconductor 662 was formed by a DC sputtering method using a target of an In—Ga—Zn oxide containing In, Ga, and Zn at an atomic ratio of 4:2:4.1. The sputtering method was performed at a substrate temperature of 300° C. in a mixed gas of argon and oxygen. The semiconductor 662 was formed using the CAAC-OS film described in Embodiment 6.

After the semiconductors 661 and 662 were formed, heat treatment at 450° C. was performed in a nitrogen atmosphere for one hour and in an oxygen atmosphere for one hour.

The semiconductor 663 (S3) was formed using an In—Ga—Zn oxide with a thickness of 5 nm. The semiconductor 663 was formed by a DC sputtering method using a target of an In—Ga—Zn oxide containing In, Ga, and Zn at an atomic ratio of 1:3:2. The sputtering method was performed at a substrate temperature of 200° C. in a mixed gas of argon and oxygen.

A 10-nm-thick silicon oxynitride film was formed as the insulating film 653 by a plasma-enhanced CVD (PECVD) method.

The insulating film 654 was formed of a stack including a 10-nm-thick aluminum oxide film formed by an ALD method and a 20-nm-thick aluminum oxide film formed by a sputtering method. The sputtering method was an RF sputtering method performed in a mixed gas of argon and oxygen using a target of aluminum oxide.

Figure 36:
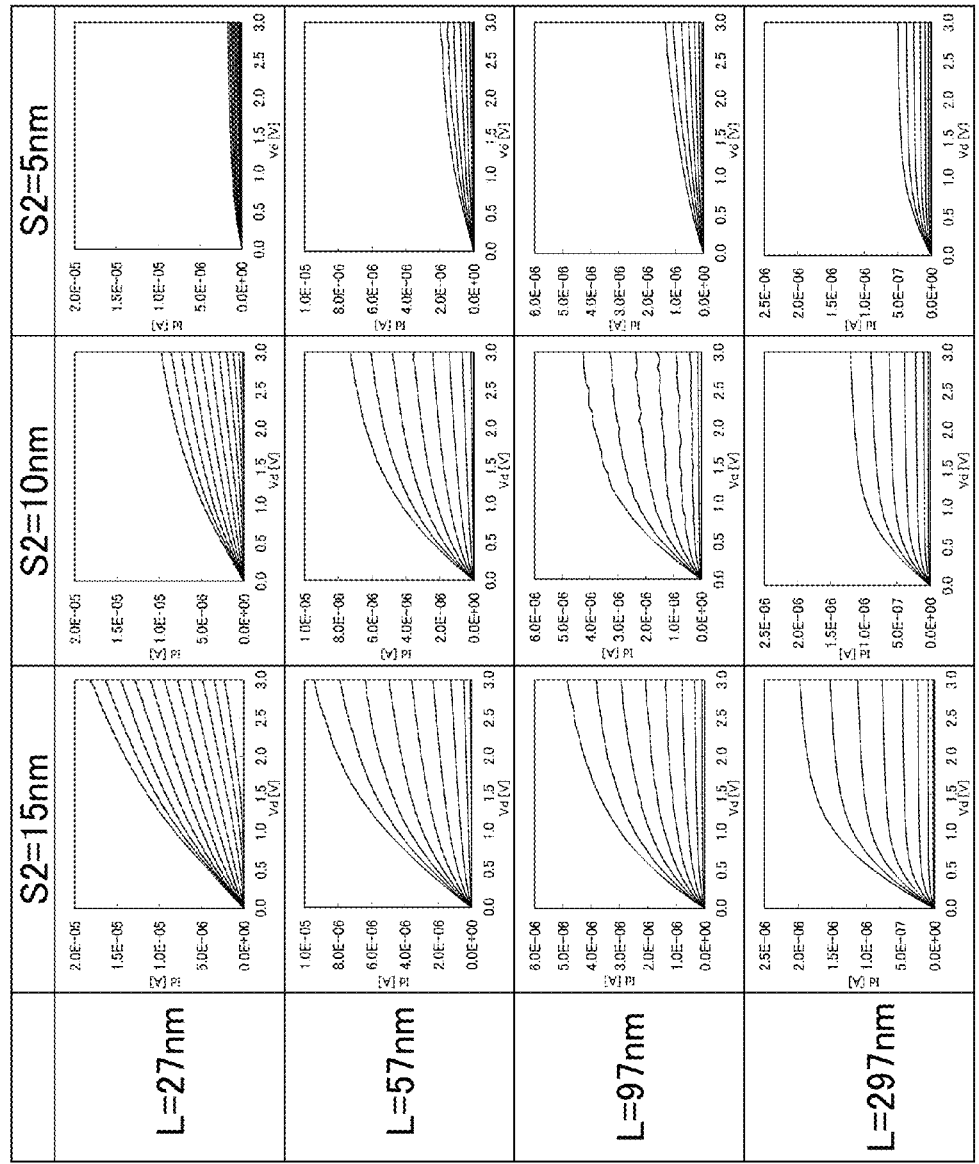
FIG. 36 shows $V_d$-$I_d$ characteristics of prototyped transistors.

FIG. 36 shows the $V_d$-$I_d$ characteristics of the prototyped transistors. FIG. 36 shows characteristics of transistors with channel lengths (L) of 27 nm, 57 nm, 97 nm, and 297 nm and thicknesses of the semiconductors 662 (thicknesses of S2) of 15 nm, 10 nm, and 5 nm. For the measurement of the $V_d$-$I_d$ characteristics, drain currents were measured while gate voltages from 0 V to 2 V in increment of 0.2 V were applied and a drain voltage was swept from 0 V to 20 V. Note that channel widths (W) of the transistors were all 37 nm in FIG. 36.

Figure 37A:
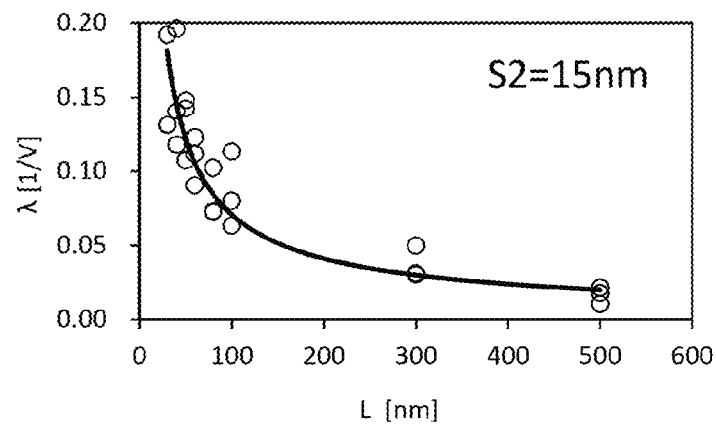
FIGS. 37A to 37C show dependence of the channel length modulation coefficient on the channel length in prototyped transistors.
Figure 37B:
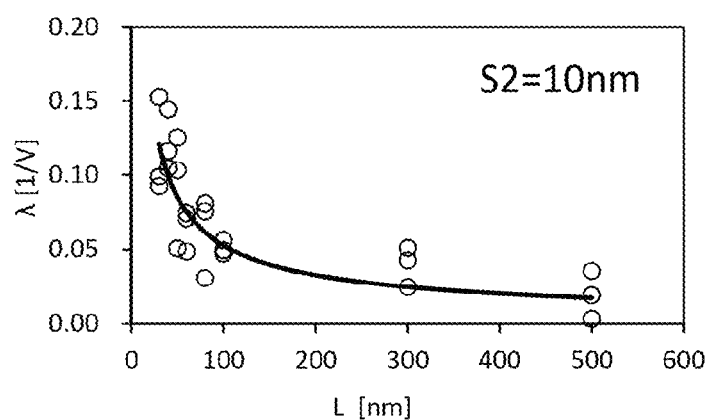
Figure 37C:
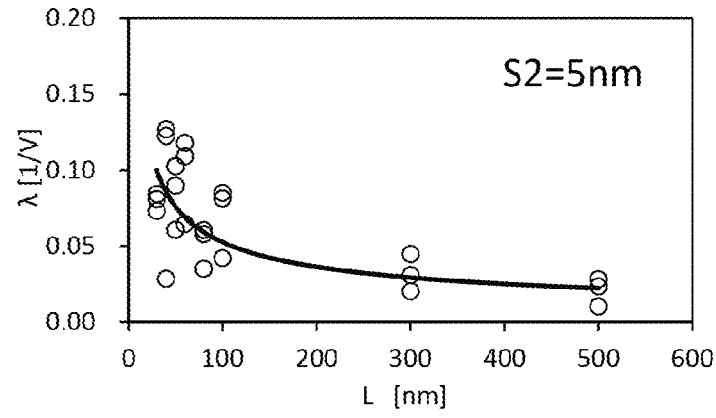

FIGS. 37A to 37C show dependence of the channel length modulation coefficient (λ) on the channel length in the transistors prototyped in this example. FIG. 37A, FIG. 37B, and FIG. 37C show the channel length modulation coefficients with S2 of 15 nm, 10 nm, and 5 nm, respectively. In FIGS. 37A to 37C, approximate curves (cumulative approximate curves) based on data are drawn. The channel length modulation coefficient was calculated as follows: $\delta I_d/\delta V_d$ was calculated by the $V_d$-$I_d$ characteristics at a gate voltage of 2 V, and the minimum value of $\delta I_d/\delta V_d$ and $I_d$ of when $\delta I_d/\delta V_d$ has the minimum value were substituted into Formula (1).

Figure 38:
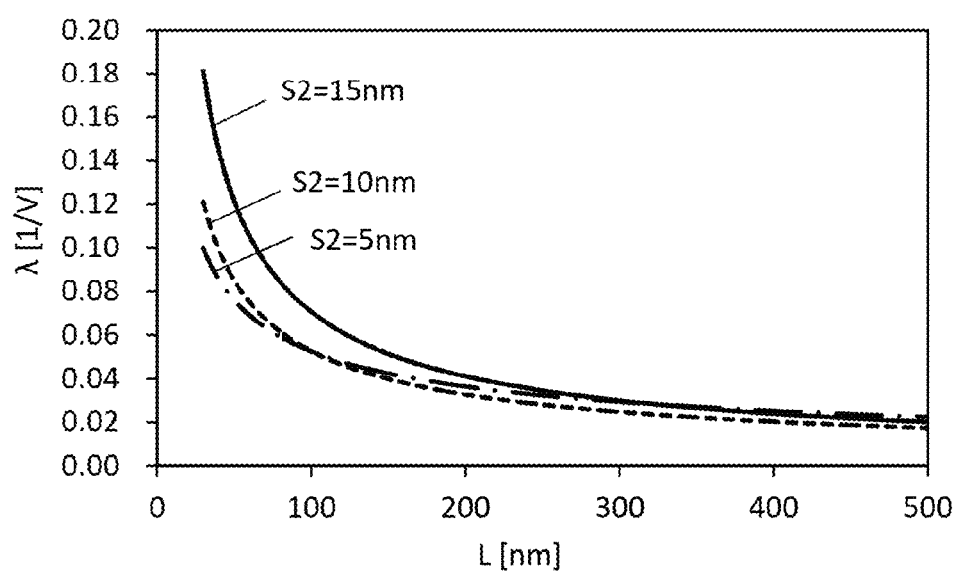
FIG. 38 shows dependence of the channel length modulation coefficient on the channel length in prototyped transistors.

FIG. 38 is a graph collectively showing the approximate curves in FIGS. 37A to 37C.

The results in FIG. 36, FIGS. 37A to 37C, and FIG. 38 show that although the saturation characteristics of the transistor become worse and the channel length modulation coefficient increases as channel length becomes shorter, an increase in channel length modulation coefficient can be suppressed when the thickness of S2 is small, improving the saturation characteristics.

Example 3

In this example, the oxide semiconductor transistors (OS transistors) described in Embodiment 1 were prototyped and saturation characteristics of the transistors were measured. In a manner similar to that in Example 2, for measurement of transistor characteristics, transistors with the same structure as the transistor 100 illustrated in FIGS. 1A to 1D were prototyped.

The semiconductor 662 (S2) illustrated in FIGS. 1A to 1D was formed using an In—Ga—Zn oxide with a thickness of 15 nm. The semiconductor 662 was formed by a DC sputtering method using a target of an In—Ga—Zn oxide containing In, Ga, and Zn at an atomic ratio of 1:1:1. The sputtering method was performed at a substrate temperature of 300° C. in a mixed gas of argon and oxygen. The semiconductor 662 was formed using the CAAC-OS film described in Embodiment 6.

For the details of the other components of the transistors prototyped in this example, refer to the description in Example 2.

Figure 39:
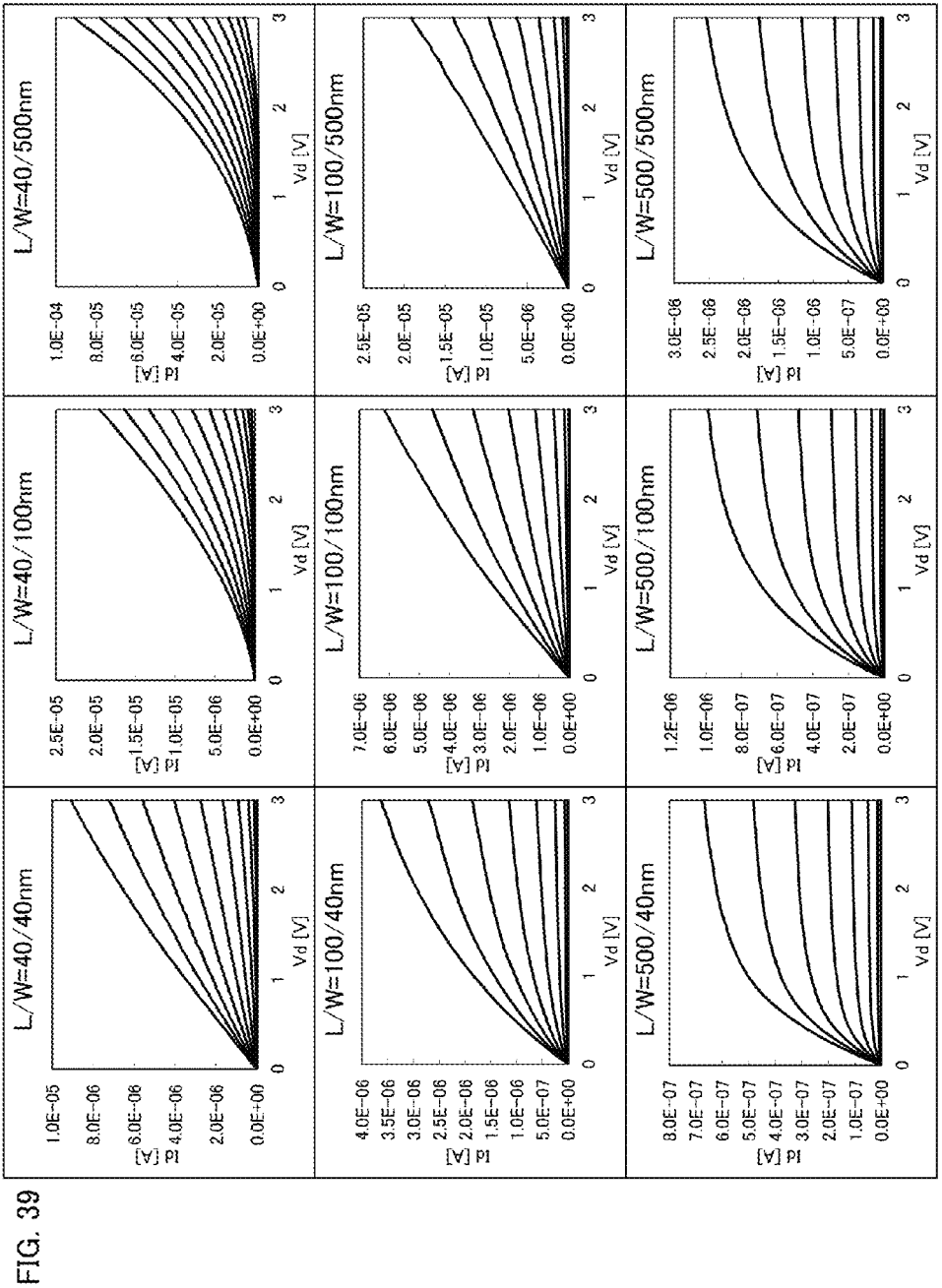
FIG. 39 shows $V_d$-$I_d$ characteristics of prototyped transistors.

FIG. 39 shows the $V_d$-$I_d$ characteristics of the transistors prototyped in this example with channel lengths (L) of 500 nm, 100 nm, and 40 nm and channel widths (W) of 500 nm, 100 nm, and 40 nm. For the conditions for measuring the $V_d$-$I_d$ characteristics, refer to the description for FIG. 36.

Figure 40A:
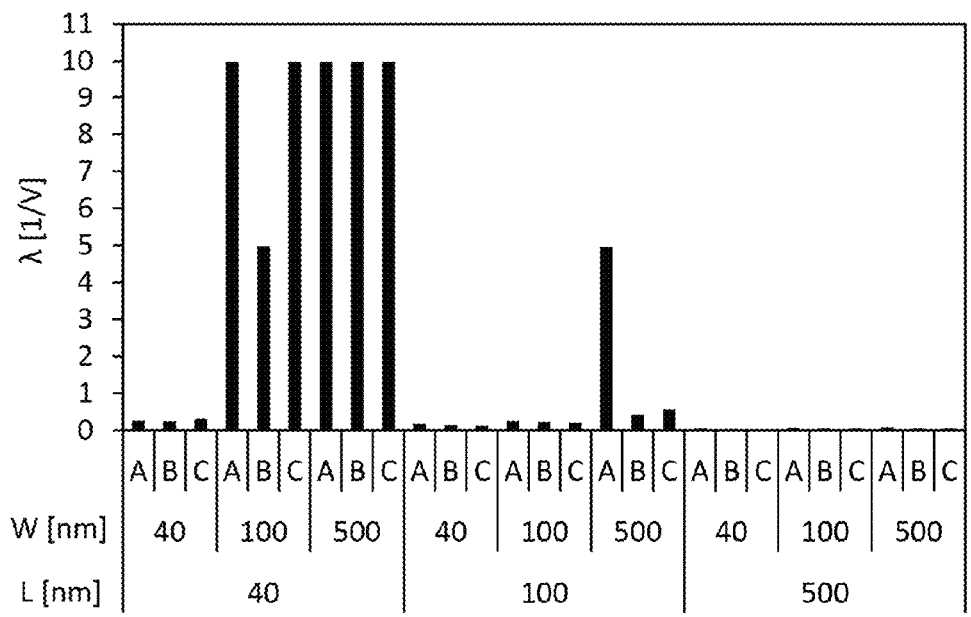
FIGS. 40A and 40B show L/W dependence of the channel length modulation coefficient in prototyped transistors.
Figure 40B:
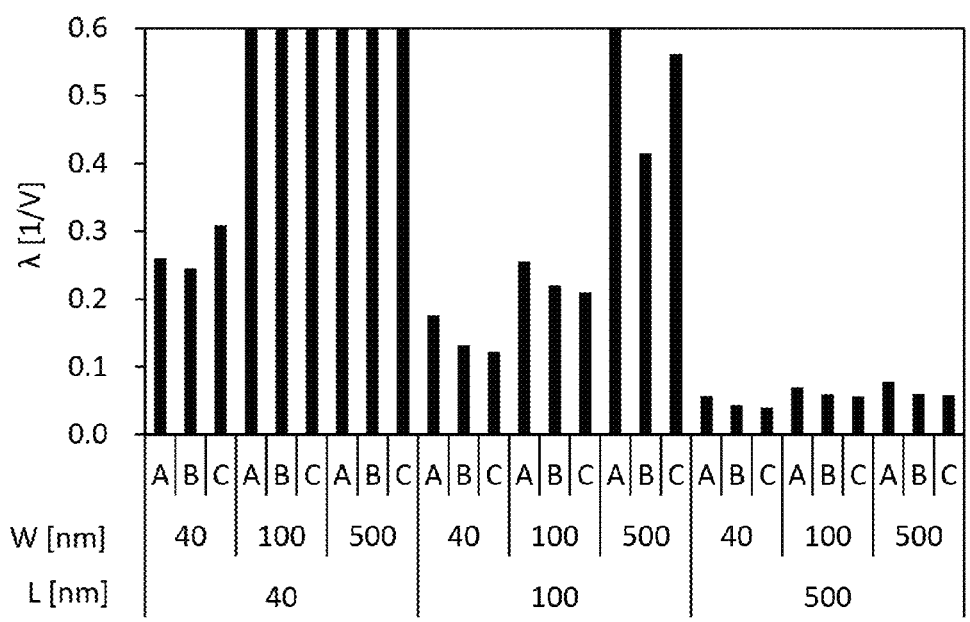

FIGS. 40A and 40B show size dependence of the channel length modulation coefficient (λ) in the transistors prototyped in this example. FIG. 40A is a graph where the range of the longitudinal axis is from 0 to 11 [1/V], and FIG. 40B is a graph where the range of the longitudinal axis is from 0 to 0.6 [1/V]. For the calculation method of the channel length modulation coefficient, refer to the description for FIGS. 37A to 37C. Three transistors with the same size (transistors A, B, and C) were formed on the same substrate and measured.

FIG. 39 and FIGS. 40A and 40B show that as the channel width of the transistor becomes smaller, the channel length modulation coefficient becomes small and the saturation characteristics of the transistor become improved. This is noticeable particularly in the case where the channel length is less than or equal to 100 nm.

This application is based on Japanese Patent Application serial no. 2014-143110 filed with Japan Patent Office on Jul. 11, 2014, the entire contents of which are hereby incorporated by reference.

What is claimed is:

1. A transistor comprising:
    a first oxide semiconductor layer;
    a second oxide semiconductor layer over the first oxide semiconductor layer;
    a third oxide semiconductor layer over the second oxide semiconductor layer;
    a gate insulating layer over and in contact with the third oxide semiconductor layer; and
    a gate electrode over the gate insulating layer;
    wherein a portion of the gate electrode faces a side surface of the second oxide semiconductor layer in a channel width direction with the gate insulating layer positioned therebetween,
    wherein the portion of the gate electrode extends below a bottom surface of the second oxide semiconductor layer in a depth direction,
    wherein the second oxide semiconductor layer includes a region having a thickness greater than or equal to 2 nm and less than 8 nm, and
    wherein a length of the second oxide semiconductor layer in a channel width direction is less than 60 nm.

2. The transistor according to claim 1, wherein a channel length is greater than or equal to 10 nm and less than 1 μm.

3. The transistor according to claim 1,
    wherein each of the first oxide semiconductor layer, the second oxide semiconductor layer, and the third oxide semiconductor layer comprises indium, zinc, and M, and
    wherein M is one selected from the group consisting of Al, Ti, Ga, Y, Zr, La, Ce, Nd and Hf.

4. The transistor according to claim 3, wherein the first oxide semiconductor layer and the third oxide semiconductor layer have a higher atomic ratio of M to In than the second oxide semiconductor layer.

5. An electronic device comprising:
    the transistor according to claim 1; and
    at least one of a microphone, a speaker, a display portion, and an operation key.

6. The transistor according to claim 1,
wherein the first oxide semiconductor layer is thicker than the third oxide semiconductor layer.

7. The transistor according to claim 1,
wherein the first oxide semiconductor layer is thicker than the second oxide semiconductor layer, and
wherein the second oxide semiconductor layer is thicker than the third oxide semiconductor layer.

8. The transistor according to claim 1, further comprising an insulating film below and in contact with the first oxide semiconductor layer,
wherein the insulating film comprises a projection below the first oxide semiconductor layer,
wherein a value obtained by subtracting a thickness of the gate insulating layer from the sum of a height of the projection and a thickness of the first oxide semiconductor layer has a positive value.

9. A transistor comprising:
a first conductive film;
a first insulating film over the first conductive film;
a first oxide semiconductor layer over and in contact with the first insulating film;
a second oxide semiconductor layer over the first oxide semiconductor layer;
a third oxide semiconductor layer over the second oxide semiconductor layer;
a second insulating film over and in contact with the third oxide semiconductor layer; and
a second conductive film over the second insulating film;
wherein a portion of the second conductive film faces a side surface of the second oxide semiconductor layer in a channel width direction with the second insulating film positioned therebetween,
wherein the portion of the second conductive film extends below a bottom surface of the second oxide semiconductor layer in a depth direction,
wherein the second oxide semiconductor layer includes a region having a thickness greater than or equal to 2 nm and less than 8 nm, and
wherein a length of the second oxide semiconductor layer in a channel width direction is less than 60 nm.

10. The transistor according to claim 9, wherein a channel length is greater than or equal to 10 nm and less than 1 µm.

11. The transistor according to claim 9,
wherein each of the first oxide semiconductor layer, the second oxide semiconductor layer, and the third oxide semiconductor layer comprises indium, zinc, and M, and
wherein M is one selected from the group consisting of Al, Ti, Ga, Y, Zr, La, Ce, Nd and Hf.

12. The transistor according to claim 11, wherein the first oxide semiconductor layer and the third oxide semiconductor layer have a higher atomic ratio of M to In than the second oxide semiconductor layer.

13. An electronic device comprising:
the transistor according to claim 9; and
at least one of a microphone, a speaker, a display portion, and an operation key.

14. The transistor according to claim 9,
wherein the first oxide semiconductor layer is thicker than the third oxide semiconductor layer.

15. The transistor according to claim 9,
wherein the first oxide semiconductor layer is thicker than the second oxide semiconductor layer, and
wherein the second oxide semiconductor layer is thicker than the third oxide semiconductor layer.

16. The transistor according to claim 9,
wherein the first insulating film comprises a projection below the first oxide semiconductor layer,
wherein a value obtained by subtracting a thickness of the gate insulating layer from the sum of a height of the projection and a thickness of the first oxide semiconductor layer has a positive value.

* * * * *